US 11,437,353 B2

(12) United States Patent
Lee et al.

(10) Patent No.: US 11,437,353 B2
(45) Date of Patent: Sep. 6, 2022

(54) LIGHT EMITTING DEVICE FOR DISPLAY AND DISPLAY APPARATUS HAVING THE SAME

(71) Applicant: SEOUL VIOSYS CO., LTD., Ansan-si (KR)

(72) Inventors: Seom Geun Lee, Ansan-si (KR); Seong Kyu Jang, Ansan-si (KR); Yong Woo Ryu, Ansan-si (KR); Jong Hyeon Chae, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 106 days.

(21) Appl. No.: 17/096,289

(22) Filed: Nov. 12, 2020

(65) Prior Publication Data

US 2021/0151421 A1    May 20, 2021

Related U.S. Application Data

(60) Provisional application No. 62/935,741, filed on Nov. 15, 2019.

(51) Int. Cl.
*H01L 25/075*  (2006.01)
*H01L 33/42*  (2010.01)
*H01L 33/62*  (2010.01)

(52) U.S. Cl.
CPC ...... *H01L 25/0756* (2013.01); *H01L 25/0753* (2013.01); *H01L 33/42* (2013.01); *H01L 33/62* (2013.01)

(58) Field of Classification Search
CPC . H01L 25/0756; H01L 25/0753; H01L 33/42; H01L 33/62; H01L 27/15
See application file for complete search history.

(56) References Cited

U.S. PATENT DOCUMENTS 9,680,063 B2    6/2017  Miyachi et al.
10,170,666 B2   1/2019  Cha et al.
(Continued)

FOREIGN PATENT DOCUMENTS

| JP | 2016-219453 | 12/2016 |
| JP | 2018-148074 | 9/2018 |
| KR | 10-2017-0115142 | 10/2017 |

OTHER PUBLICATIONS

International Search Report dated Mar. 3, 2021 in International Application No. PCT/KR2020/015940 (With English Translation).

*Primary Examiner* — Victor A Mandala
(74) *Attorney, Agent, or Firm* — H.C. Park & Associates, PLC

(57) ABSTRACT

A light emitting device including a first LED stack, a second LED stack, and a third LED stack each including first and second conductivity type semiconductor layers, a first bonding layer between the second and third LED stacks, a second bonding layer between the first and second LED stacks, a first planarization layer between the second bonding layer and the second LED stack, a second planarization layer disposed on the first LED stack, lower buried vias passing through the first planarization layer, the second LED stack, and the first bonding layer and electrically connected to the semiconductor layers of the third LED stack, respectively, and upper buried vias passing through the second planarization layer and the first LED stack, in which a width of an upper end of each of the lower buried vias and the upper buried vias is greater than a width of a corresponding through hole.

20 Claims, 67 Drawing Sheets

(56) References Cited

U.S. PATENT DOCUMENTS

| | | | |
|---|---|---|---|
| 2016/0336479 A1 | 11/2016 | Miyachi et al. | |
| 2017/0288093 A1 | 10/2017 | Cha et al. | |
| 2019/0164944 A1* | 5/2019 | Chae | H01L 25/13 |
| 2019/0165037 A1* | 5/2019 | Chae | H01L 33/405 |
| 2019/0189596 A1* | 6/2019 | Chae | H01L 33/08 |
| 2019/0198485 A1* | 6/2019 | Chae | H01L 33/0093 |
| 2019/0214373 A1 | 7/2019 | Kim et al. | |
| 2019/0229234 A1 | 7/2019 | Zou et al. | |
| 2020/0091389 A1* | 3/2020 | Jang | H01L 27/15 |
| 2020/0144326 A1* | 5/2020 | Lee | H01L 27/15 |
| 2020/0144470 A1* | 5/2020 | Jang | H01L 33/382 |
| 2020/0212017 A1* | 7/2020 | Oh | H01L 33/62 |
| 2020/0258872 A1* | 8/2020 | Lee | H01L 33/42 |
| 2020/0266318 A1* | 8/2020 | Lee | H01L 25/0756 |
| 2020/0295228 A1* | 9/2020 | Jang | H01L 33/62 |
| 2020/0373348 A1* | 11/2020 | Lee | H01L 33/44 |
| 2021/0043678 A1* | 2/2021 | Chae | H01L 25/0756 |
| 2021/0057481 A1* | 2/2021 | Chae | H01L 33/22 |
| 2021/0125972 A1* | 4/2021 | Jang | H01L 25/0753 |
| 2021/0126043 A1* | 4/2021 | Lee | H01L 27/153 |
| 2021/0175280 A1* | 6/2021 | Chae | H01L 33/0093 |
| 2021/0202567 A1* | 7/2021 | Kim | H01L 25/0753 |
| 2021/0265326 A1* | 8/2021 | Lee | H01L 24/06 |
| 2021/0351229 A1* | 11/2021 | Lee | H01L 27/156 |

\* cited by examiner

LIGHT EMITTING DEVICE FOR DISPLAY AND DISPLAY APPARATUS HAVING THE SAME

CROSS-REFERENCE TO RELATED APPLICATION

This application claims priority from the benefit of U.S. Provisional Application No. 62/935,741, filed on Nov. 15, 2019, which is hereby incorporated by reference for all purposes as if fully set forth herein.

BACKGROUND

Field

Exemplary embodiments of the invention relate generally to a light emitting device for a display and a display apparatus, and, more particularly, to a light emitting device having a stack structure of LEDs for a display and a display apparatus including the same.

Discussion of the Background

As an inorganic light source, light emitting diodes have been used in various fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been generally used as backlight light sources in display apparatuses. However, LED displays that directly display images using the light emitting diodes have been recently developed.

In general, a display apparatus realizes various colors through mixture of blue, green, and red light. In order to display various images, the display apparatus includes a plurality of pixels each having sub-pixels corresponding to blue, green and red light, respectively. In this manner, a color of a certain pixel is determined based on the colors of the sub-pixels so that images can be displayed through combination of such pixels.

Since LEDs can emit various colors depending upon materials thereof, a display apparatus may be provided by arranging individual LED chips emitting blue, green, and red light on a two-dimensional plane. However, when one LED chip is arranged in each sub-pixel, the number of LED chips may be increased, which may require excessive time for a mounting process during manufacture.

Moreover, when the sub-pixels are arranged on a two-dimensional plane in the display apparatus, a relatively large area is occupied by one pixel that includes the sub-pixels for blue, green, and red light. Accordingly, an area of each LED chip may need to be reduced to arrange the sub-pixels in a restricted area. However, reduction in size of LED chips may cause difficulty in mounting the LED chips, as well as reducing luminous areas of the LED chips.

The above information disclosed in this Background section is only for understanding of the background of the inventive concepts, and, therefore, it may contain information that does not constitute prior art.

SUMMARY

Light emitting devices for a display constructed according to exemplary embodiments of the invention are capable of increasing an area of each sub-pixel in a restricted pixel area and a display apparatus including the same.

Exemplary embodiments also provide a light emitting device for a display that is capable of reducing a time for a mounting process and a display apparatus including the same.

Exemplary embodiments also provide a light emitting device for a display and a display apparatus that is capable of increasing the production yield.

Additional features of the inventive concepts will be set forth in the description which follows, and in part will be apparent from the description, or may be learned by practice of the inventive concepts.

A light emitting device according to an exemplary embodiment includes a first LED stack, a second LED stack disposed under the first LED stack, and a third LED stack disposed under the second LED stack, each of the first, second, and third LED stacks including a first conductivity type semiconductor layer and a second conductivity type semiconductor layer, a first bonding layer interposed between the second LED stack and the third LED stack, a second bonding layer interposed between the first LED stack and the second LED stack, a first planarization layer interposed between the second bonding layer and the second LED stack, a second planarization layer disposed on the first LED stack, lower buried vias passing through the first planarization layer, the second LED stack, and the first bonding layer and electrically connected to the first conductivity type semiconductor layer and the second conductivity type semiconductor layer of the third LED stack, respectively, and upper buried vias passing through the second planarization layer and the first LED stack, in which a width of an upper end of each of the lower buried vias and the upper buried vias is greater than a width of a corresponding through hole.

The first, second, and third LED stacks may be configured to emit red light, blue light, and green light, respectively.

The light emitting device may further include lower connectors covering the lower buried vias, in which at least one of the upper buried vias may be connected to the lower connectors.

The lower buried vias may include a first lower buried via and a second lower buried via, the upper buried vias may include a first upper buried via, a second upper buried via, a third upper buried via, and a fourth upper buried via, the first and second upper buried vias overlapping the with first and second lower buried vias.

The light emitting device may further include a third lower connector spaced apart from the lower buried vias and electrically connected to the second conductivity type semiconductor layer of the second LED stack, in which the third upper buried via may be electrically connected to the third lower connector.

The first planarization layer may include a plurality of regions spaced apart from each other, one region of the first planarization layer may be interposed between the second LED stack and the third lower connector, and the third lower connector may be electrically connected to the second LED stack around the one region of the first planarization layer.

The lower buried vias may further include a third lower buried via passing through the first planarization layer and the second conductivity type semiconductor layer of the second LED stack, the third lower buried via being electrically connected to the first conductivity type semiconductor layer of the second LED stack, and the third lower buried via may be electrically connected to one of the lower connectors.

The first planarization layer may be continuously disposed on the second LED stack.

The lower buried vias and the upper buried vias may be surrounded by sidewall insulation layers inside corresponding through holes, respectively.

The sidewall insulation layers may have a gradually decreasing thickness as being closer to bottoms of the through holes.

The light emitting device may further include a first transparent electrode in ohmic contact with the second conductivity type semiconductor layer of the first LED stack, a second transparent electrode in ohmic contact with the second conductivity type semiconductor layer of the second LED stack, and a third transparent electrode in ohmic contact with the second conductivity type semiconductor layer of the third LED stack, in which the second transparent electrode may have openings exposing the second conductivity type semiconductor layer of the second LED stack, and the lower buried vias may be formed within the circumference of the openings of the second transparent electrode in a plan view.

The light emitting device may further include a plurality of upper connectors disposed on the first LED stack, in which the upper connectors may cover the upper buried vias to be electrically connected to the upper buried vias, respectively.

The light emitting device may further include bump pads disposed on the upper connectors, respectively.

The bump pads may include a first bump pad commonly electrically connected to the first, second, and third LED stacks, and second, third, and fourth bump pads electrically connected to the second conductivity type semiconductor layers of the first, second, and third LED stacks, respectively.

The light emitting device may further include a first electrode pad disposed on the first conductivity type semiconductor layer of the first LED stack, in which one of the upper connectors electrically may connect the upper buried via and the first electrode pad.

The upper connectors may include Au or an Au alloy.

Upper surfaces of the lower buried vias may be substantially flush with an upper surface of the first planarization layer, and upper surfaces of the upper buried vias may be substantially flush with an upper surface of the second planarization layer.

Each of the first, second, and third LED stacks may not include a growth substrate.

The light emitting device may further include a lower insulation layer interposed between the third LED stack and the first bonding layer and contacting the first bonding layer, and an intermediate insulation layer interposed between the second LED stack and the second bonding layer and contacting the second bonding layer.

A display apparatus according to another exemplary embodiment includes a circuit board, and a plurality of light emitting devices arranged on the circuit board, each of the light emitting devices including a first LED stack, a second LED stack disposed under the first LED stack, a third LED stack disposed under the second LED stack and including a first conductivity type semiconductor layer and a second conductivity type semiconductor layer, a first bonding layer interposed between the second LED stack and the third LED stack, a second bonding layer interposed between the first LED stack and the second LED stack, a first planarization layer interposed between the second bonding layer and the second LED stack, a second planarization layer disposed on the first LED stack, lower buried vias passing through the first planarization layer, the second LED stack, and the first bonding layer and electrically connected to the first conductivity type semiconductor layer and the second conductivity type semiconductor layer of the third LED stack, respectively, and upper buried vias passing through the second planarization layer and the first LED stack, in which a width of an upper end of each of the lower buried vias and the upper buried vias is greater than that of a corresponding through hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
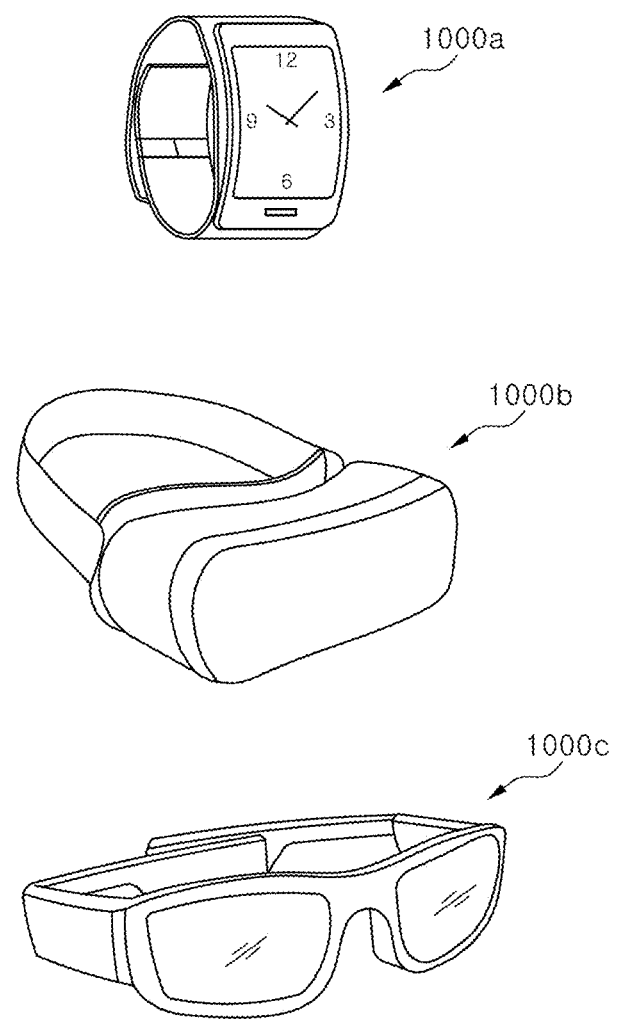
FIG. 1 shows schematic perspective views of display apparatuses according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described in detail with reference to the accompanying drawings.

FIG. 1 shows schematic perspective views illustrating display apparatuses according to exemplary embodiments.

A light emitting device according to an exemplary embodiment may be used in a VR display apparatus, such as a smart watch 1000*a* or a VR headset 1000*b*, or an AR display apparatus, such as augmented reality glasses 1000*c*, without being limited thereto.

Figure 2:
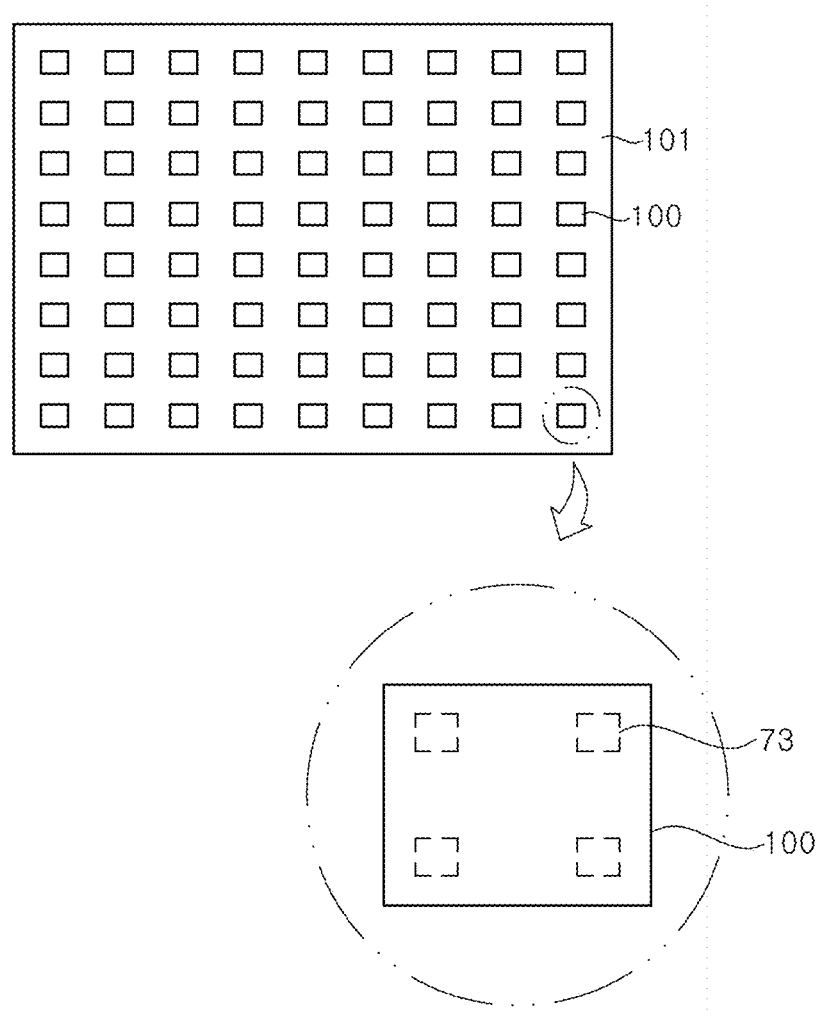
FIG. 2 is a schematic plan view of a display panel according to an exemplary embodiment.

A display panel for implementing an image may be mounted on a display apparatus. FIG. 2 is a schematic plan view of a display panel according to an exemplary embodiment.

Referring to FIG. 2, the display panel includes a circuit board 101 and light emitting devices 100.

The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

A plurality of light emitting devices 100 is arranged on the circuit board 101. Each of the light emitting devices 100 may form one pixel. The light emitting device 100 includes bump pads 73, and the bump pads 73 are electrically connected to the circuit board 101. For example, the bump pads 73 may be bonded to pads exposed on the circuit board 101.

An interval between the light emitting devices 100 may be greater than at least a width of the light emitting device 100.

Figure 3:
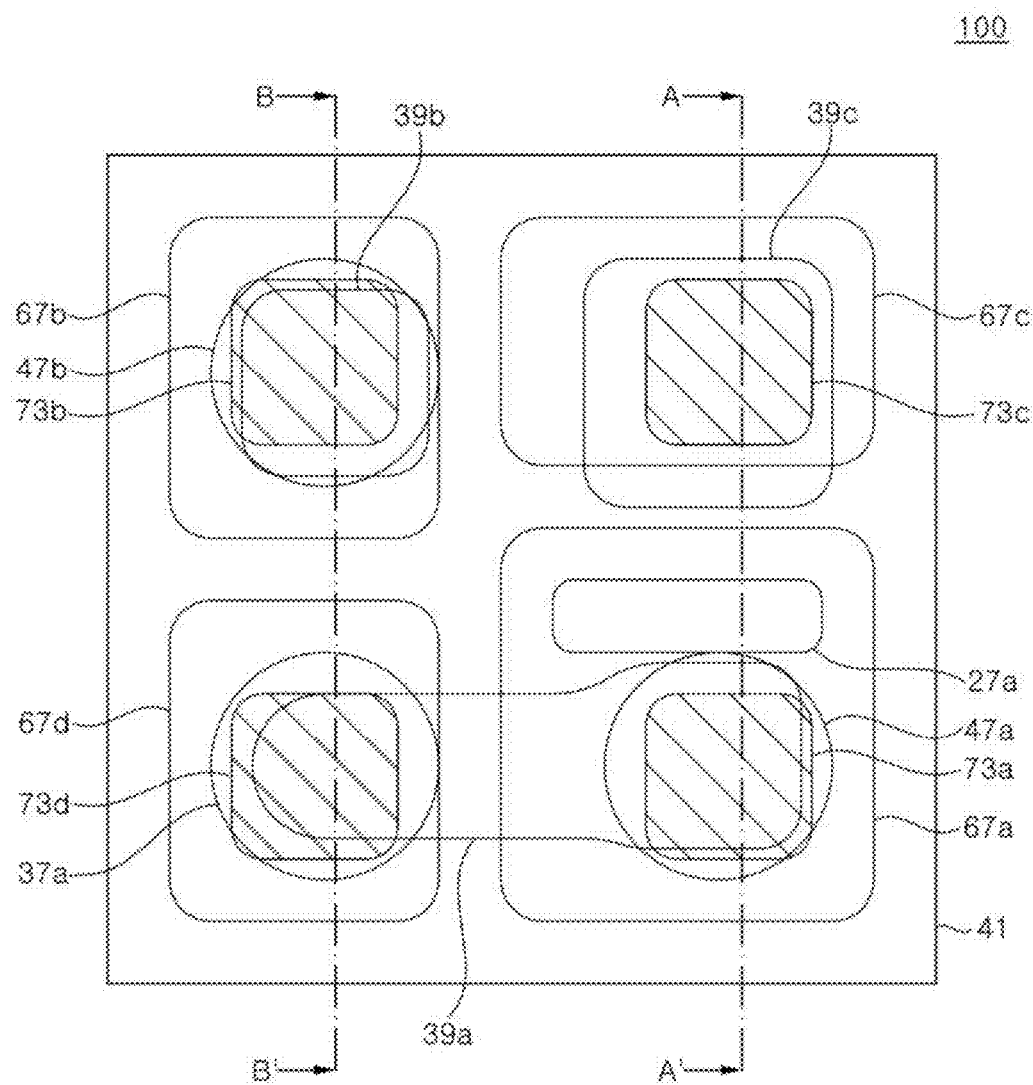
FIG. 3 is a schematic plan view of a light emitting device according to an exemplary embodiment.

A configuration of the light emitting device 100 according to an exemplary embodiment will be described with reference to FIGS. 3, 4A, and 4B. FIG. 3 is a schematic plan view of the light emitting device 100 according to an exemplary embodiment, and FIGS. 4A and 4B are schematic cross-sectional views taken along lines A-A' and B-B' of FIG. 3, respectively.

Hereinafter, although bump pads 73*a*, 73*b*, 73*c*, and 73*d* are exemplarily illustrated and described as being disposed at an upper side in the drawings, the inventive concepts are not limited thereto. For example, in another exemplary embodiment, the light emitting device 100 may be flip-bonded on the circuit board 101 shown in FIG. 2. In this case, the bump pads 73*a*, 73*b*, 73*c*, and 73*d* may be disposed at a lower side. Furthermore, in some exemplary embodiments, the bump pads 73*a*, 73*b*, 73*c*, and 73*d* may be omitted. In addition, in other exemplary embodiments, the substrate 41 may be omitted.

Figure 4A:
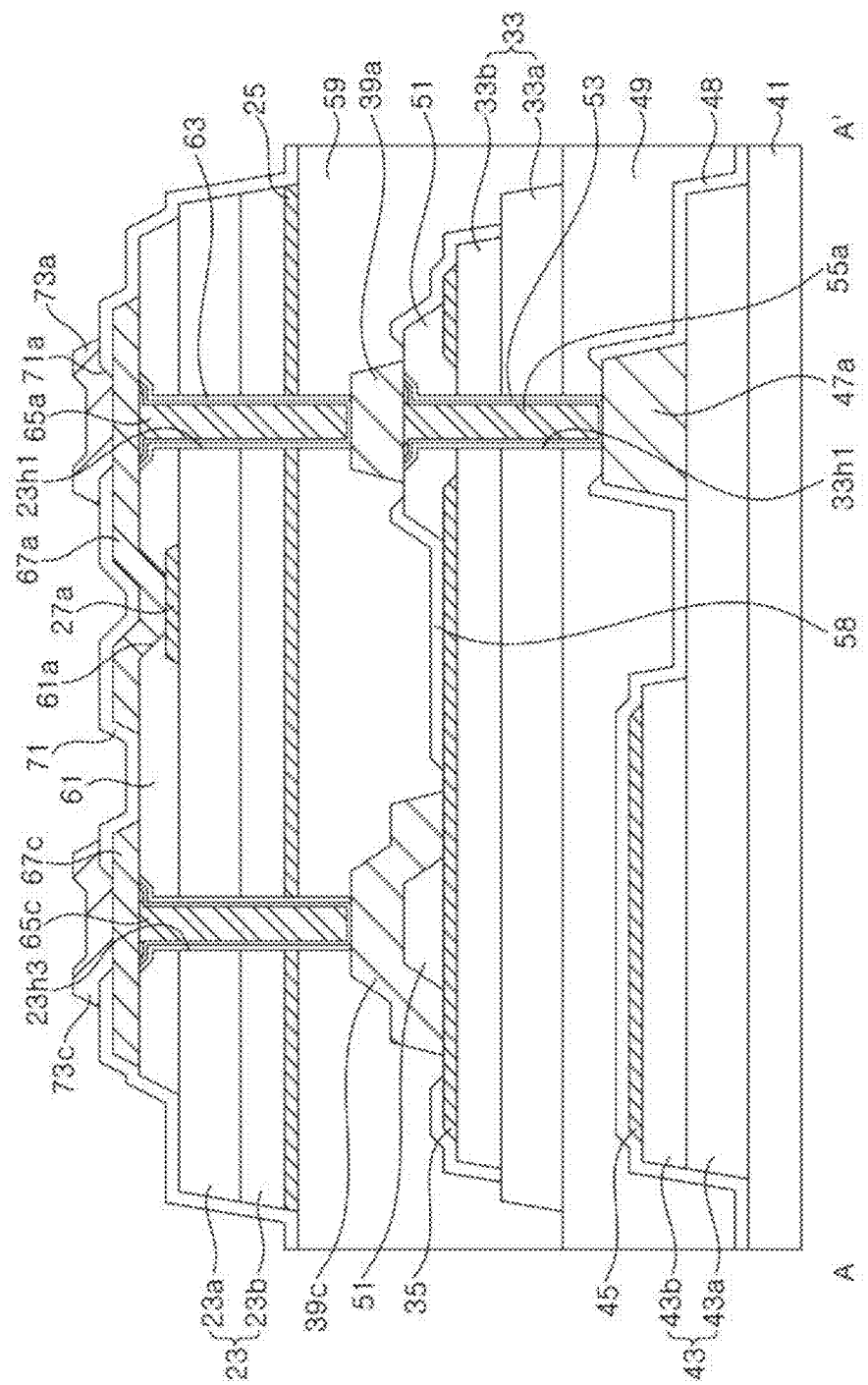
FIGS. 4A and 4B are schematic cross-sectional views taken along lines A-A' and B-B' of FIG. 3, respectively.
Figure 4B:
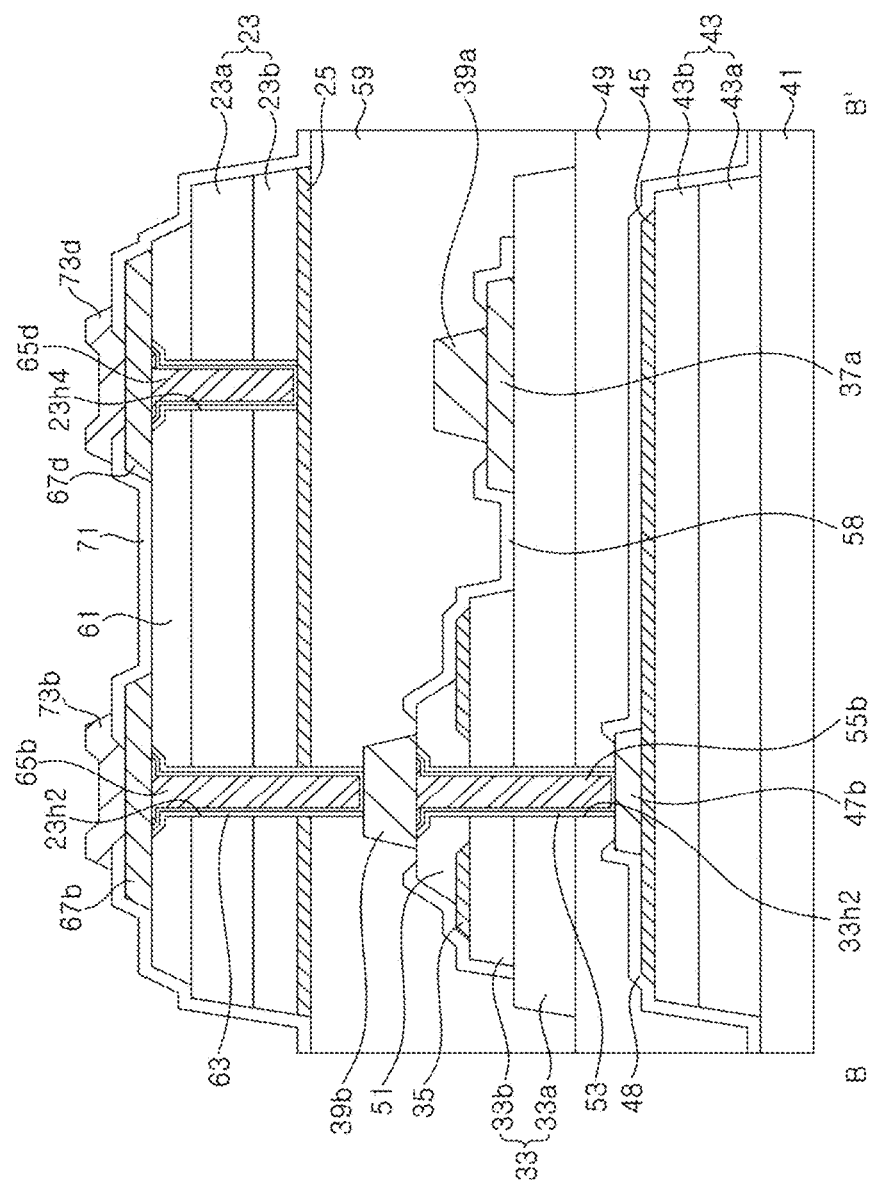

Referring to FIGS. 3, 4A and 4B, the light emitting device 100 may include a first LED stack 23, a second LED stack 33, a third LED stack 43, and a first transparent electrode 25, a second transparent electrode 35, a third transparent electrode 45, a first n-electrode pad 27*a*, a second n-electrode pad 37*a*, a third n-electrode pad 47*a*, a lower p-electrode pad 47*b*, first, second, and third lower connectors 39*a*, 39*b*, and 39*c*, lower buried vias 55*a* and 55*b*, upper buried vias 65*a*, 65*b*, 65*c*, and 65*d*, a first sidewall insulation layer 53, first, second, third, and fourth upper connectors 67*a*, 67*b*, 67*c*, and 67*d*, a first bonding layer 49, a second bonding layer 59, a lower insulation layer 48, an intermediate insulation layer 58, an upper insulation layer 71, a lower planarization layer 51, an upper planarization layer 61, and bump pads 73*a*, 73*b*, 73*c*, and 73*d*. Furthermore, the light emitting device 100 may include through holes 23*h*1, 23*h*2, 23*h*3, and 23*h*4 passing through the first LED stack 23, and through holes 33*h*1 and 33*h*2 passing through the second LED stack 33.

As shown in FIGS. 4A and 4B, the first, second, and third LED stacks 23, 33, and 43 according to an exemplary embodiment are stacked in the vertical direction. The first, second, and third LED stacks 23, 33, and 43 may be grown on different growth substrates from each other. According to the illustrated exemplary embodiment, each of the growth substrates may be removed from the final light emitting device 100. As such, the light emitting device 100 does not include the growth substrates of the first, second, and third LED stacks 23, 33, and 43. However, the inventive concepts are not limited thereto, and in some exemplary embodiments, at least one of the growth substrates may be included in the light emitting device 100.

Hereinafter, the second LED stack is described as being disposed under the first LED stack, and the third LED stack is described as being disposed under the second LED stack, however, in some exemplary embodiments, the light emitting device may be flip-bonded. In this case, upper and lower positions of these first, second, and third LED stacks may be reversed.

Each of the first LED stack 23, the second LED stack 33, and the third LED stack 43 includes a first conductivity type semiconductor layer 23*a*, 33*a*, or 43*a*, a second conductivity type semiconductor layer 23*b*, 33*b*, or 43*b*, and an active layer interposed therebetween. In particular, the active layer may have a multiple quantum well structure.

The second LED stack 33 is disposed under the first LED stack 23, and the third LED stack 43 is disposed under the second LED stack 33. Light generated in the first, second, and third LED stacks 23, 33, and 43 may be emitted to the outside through the third LED stack 43.

In an exemplary embodiment, the first LED stack 23 may emit light having a longer wavelength than those emitted from the second and third LED stacks 33 and 43, and the second LED stack 33 may emit light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode emitting blue light.

In another exemplary embodiment, to adjust a color mixing ratio of light emitted from the first, second, and third LED stacks 23, 33, and 43, the second LED stack 33 may emit light having a shorter wavelength than that emitted from the third LED stack 43. As such, luminous intensity of light emitted from the second LED stack 33 may be reduced and luminous intensity of light emitted from the third LED stack 43 may be increased. In this manner, it is possible to dramatically change a luminous intensity ratio of light emitted from the first, second, and third LED stacks 23, 33, and 43. For example, the first LED stack 23 may be configured to emit red light, the second LED stack 33 may be configured to emit blue light, and the third LED stack 43 may be configured to emit green light.

Hereinafter, although the second LED stack 33 is exemplarily described as emitting light having a shorter wavelength than that emitted from the third LED stack 43, such as blue light, the inventive concepts are not limited thereto. In some exemplary embodiments, the second LED stack 33 may emit light of a longer wavelength than that emitted from of the third LED stack 43, such as green light.

The first LED stack 23 may include an AlGaInP-based well layer, the second LED stack 33 may include an AlGaInN-based well layer, and the third LED stack 43 may include an AlGaInP or AlGaInN-based well layer.

Since the first LED stack 23 emits light having a longer wavelength than that emitted from the second and third LED stacks 33 and 43, light generated in the first LED stack 23 may be emitted to the outside through the second and third LED stacks 33 and 43. In addition, since the second LED stack 33 emits light having a shorter wavelength than that emitted from the third LED stack 43, a portion of light generated in the second LED stack 33 may be absorbed by the third LED stack 43 and lost, and thus, luminous intensity of light generated in the second LED stack 33 may be reduced. Meanwhile, since light generated in the third LED stack 43 is emitted to the outside without passing through the first and second LED stacks 23 and 33, luminous intensity thereof may be increased.

The first conductivity type semiconductor layer 23a, 33a, or 43a of each of the LED stacks 23, 33, and 43 may be an n-type semiconductor layer, and the second conductivity type semiconductor layer 23b, 33b or 43b thereof may be a p-type semiconductor layer. According to the illustrated exemplary embodiment, an upper surface of the first LED stack 23 is an n-type semiconductor layer 23b, an upper surface of the second LED stack 33 is a p-type semiconductor layer 33b, and an upper surface of the third LED stack 43 is a p-type semiconductor layer 43b. As such, a stack sequence in the first LED stack 23 is reversed from those in the second LED stack 33 and the third LED stack 43. The semiconductor layers of the second LED stack 33 are stacked in the same order as the semiconductor layers of the third LED stack 43, and thus, process stability may be ensured. This will be described in detail later with reference to a manufacturing method.

The second LED stack 33 includes a mesa etching region, in which the second conductivity type semiconductor layer 33b is removed to expose an upper surface of the first conductivity type semiconductor layer 33a. As shown in FIGS. 3 and 4B, the second n-electrode pad 37a may be disposed on the first conductivity type semiconductor layer 33a exposed in the mesa etching region. The third LED stack 43 may also include a mesa etching region, in which the second conductivity type semiconductor layer 43b is removed to expose an upper surface of the first conductivity type semiconductor layer 43a, and a third n-electrode pad 47 may be disposed on the exposed first conductivity type semiconductor layer 43a. However, the first LED stack 23 may not include a mesa etching region.

The third LED stack 43 may have a flat lower surface, but the inventive concepts are not limited thereto. For example, the third LED stack 43 may include irregularities on a surface of the first conductivity type semiconductor layer 43a, and light extraction efficiency may be improved by the irregularities. The surface irregularities of the first conductivity type semiconductor layer 43a may be formed when separating a patterned sapphire substrate, but may also be formed by texturing after the growth substrate is removed therefrom. In some exemplary embodiments, the second LED stack 33 may also have the first conductivity type semiconductor layer 33a having a textured surface.

In the illustrated exemplary embodiment, the first LED stack 23, the second LED stack 33, and the third LED stack 43 may be overlapped with one another, and may have a light emitting area of substantially similar size. However, the light emitting areas of the first, second, and third LED stacks 23, 33, and 43 may be adjusted by the mesa etching region, the through holes 23h1, 23h2, 23h3, and 23h4, and the through holes 33h1 and 33h2. For example, the light emitting areas of the first and third LED stacks 23 and 43 may be larger than that of the second LED stack 33, and thus, luminous intensity of light generated in the first LED stack 23 or the third LED stack 43 may be further increased compared to that of light generated in the second LED stack 33.

The first transparent electrode 25 may be disposed between the first LED stack 23 and the second LED stack 33. The first transparent electrode 25 is in ohmic contact with the second conductivity type semiconductor layer 23b of the first LED stack 23 and transmits light generated in the first LED stack 23. The first transparent electrode 25 may be formed using a metal layer or a transparent oxide layer, such as indium tin oxide (ITO). The first transparent electrode 25 may cover an entire surface of the second conductivity type semiconductor layer 23b of the first LED stack 23, and a side surface thereof may be substantially flush with a side surface of the first LED stack 23. In particular, a side surface of the first transparent electrode 25 may not be covered with the second bonding layer 59. Furthermore, the through holes 23h1, 23h2, and 23h3 may pass through the first transparent electrode 25, and thus, the first transparent electrode 25 may be exposed to sidewalls of the through holes 23h1, 23h2, and 23h3. Meanwhile, the through hole 23h4 may expose an upper surface of the first transparent electrode 25. However, the inventive concepts are not limited thereto, and in some exemplary embodiments, the first transparent electrode 25 may be partially removed along an edge of the first LED stack 23, so that the side surface of the first transparent electrode 25 may be covered with the second bonding layer 59. In addition, since the first transparent electrode 25 may be removed by patterning in advance in a region where the through holes 23h1, 23h2, and 23h3 are formed, the first transparent electrode 25 may be prevented from being exposed to sidewalls of the through holes 23h1, 23h2, and 23h3.

The second transparent electrode 35 is in ohmic contact with the second conductivity type semiconductor layer 33b of the second LED stack 33. The second transparent electrode 35 contacts the upper surface of the second LED stack 33 between the first LED stack 23 and the second LED stack 33. The second transparent electrode 35 may be formed of a metal layer or a conductive oxide layer that is transparent to red light. The conductive oxide layer may include $SnO_2$, $InO_2$, ITO, ZnO, IZO, or the like. In particular, the second transparent electrode 35 may be formed of ZnO, which may be formed as a single crystal on the second LED stack 33 and has favorable electrical and optical characteristics as compared with the metal layer or other conductive oxide layers. Moreover, since ZnO has a strong adhesion to the second LED stack 33, the light emitting device may have improved reliability.

The second transparent electrode 35 may be partially removed along an edge of the second LED stack 33, and accordingly, an outer side surface of the second transparent electrode 35 may not be exposed to the outside, but covered with the intermediate insulation layer 58. More particularly, the side surface of the second transparent electrode 35 may be recessed inwardly than that of the second LED stack 33, and a region where the second transparent electrode 35 is recessed may be filled with the intermediate insulation layer 58 and/or the second bonding layer 59. Meanwhile, the second transparent electrode 35 may also be recessed near the mesa etching region of the second LED stack 33, and the recessed region may be filled with the intermediate insulation layer 58 or the second bonding layer 59.

The third transparent electrode 45 is in ohmic contact with the second conductivity type semiconductor layer 43b of the third LED stack 43. The third transparent electrode 45 may be disposed between the second LED stack 33 and the third LED stack 43, and contacts the upper surface of the third LED stack 43. The third transparent electrode 45 may be formed of a metal layer or a conductive oxide layer that is transparent to red light and green light, for example. The conductive oxide layer may include $SnO_2$, $InO_2$, ITO, ZnO, IZO, or the like. In particular, the third transparent electrode 45 may be formed of ZnO, which may be formed as a single crystal on the third LED stack 43 and has favorable electrical and optical characteristics as compared with the metal layer or other conductive oxide layers. In addition, since ZnO has a strong adhesion to the third LED stack 43, the light emitting device may have improved reliability.

The third transparent electrode 45 may be partially removed along an edge of the third LED stack 43, and accordingly, an outer side surface of the third transparent electrode 45 may not be exposed to the outside, but covered with the lower insulation layer 48 or the first bonding layer 49. More particularly, the side surface of the third transparent electrode 45 may be recessed inwardly than that of the third LED stack 43, and a region where the third transparent electrode 45 is recessed may be filled with the lower insulation layer 48 and/or the first bonding layer 49. Meanwhile, the third transparent electrode 45 may also be recessed near the mesa etching region of the third LED stack 43, and the recessed region may be filled with the lower insulation layer 48 or the first bonding layer 49.

The second transparent electrode 35 and the third transparent electrode 45 are recessed as described above, and thus, the side surfaces of the second transparent electrode 35 and the third transparent electrode 45 may be prevented from being exposed to an etching gas, thereby improving the production yield of the light emitting device 100.

According to an exemplary embodiment, the second transparent electrode 35 and the third transparent electrode 45 may be include the same conductive oxide layer, for example, ZnO, and the first transparent electrode 25 may be formed of a different conductive oxide layer from the second and third transparent electrodes 35 and 45, such as ITO. However, the inventive concepts are not limited thereto, and in some exemplary embodiments, each of the first, second, and third transparent electrodes 25, 35, and 45 may include the same material, or at least one of the first, second, and third transparent electrodes 25, 35, and 45 may include a different material.

The first n-electrode pad 27a is in ohmic contact with the first conductivity type semiconductor layer 23a of the first LED stack 23. The first n-electrode pad 27a may include, for example, AuGe or AuTe.

The second n-electrode pad 37a is in ohmic contact with the first conductivity type semiconductor layer 33a of the second LED stack 33. The second n-electrode pad 37a may be disposed on the first conductivity type semiconductor layer 33a exposed by mesa etching. The second n-electrode pad 37a may be formed of, for example, Cr/Au/Ti.

The third n-electrode pad 47a is in ohmic contact with the first conductivity type semiconductor layer 43a of the third LED stack 43. The third n-electrode pad 47a may be disposed on the first conductivity type semiconductor layer 43a exposed through the second conductivity type semiconductor layer 43b, that is, in the mesa etching region. The third n-electrode pad 47a may be formed of, for example, Cr/Au/Ti. An upper surface of the third n-electrode pad 47a may be placed higher than that of the second conductivity type semiconductor layer 43b, and further, higher than that of the third transparent electrode 45. For example, a thickness of the third n-electrode pad 47a may be about 2 μm or more. The third n-electrode pad 47a may have a shape of a truncated cone, but is not limited thereto. The third n-electrode pad 47a in other exemplary embodiments may have various shapes, such as a square pyramid, a cylindrical shape, or a cylindrical shape.

The lower p-electrode pad 47b may include substantially the same material as the third n-electrode pad 47a. An upper surface of the lower p-electrode pad 47b may be located at substantially the same elevation as the third n-electrode pad 47a, and, accordingly, a thickness of the lower p-electrode pad 47b may be less than that of the third n-electrode pad 47a. More particularly, the thickness of the lower p-electrode pad 47b may be approximately equal to a thickness of a portion of the third n-electrode pad 47a protruding above the third transparent electrode 45. For example, the thickness of the lower p-electrode pad 47b may be about 1.2 μm or less. Since the upper surface of the lower p-electrode pad 47b is located at substantially the same elevation as that of the third n-electrode pad 47a, the lower p-electrode pad 47b and the third n-electrode pad 47a may be simultaneously exposed when the through holes 33h1 and 33h2 are formed. When the elevations of the third n-electrode pad 47a and the lower p-electrode pad 47b are different, any one of the electrode pads may be damaged in the etching process. As such, the elevations of the third n-electrode pad 47a and the lower p-electrode pad 47b are set to be approximately equal, so as to prevent any one of the electrode pads from being damaged during the etching process or the like.

The lower insulation layer 48 covers the upper surface of the third LED stack 43. The lower insulation layer 48 may also cover the third transparent electrode 45, and may cover the third n-electrode pad 47a and the lower p-electrode pad 47b. The lower insulation layer 48 may have openings exposing the third n-electrode pad 47a and the lower p-electrode pad 47b. The lower insulation layer 48 may protect the third LED stack 43 and the third transparent electrode 45. Further, the lower insulation layer 48 may include a material capable of improving adhesion to the first bonding layer 49, such as $SiO_2$. In some exemplary embodiments, the lower insulation layer 48 may be omitted.

The first bonding layer 49 couples the second LED stack 33 to the third LED stack 43. The first bonding layer 49 may be disposed between the first conductivity type semiconductor layer 33a and the third transparent electrode 45. The first bonding layer 49 may contact the lower insulation layer 48, and may partially contact the third n-electrode pad 47a and the lower p-electrode pad 47b. When the lower insulation layer 48 is omitted, the first bonding layer 49 may partially contact the third transparent electrode 45 and the first conductivity type semiconductor layer 43a exposed in the mesa etching region.

The first bonding layer 49 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include $Al_2O_3$, $SiO_2$, $SiN_x$, or the like. In addition, the first bonding layer 49 may be formed of spin-on-glass (SOG).

The first planarization layer 51 may be disposed on the second LED stack 33. In particular, the first planarization layer 51 is disposed on an upper region of the second conductivity type semiconductor layer 33b and spaced apart from the mesa etching region. The first planarization layer 51 may be divided into a plurality of islands by patterning. In the illustrated exemplary embodiment, the first planarization layer 51 is divided into three regions.

The through holes 33*h*1 and 33*h*2 may pass through the first planarization layer 51, the second LED stack 33, and the first bonding layer 49, and expose the third n-electrode pad 47*a* and the lower p-electrode pad 47*b*.

The first sidewall insulation layer 53 covers sidewalls of the through holes 33*h*1 and 33*h*2 and has openings exposing bottoms of the through holes 33*h*1 and 33*h*2. The first sidewall insulation layer 53 may be formed using, for example, a chemical vapor deposition technique or an atomic layer deposition technique, and may be formed of, for example, $Al_2O_3$, $SiO_2$, $Si_3N_4$, or the like.

The lower buried vias 55*a* and 55*b* may fill the through holes 33*h*1 and 33*h*2, respectively. The lower buried vias 55*a* and 55*b* are insulated from the second LED stack 33 by the first sidewall insulation layer 53. The lower buried via 55*a* may be electrically connected to the third n-electrode pad 47*a*, and the lower buried via 55*b* may be electrically connected to the lower p-electrode pad 47*b*.

The lower buried vias 55*a* and 55*b* may be formed using a chemical mechanical polishing technique. For example, after forming a seed layer and filling the through holes 33*h*1 and 33*h*2 with a conductive material such as Cu using a plating technique, the lower buried vias 55*a* and 55*b* may be formed by removing metal layers on the first planarization layer 51 using the chemical mechanical polishing technique. As shown in FIGS. 4A and 4B, the lower buried vias 55*a* and 55*b* may have a relatively wider width at inlets of the through holes 33*h*1 and 33*h*2, and thus, the electrical connection may be strengthened.

The lower buried vias 55*a* and 55*b* may be formed together through the same process. As such, upper surfaces of the lower buried vias 55*a* and 55*b* may be substantially flush with the first planarization layer 51. However, the inventive concepts are not limited thereto, and the lower buried vias may be formed through different processes from one another. A detailed process of forming the lower buried vias will be described in more detail later.

The intermediate insulation layer 58 is formed on the second LED stack 33 and covers the second transparent electrode 35, the first planarization layer 51, and the second n-electrode pad 37*a*. The intermediate insulation layer 58 may also cover the mesa etching region of the second LED stack 33. The intermediate insulation layer 58 may have openings exposing the lower buried vias 55*a* and 55*b* and the second n-electrode pad 37*a*. The intermediate insulation layer 58 may be formed of, for example, $SiO_2$. The intermediate insulation layer 58 may protect the second LED stack 33 and the second transparent electrode 35, and further, may improve adhesion of the second bonding layer 59.

The lower connectors 39*a*, 39*b*, and 39*c* are disposed on each region of the first planarization layer 51. The first lower connector 39*a* may be electrically connected to the lower buried via 55*a*, and may also extend in the lateral direction to be electrically connected to the second n-electrode pad 37*a*. As such, the first conductivity type semiconductor layer 43*a* of the third LED stack 43 and the first conductivity type semiconductor layer 33*a* of the second LED stack 33 may be commonly electrically connected. The first lower connector 39*a* may cover the lower buried via 55*a*.

The second lower connector 39*b* is electrically connected to the lower buried via 55*b*. The second lower connector 39*b* may cover the lower buried via 55*b*.

The third lower connector 39*c* is electrically connected to the second transparent electrode 35. The third lower connector 39*c* may be formed to surround the first planarization layer 51 as shown in FIG. 4A, and may be connected to the second transparent electrode 35 along a periphery of the first planarization layer 51. Since the third lower connector 39*c* is disposed on the first planarization layer 51, an elevation of an upper end of the third lower connector 39*c* may be set to be approximately equal to that of the first lower connector 39*a* or the second lower connector 39*b*.

The second bonding layer 59 couples the first LED stack 23 to the second LED stack 33. The second bonding layer 59 may be disposed between the first transparent electrode 25 and the intermediate insulation layer 58. The second bonding layer 59 may also cover the first, second, and third lower connectors 39*a*, 39*b*, and 39*c*. The second bonding layer 59 may include substantially the same material that forms the first bonding layer 49 described above, and thus, repeated descriptions thereof will be omitted to avoid redundancy.

The second planarization layer 61 covers the first LED stack 23. Unlike the first planarization layer 51, the second planarization layer 61 may be formed continuously. The second planarization layer 61 may be formed of an aluminum oxide film, a silicon oxide film, or a silicon nitride film. The second planarization layer 61 may have an opening exposing the first n-electrode pad 27*a*.

The through holes 23*h*1, 23*h*2, 23*h*3, and 23*h*4 pass through the second planarization layer 61 and the first LED stack 23. Further, the through holes 23*h*1, 23*h*2, and 23*h*3 may pass through the first transparent electrode 25 and the second bonding layer 59 to expose the lower connectors 39*a*, 39*b*, and 39*c*, and the through hole 23*h*4 may expose the first transparent electrode 25. For example, the through hole 23*h*1 provides a passage for electrical connection to the lower buried via 55*a*, the through hole 23*h*2 provides a passage for electrical connection to the lower buried via 55*b*, and the through hole 23*h*3 provides a passage for electrical connection to the second transparent electrode 35.

The through hole 23*h*4 provides a passage for electrical connection to the first transparent electrode 25. The through hole 23*h*4 may not pass through the first transparent electrode 25. However, the inventive concepts are not limited thereto, and in some exemplary embodiments, the through hole 23*h*4 may pass through the first transparent electrode 25 as long as the through hole 23*h*4 provides the passage for electrical connection to the first transparent electrode 25.

The second sidewall insulation layer 63 covers the sidewalls of the through holes 23*h*1, 23*h*2, 23*h*3, and 23*h*4, and has openings exposing the bottoms of the through holes 23*h*1, 23*h*2, 23*h*3, and 23*h*4. In the illustrated exemplary embodiment, the second sidewall insulation layer 63 is not formed on a sidewall of an opening 61*a* of the second planarization layer 61, but the inventive concepts are not limited thereto. In some exemplary embodiments, the second sidewall insulation layer 63 may also be formed on the sidewall of the opening 61*a* of the second planarization layer 61. The second sidewall insulation layer 63 may be formed using, for example, a chemical vapor deposition technique or an atomic layer deposition technique, and may be formed of, for example, $Al_2O_3$, $SiO_2$, $Si_3N_4$, or the like.

The upper buried vias 65*a*, 65*b*, 65*c*, and 65*d* may fill the through holes 23*h*1, 23*h*2, 23*h*3, and 23*h*4, respectively. The upper buried vias 65*a*, 65*b*, 65*c*, and 65*d* are electrically insulated from the first LED stack 23 by the second sidewall insulation layer 63.

The upper buried via 65*a* may be electrically connected to the lower buried via 55*a* through the first lower connector 39*a*, the upper buried via 65*b* may be electrically connected to the lower buried via 55*b* through the second lower connector 39*b*, and the upper buried via 65*c* may be electrically connected to the second transparent electrode 35 through the third lower connector 39c. Also, the upper buried via 65d may be electrically connected to the first transparent electrode 25.

The upper buried vias 65a, 65b, 65c, and 65d may be formed using a chemical mechanical polishing technique. For example, after forming a seed layer and filling the through holes 23h1, 23h2, 23h3, and 23h4 using a plating technique, the upper buried vias 65a, 65b, 65c, and 65d may be formed by removing metal layers on the second planarization layer 61 using the chemical mechanical polishing technique. Furthermore, a metal barrier layer may be formed before forming the seed layer.

The upper buried vias 65a, 65b, 65c, and 65d may be substantially flush with the second planarization layer 61 that may be formed together through the same process. However, the inventive concepts are not limited thereto, and the upper buried vias 65a, 65b, 65c, and 65d may be formed through different processes from each other.

The first upper connector 67a, the second upper connector 67b, the third upper connector 67c, and the fourth upper connector 67d are disposed on the second planarization layer 61. The first upper connector 67a may be electrically connected to the upper buried via 65a, the second upper connector 67b may be electrically connected to the upper buried via 65b, the third upper connector 67c may be electrically connected to the upper buried via 65c, and the fourth upper connector 67d may be electrically connected to the upper buried via 65d. As shown, the first, second, third, and fourth upper connectors 67a, 67b, 67c, and 67d may cover the upper buried vias 65a, 65b, 65c, and 65d, respectively. The first upper connector 67a may be electrically connected to the first n-electrode pad 27a through the opening 61a of the second planarization layer 61. As such, the first conductivity type semiconductor layers 23a, 33a, 43a of the first, second, and third LED stacks 23, 33, and 43 are commonly electrically connected to one another.

The first upper connector 67a, the second upper connector 67b, the third upper connector 67c, and the fourth upper connector 67d may be formed of substantially the same material, for example, AuGe/Ni/Au/Ti, in the same process.

The upper insulation layer 71 may cover the first LED stack 23 and the second planarization layer 61, and may cover the first, second, third, and fourth upper connectors 67a, 67b, 67c, and 67d. The upper insulation layer 71 may also cover the side surface of the first transparent electrode 25. The upper insulation layer 71 may have openings 71a exposing the first upper connector 67a, the second upper connector 67b, the third upper connector 67c, and the fourth upper connector 67d. The openings 71a of the upper insulation layer 71 may be generally disposed on flat surfaces of the first upper connector 67a, the second upper connector 67b, the third upper connector 67c, and the fourth upper connector 67d. The upper insulation layer 71 may be formed of a silicon oxide film or a silicon nitride film, and may be formed to be thinner than the second planarization layer 61 to be about 400 nm thick, without being limited thereto.

Each of the bump pads 73a, 73b, 73c, and 73d may be disposed on the first upper connector 67a, the second upper connector 67b, and the third upper connector 67c, and the fourth upper connector 67d, and is electrically connected thereto through the openings 71a of the upper insulation layer 71.

The first bump pad 73a is electrically connected to the upper buried vias 65a and the first n-electrode pad 27a through the first upper connector 67a, and accordingly, is commonly electrically connected to the first conductivity type semiconductor layers 23a, 33a, 43a of the LED stacks 23, 33, and 43.

The second bump pad 73b may be electrically connected to the second conductivity type semiconductor layer 43b of the third LED stack 43 through the second upper connector 67b, the upper buried via 65b, the second lower connector 39b, the lower buried via 55b, the lower p-electrode pad 47b, and the transparent electrode 45.

The third bump pad 73c may be electrically connected to the second conductivity type semiconductor layer 33b of the second LED stack 33 through the third upper connector 67c, the upper buried via 65c, the third lower connector 39c, and the second transparent electrode 35.

The fourth bump pad 73d may be electrically connected to the second conductivity type semiconductor layer 23b of the first LED stack 23 through the fourth upper connector 67d and the first transparent electrode 25.

As such, each of the second to fourth bump pads 73b, 73c, and 73d may be electrically connected to the second conductivity type semiconductor layers 23b, 33b, and 43b of the first, second, and third LED stacks 23, 33, and 43, and the first bump pad 73a may be commonly electrically connected to the first conductivity type semiconductor layers 23a, 33a, and 43a of the first, second, and third LED stacks 23, 33, and 43.

The bump pads 73a, 73b, 73c, and 73d may cover the openings 71a of the upper insulation layer 71, and portions of the bump pads 73a, 73b, 73c, and 73d may be disposed on the upper insulation layer 71. Alternatively, the bump pads 73a, 73b, 73c, and 73d may be disposed in the openings 71a, and thus, upper surfaces of the bump pads may be flat.

The bump pads 73a, 73b, 73c, and 73d may be formed of Au/In. For example, Au may be formed to have a thickness of about 3 μm, and In may be formed to have a thickness of about 1 μm. According to an exemplary embodiment, the light emitting device 100 may be bonded to the pads on the circuit board 101 using In. However, the inventive concepts are not limited thereto, and in some exemplary embodiments, the light emitting device 100 may be bonded to the pads using Pb or AuSn of the bump pads.

According to the illustrated exemplary embodiment, the first LED stack 23 is electrically connected to the bump pads 73a and 73d, the second LED stack 33 is electrically connected to the bump pads 73a and 73c, and the third LED stack 43 is electrically connected to the bump pads 73a and 73b. Accordingly, cathodes of the first LED stack 23, the second LED stack 33, and the third LED stack 43 are commonly electrically connected to the first bump pad 73a, and anodes thereof are electrically connected to the second to fourth bump pads 73b, 73c, and 73d, respectively. Accordingly, the first, second, and third LED stacks 23, 33, and 43 may be driven independently.

As described above, the light emitting device 100 according to the illustrated exemplary embodiment includes the bump pads 73a, 73b, 73c, and 73d, but the inventive concepts are not limited thereto. In some exemplary embodiments, the bump pads may be omitted. In particular, when the light emitting device is bonded to the circuit board using an anisotropic conductive film or anisotropic conductive paste, the bump pads may be omitted, and upper connectors 67a, 67b, 67c, and 67d may be directly bonded to the circuit board. As such, a bonding area may be increased.

Hereinafter, a method of manufacturing the light emitting device 100 will be described in detail. A structure of the light emitting device 100 will also be described in more detail through the manufacturing method described below. FIGS.

5A, 5B, and 5C are schematic cross-sectional views of the first, second, and third LED stacks 23, 33, and 43 grown on growth substrates, respectively, according to an exemplary embodiment.

Figure 5A:
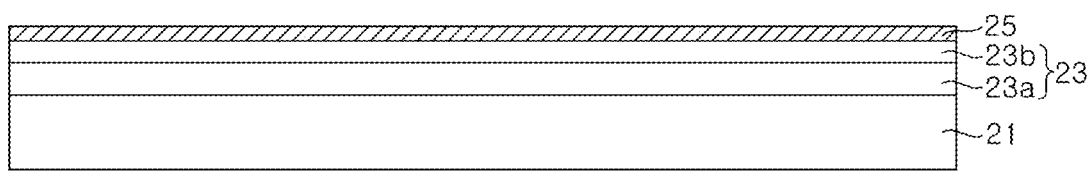
FIGS. 5A, 5B, and 5C are schematic cross-sectional views of first, second, and third LED stacks grown on growth substrates, respectively, according to an exemplary embodiment.

First, referring to FIG. 5A, a first LED stack 23 including a first conductivity type semiconductor layer 23a and a second conductivity type semiconductor layer 23b is grown on a first substrate 21. An active layer may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first transparent electrode 25 may be formed on the second conductivity type semiconductor layer 23b. As described above, the first transparent electrode 25 may be formed of a metal layer or a conductive oxide layer that transmits light generated by the first LED stack 23, for example, red light. The first transparent electrode 25 may be formed of, for example, indium-tin oxide (ITO).

Figure 5B:
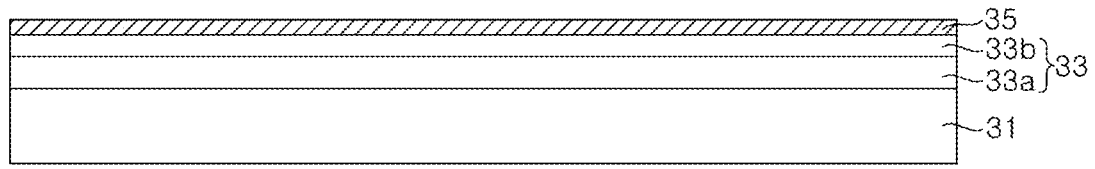

Referring to FIG. 5B, a second LED stack 33 including a first conductivity type semiconductor layer 33a and a second conductivity type semiconductor layer 33b is grown on a second substrate 31. An active layer may be interposed between the first conductivity type semiconductor layer 33a and the second conductivity type semiconductor layer 33b.

The second substrate 31 may be a substrate capable of growing the second LED stack 33 thereon, such as a sapphire substrate, a SiC substrate, or a GaN substrate. In an exemplary embodiment, the second substrate 31 may be a flat sapphire substrate, but may be a patterned sapphire substrate in other exemplar embodiments. The first conductivity type semiconductor layer 33a and the second conductivity type semiconductor layer 33b may be formed of an AlGaInN-based semiconductor layer, and the active layer may include, for example, an AlGaInN-based well layer. A composition ratio of AlGaInN may be determined so that the second LED stack 33 emits blue light, for example.

A second transparent electrode 35 may be formed on the second conductivity type semiconductor layer 33b. As described above, the second transparent electrode 35 may be formed of a metal layer or a conductive oxide layer that transmits light generated by the first LED stack 23, for example, red light. In particular, the second transparent electrode 35 may be formed of ZnO.

Figure 5C:
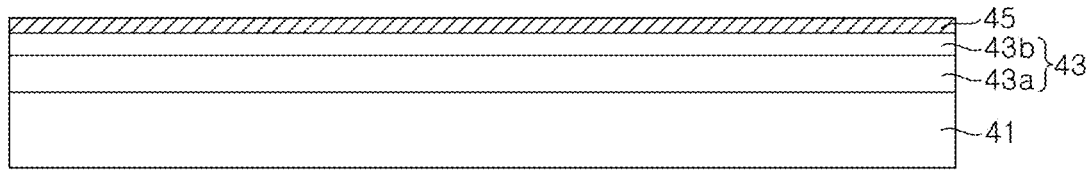

Referring to FIG. 5C, a third LED stack 43 including a first conductivity type semiconductor layer 43a and a second conductivity type semiconductor layer 43b is grown on a third substrate 41. An active layer may be interposed between the first conductivity type semiconductor layer 43a and the second conductivity type semiconductor layer 43b.

The third substrate 41 may be a substrate capable of growing the third LED stack 43 thereon, such as a sapphire substrate, a GaN substrate, or a GaAs substrate. The first conductivity type semiconductor layer 43a and the second conductivity type semiconductor layer 43b may be formed of an AlGaInAs-based or AlGaInP-based semiconductor layer, or an AlGaInN-based semiconductor layer, and the active layer may include, for example, an AlGaInP-based well layer or AlGaInN-based well layer. A composition ratio of AlGaInP or AlGaInN may be determined so that the third LED stack 43 emits green light, for example.

A third transparent electrode 45 may be formed on the second conductivity type semiconductor layer 43b. As described above, the third transparent electrode 45 may be formed of a metal layer or a conductive oxide layer that transmits light generated in the first and second LED stacks 23 and 33, for example, red light and blue light. In particular, the third transparent electrode 45 may be formed of ZnO.

The first, second, and third LED stacks 23, 33, and 43 are grown on the different growth substrates 21, 31, and 41, respectively. As such, the order of manufacturing the first, second, and third LED stacks 23, 33, and 43 is not particularly limited.

Hereinafter, a method of manufacturing the light emitting device 100 using first, second, and third LED stacks 23, 33, and 43 grown on growth substrates 21, 31, and 41 will be described. Hereinafter, although a region of a single light emitting device 100 will be mainly illustrated and described, a plurality of light emitting devices 100 may be manufactured in a batch in the same manufacturing process using the LED stacks 23, 33, and 43 grown on the growth substrates 21, 31, and 41.

FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, and 16C are schematic plan views and cross-sectional views illustrating a method of manufacturing a light emitting device for a display according to an exemplary embodiment. Lines A-A' and B-B' along which the above cross-sectional views are taken correspond to lines A-A' and B-B' of FIG. 3.

Figure 6A:
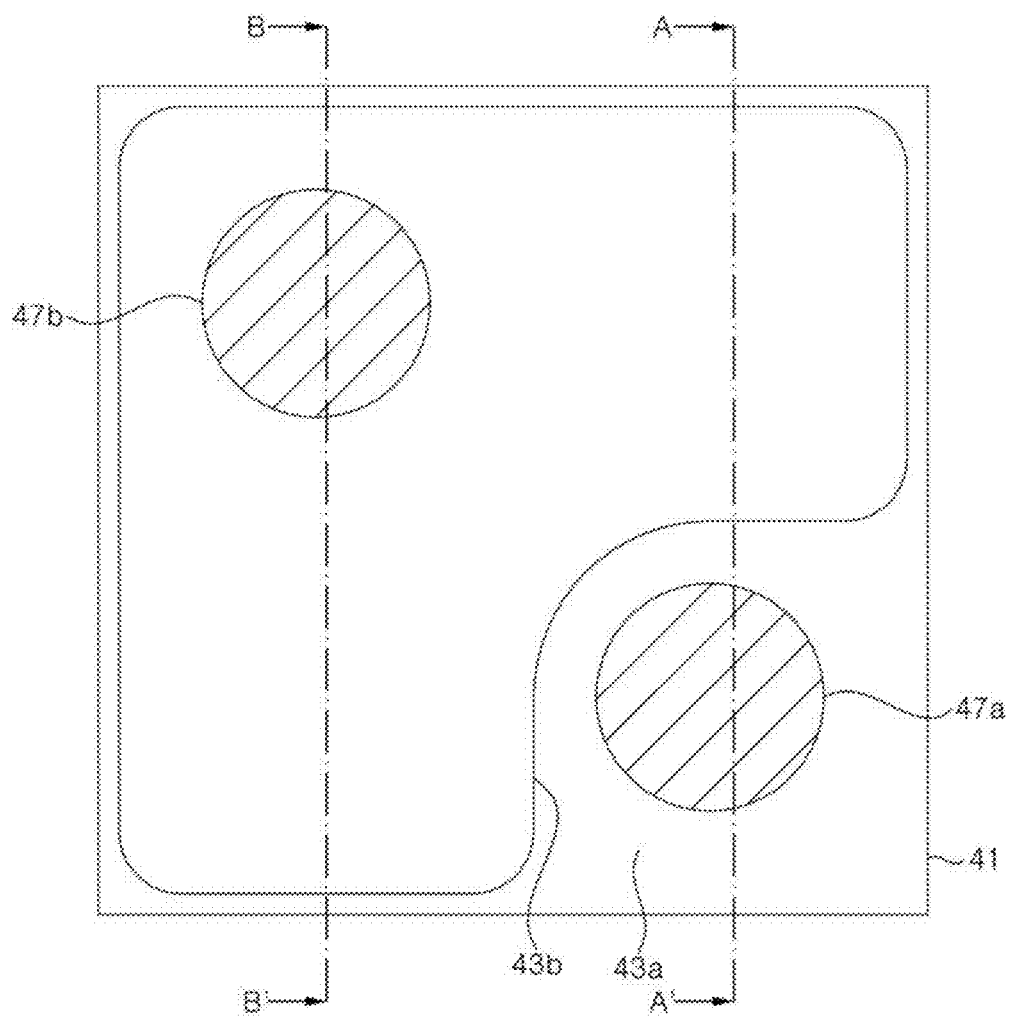
FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, and 16C are schematic plan views and cross-sectional views illustrating a method of manufacturing a light emitting device for a display according to an exemplary embodiment.
Figure 6B:
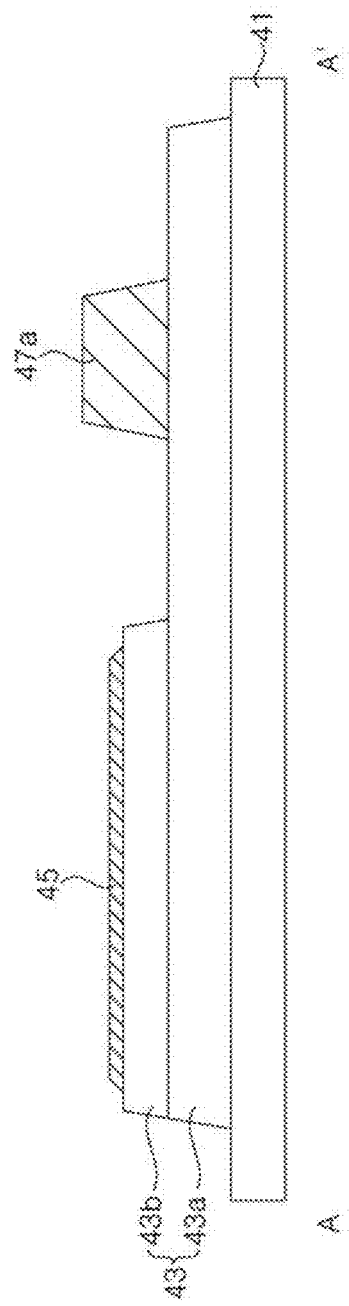
Figure 6C:
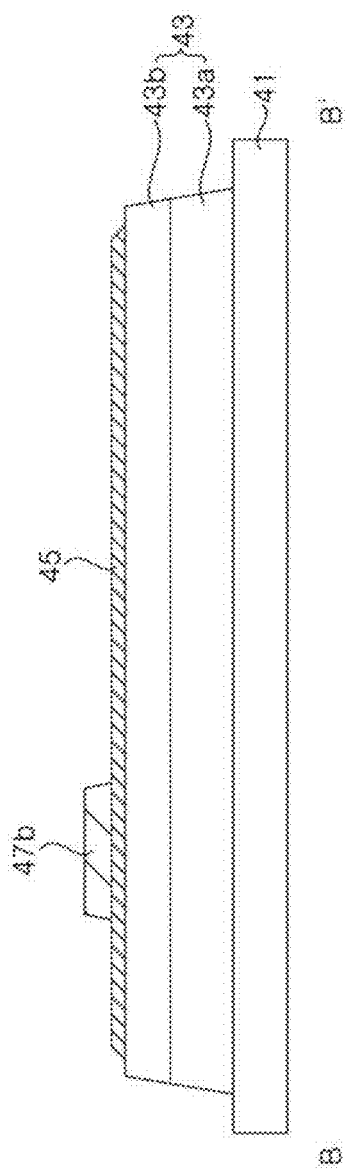

Referring to FIGS. 6A, 6B, and 6C, the third transparent electrode 45 and the second conductivity type semiconductor layer 43b of the third LED stack 43 are patterned to expose the first conductivity type semiconductor layer 43a using photo and etching techniques. This process corresponds to, for example, a mesa etching process. A photoresist pattern may be used as an etching mask. For example, after the etching mask is formed, the third transparent electrode 45 may be etched first by a wet etching technique, and then the second conductivity type semiconductor layer 43b may be etched by a dry etching technique using the same etching mask. In this manner, the third transparent electrode 45 may be recessed from a mesa etching region. FIG. 6A exemplarily shows an edge of the mesa and does not show an edge of the third transparent electrode 45 to simplify illustration. However, since the third transparent electrode 45 is wet etched using the same etching mask, the edge of the third transparent electrode 45 may also be recessed from the edge of the mesa toward an inner side of the mesa. Since the same etching mask is used, the number of photo processes may not be increased, thereby reducing the process costs. However, the inventive concepts are not limited thereto, and the etching mask for etching the mesa etching process may be different from the etching mask for etching the third transparent electrode 45.

Subsequently, a third n-electrode pad 47a and a lower p-electrode pad 47b are formed on the first conductivity type semiconductor layer 43a and the third transparent electrode 45, respectively. The third n-electrode pad 47a and the lower p-electrode pad 47b may be formed to have different thicknesses. In particular, an upper surface of the third n-electrode pad 47a and that of the lower p-electrode pad 47b may be located at substantially the same elevation.

An isolation region for defining a light emitting device region may be formed. For example, the first conductivity type semiconductor layer 43a may be removed along the isolation region and an upper surface of the substrate 41 may be exposed.

Further, a lower insulation layer 48 may be formed on the third LED stack 43. The lower insulation layer 48 may cover the exposed upper surface of the substrate 41 and may cover upper and side surfaces of the third transparent electrode 45 and the third LED stack 43. Further, openings exposing the third n-electrode pad 47a and the lower p-electrode pad 47b may be formed in the lower insulation layer 48.

Figure 7A:
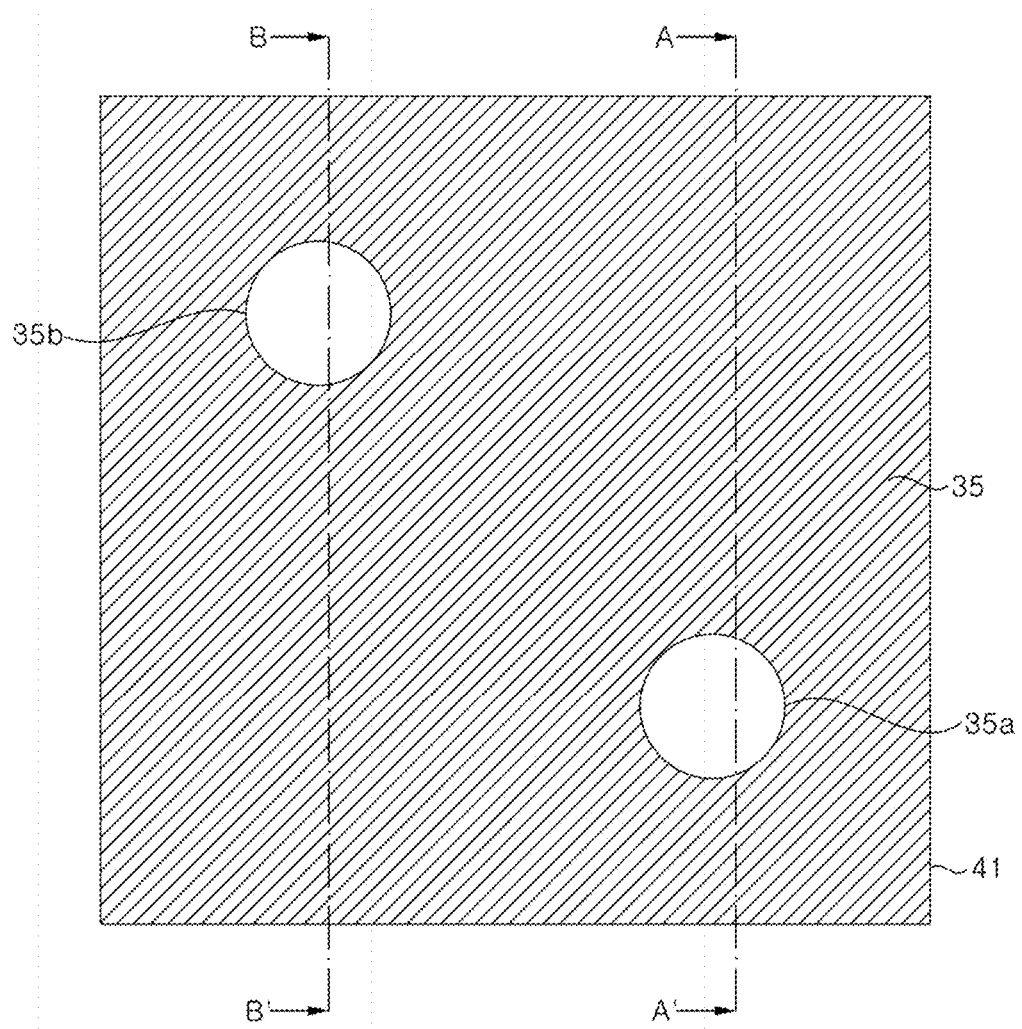
Figure 7B:
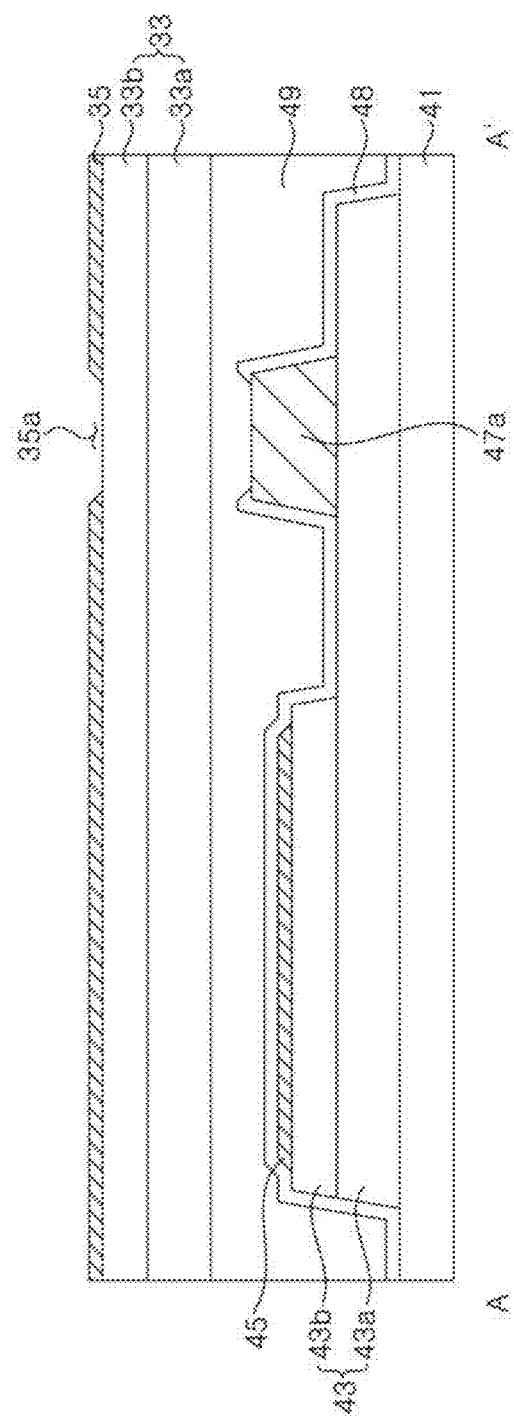
Figure 7C:
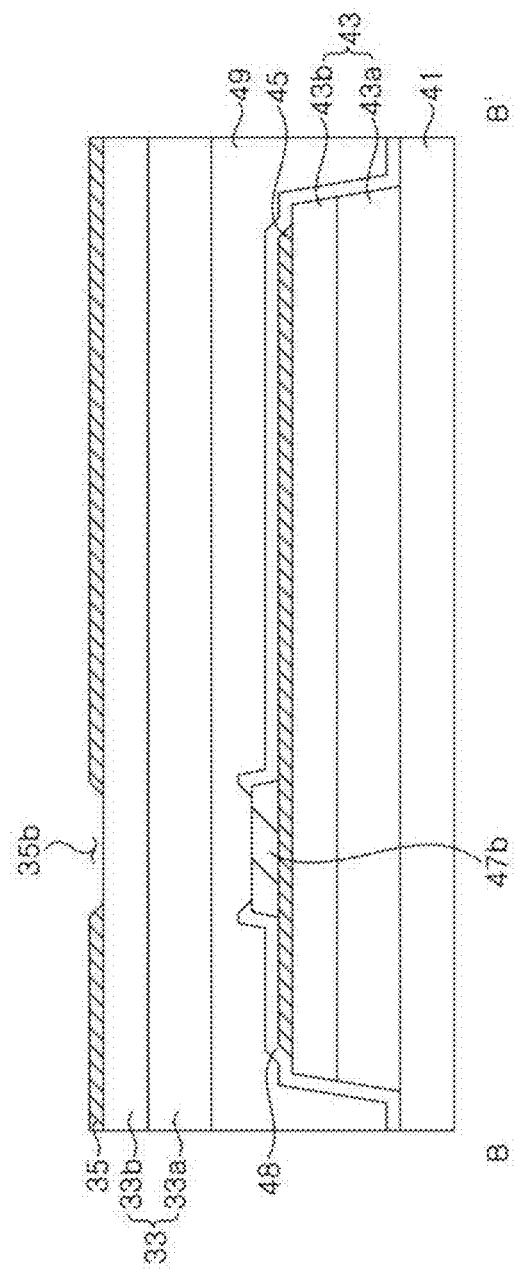

Referring to FIGS. 7A, 7B, and 7C, the second LED stack 33 shown in FIG. 5B is bonded onto the third LED stack 43 described with reference to FIGS. 6A, 6B, and 6C. The second LED stack 33 is bonded to a temporary substrate using a temporary bonding/debonding (TBDB) technique, and the second substrate 31 is removed from the second LED stack 33. The second substrate 31 may be removed using, for example, a laser lift off technique. After the second substrate 31 is removed, a roughened surface may be formed on a surface of the first conductivity type semiconductor layer 33a. Thereafter, the first conductivity type semiconductor layer 33a of the second LED stack 33 bonded to the temporary substrate may be disposed to face the third LED stack 43 and bonded to the third LED stack 43. The second LED stack 33 and the third LED stack 43 are bonded to each other by a first bonding layer 49. After bonding the second LED stack 33 to the third LED stack 43, the temporary substrate may be removed using the laser lift off technique. Accordingly, the second LED stack 33 may be disposed on the third LED stack 43, in which the second transparent electrode 35 may form an upper surface.

Subsequently, openings 35a and 35b may be formed by patterning the second transparent electrode 35. The opening 35a is disposed over the third n-electrode pad 47a, and the opening 35b is disposed over the lower p-electrode pad 47b. By forming the openings 35a and 35b in advance, the second transparent electrode 35 may be prevented from being exposed when forming the through holes 33h1 and 33h2 in subsequent process.

Figure 8A:
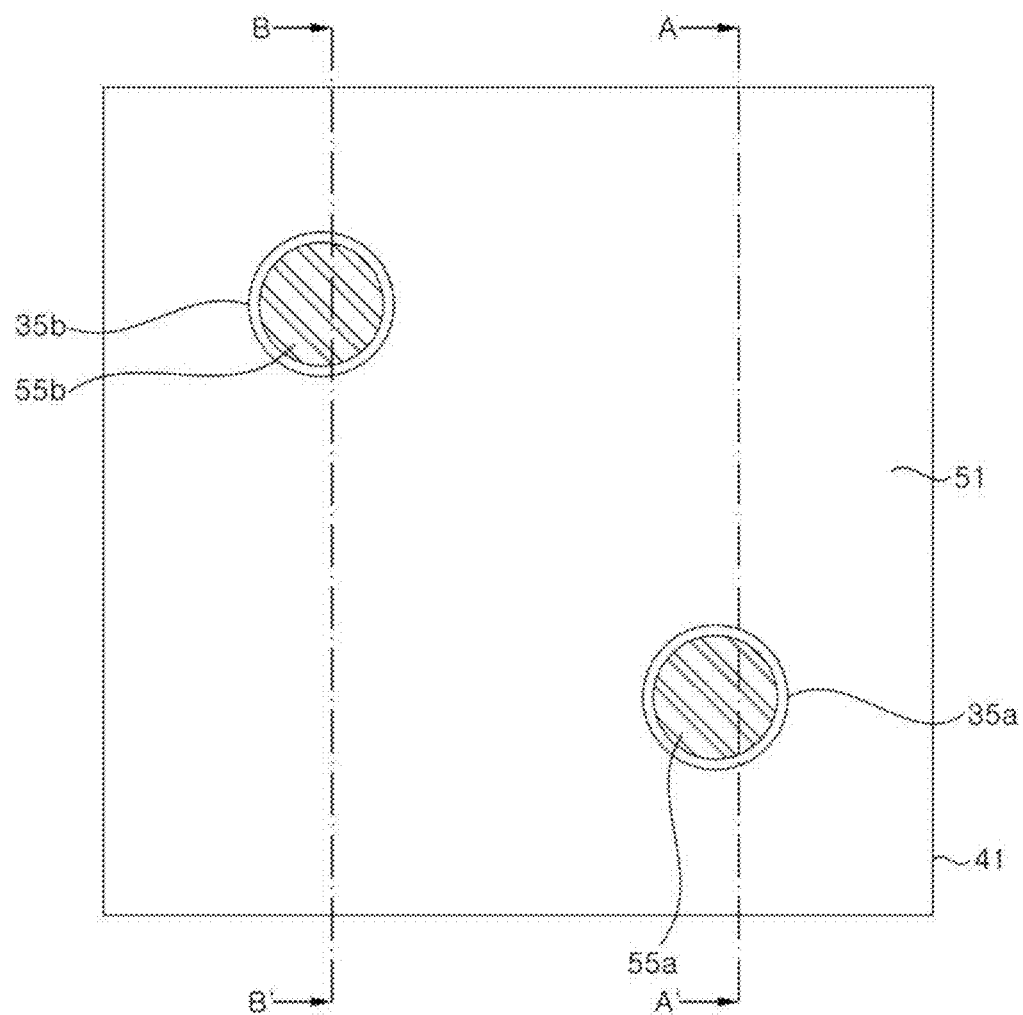
Figure 8B:
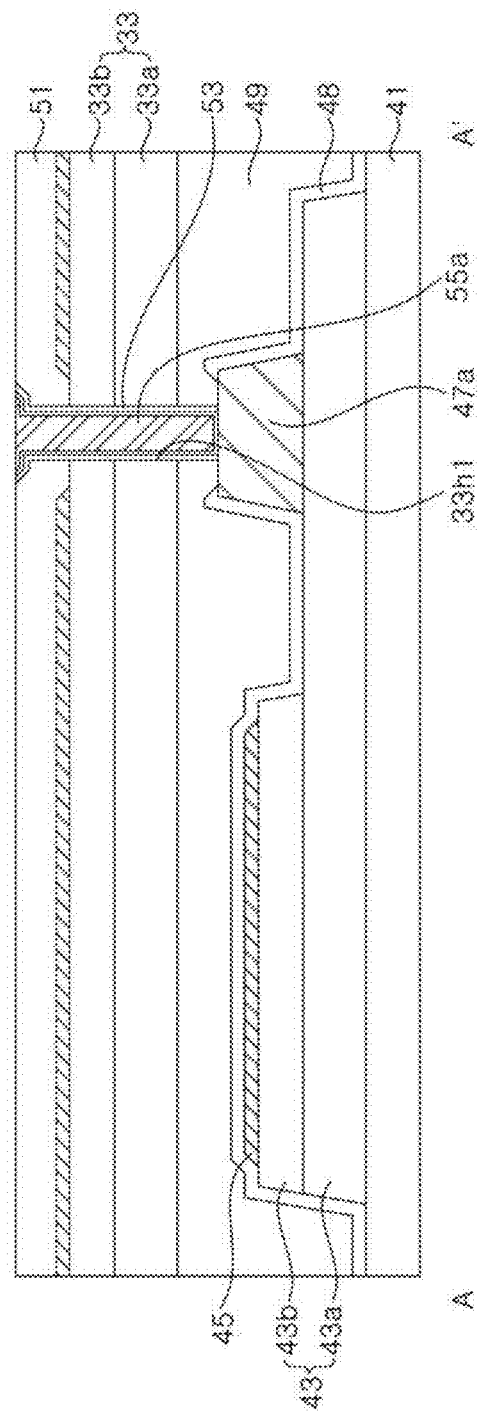
Figure 8C:
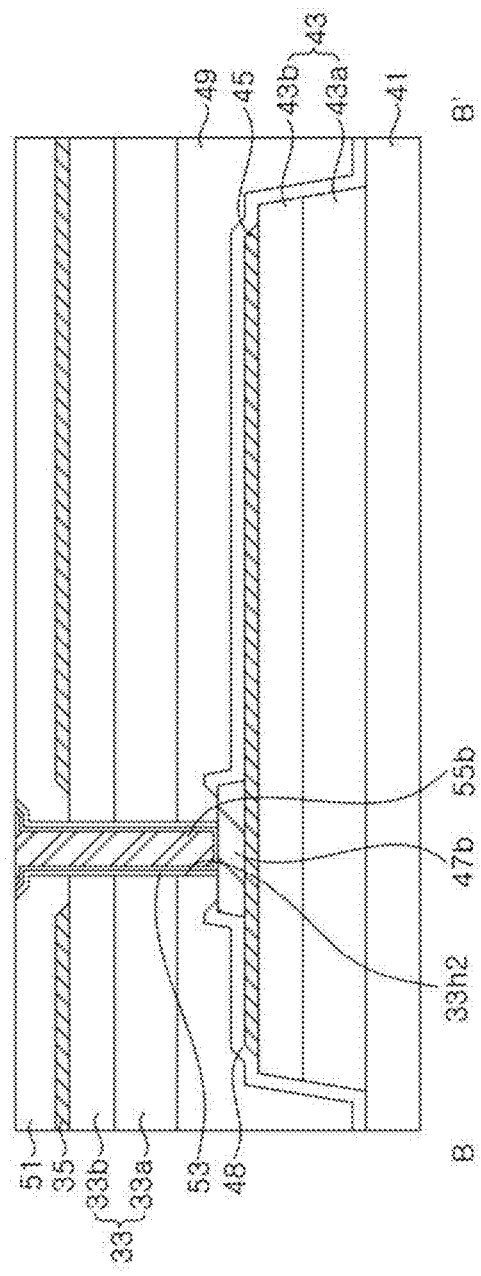

Referring to FIGS. 8A, 8B, and 8C, a first planarization layer 51 is formed on the second transparent electrode 35. The first planarization layer 51 may have a substantially flat upper surface, and may function as an insulation layer.

Subsequently, through holes 33h1 and 33h2 passing through the first planarization layer 51, the second LED stack 33, and the first bonding layer 49 are formed. The through holes 33h1 and 33h2 are respectively formed within the circumference of the openings 35a and 35b of the second transparent electrode 35 in a plan view, and thus, the second transparent electrode 35 is not exposed to sidewalls of the through holes 33h1 and 33h2. The through holes 33h1 and 33h2 expose the third n-electrode pad 47a and the lower p-electrode pad 47b, respectively.

A first sidewall insulation layer 53 is formed. The first sidewall insulation layer 53 may be formed first to cover an upper portion of the first planarization layer 51 and sidewalls and bottom surfaces of the through holes 33h1 and 33h2. For example, the first sidewall insulation layer 53 may be formed using a chemical vapor deposition technique or an atomic layer deposition technique.

Subsequently, the first sidewall insulation layer 53 is blanket etched using a dry etching technique. As such, the first sidewall insulation layer 53 formed on the bottom of the through holes 33h1 and 33h2 is removed to expose the third n-electrode pad 47a and the lower p-electrode pad 47b. The first sidewall insulation layer 53 formed on the first planarization layer 51 may be completely removed during blanket etching, and a portion of the first planarization layer 51 near inlets of the through holes 33h1 and 33h2 may also be removed. As such, the inlets of the through holes 33h1 and 33h2 may have a wider width than that of the bottom thereof. This will be described in detail later with reference to FIGS. 17A to 17D.

Thereafter, lower buried vias 55a and 55b filling the through holes 33h1 and 33h2 may be formed using a seed layer and a plating technique. The seed layer and the plating layer formed on the first planarization layer 51 may be removed using a chemical mechanical polishing technique.

Figure 9A:
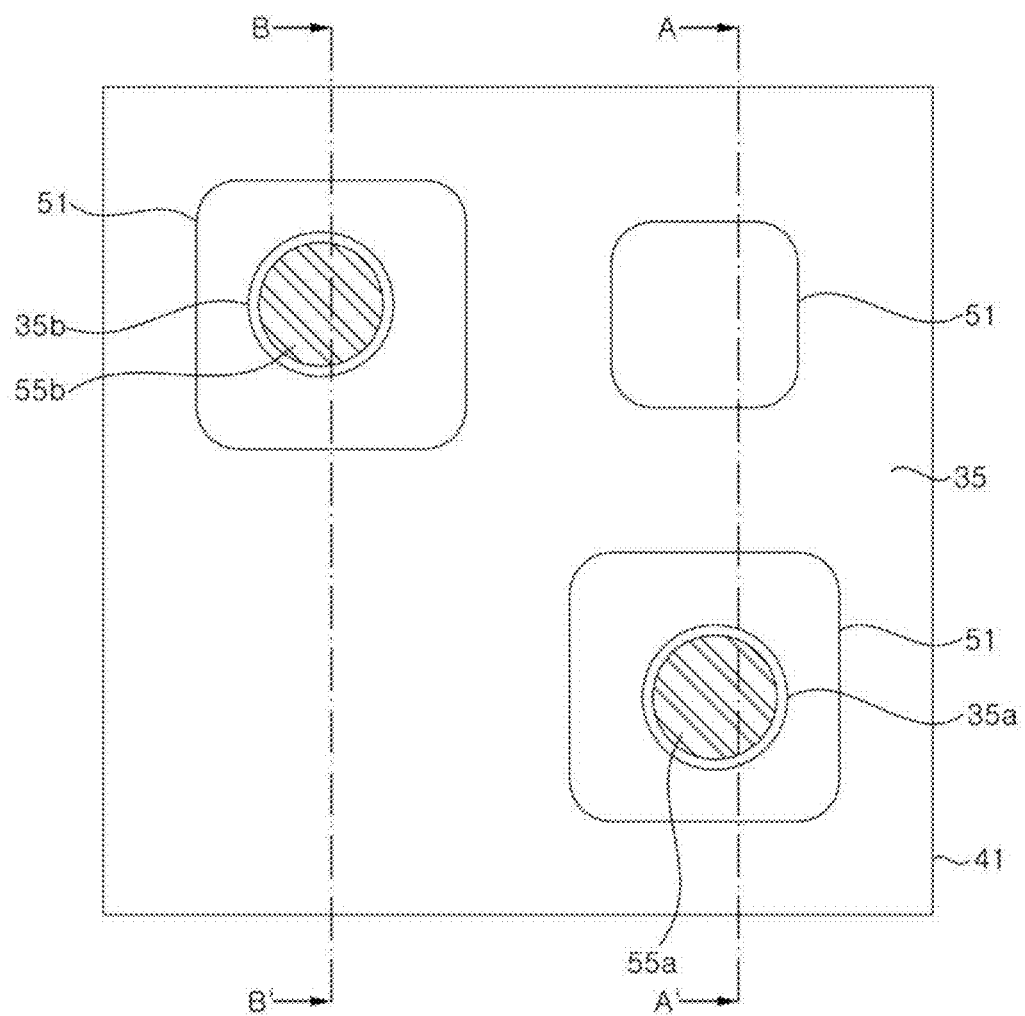
Figure 9B:
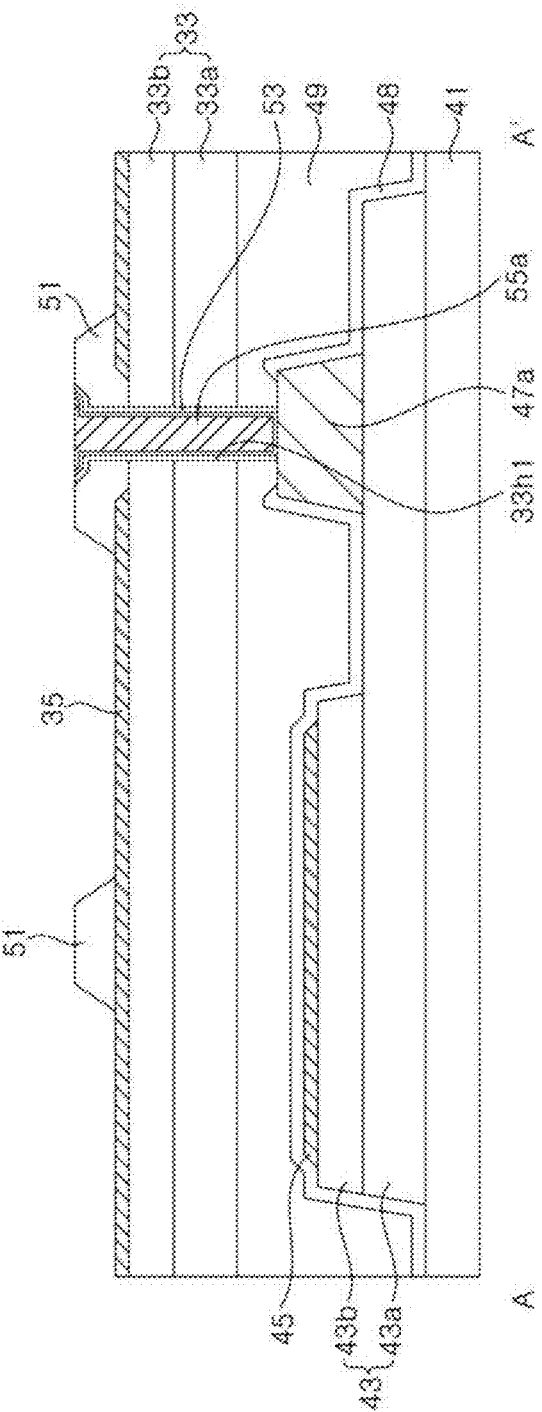
Figure 9C:
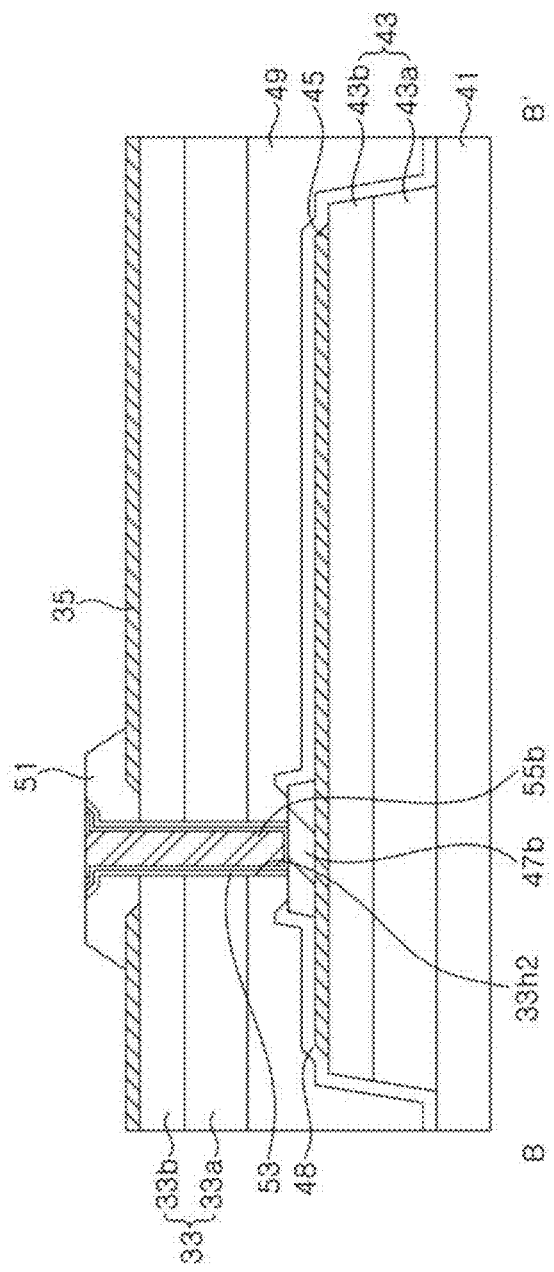

Referring to FIGS. 9A, 9B, and 9C, the first planarization layer 51 may be patterned to remove a portion of the first planarization layer 51, such that the retained first planarization layer 51 has an island shape in a plurality of regions. The first planarization layer 51 may be retained in regions where the lower buried vias 55a and 55b are formed, and a portion of the first planarization layer 51 may also be retained in a region where a lower connector 39c connected to the second transparent electrode layer 35 is to be formed. In this manner, the upper surface of the second transparent electrode 35 is exposed by patterning the first planarization layer 51.

Figure 10A:
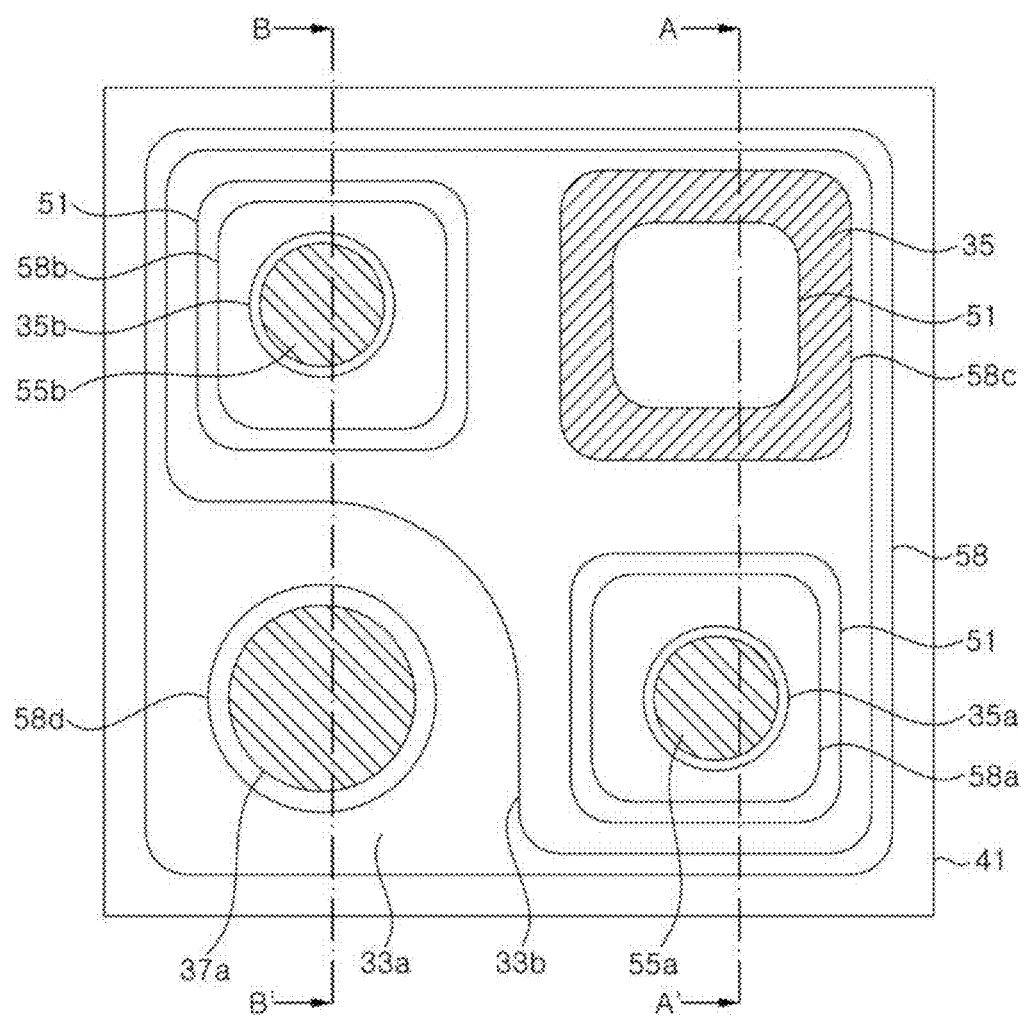
Figure 10B:
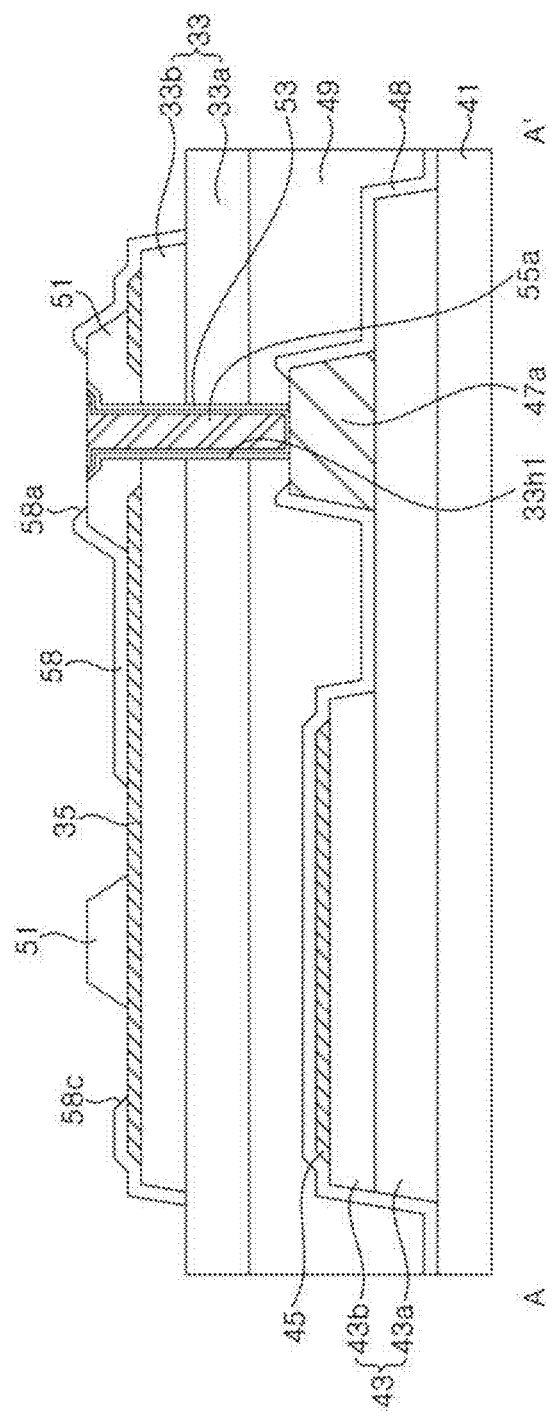
Figure 10C:
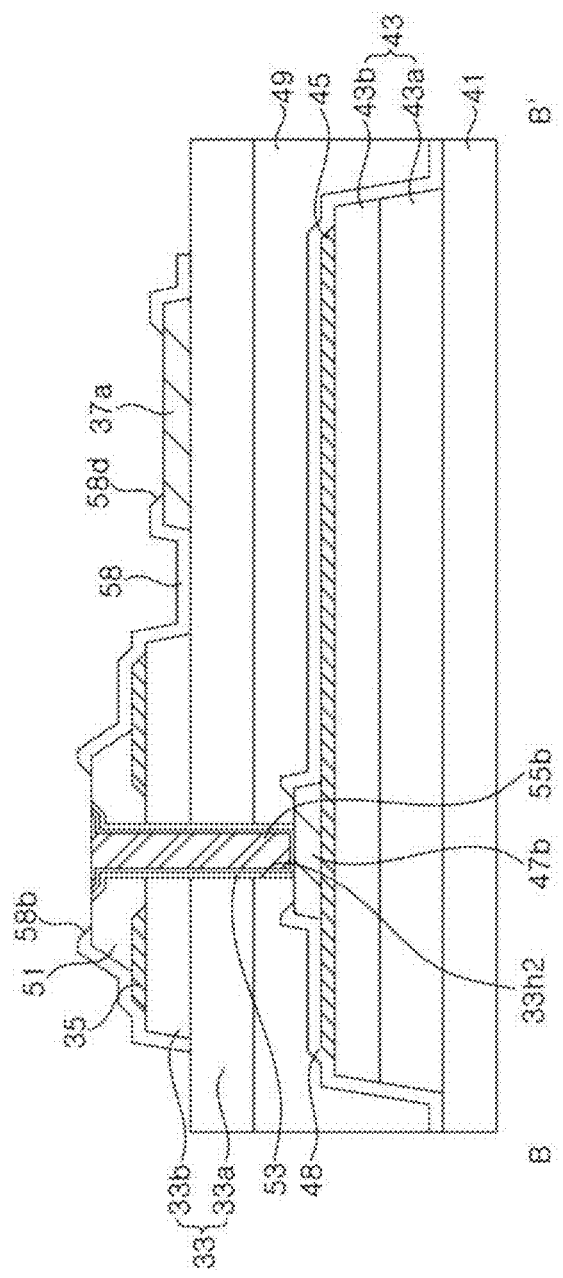

Referring to FIGS. 10A, 10B, and 10C, the second transparent electrode 35 and the second conductivity type semiconductor layer 33b are partially removed through mesa etching to expose the first conductivity type semiconductor layer 33a. The second transparent electrode 35 and the second conductivity type semiconductor layer 33b may be patterned by using photo and etching techniques. This process may be performed using the wet etching and the dry etching techniques in substantially the same manner as the mesa etching process, during which the third transparent electrode 45 and the second conductivity type semiconductor layer 43b are etched as described above.

Figure 11A:
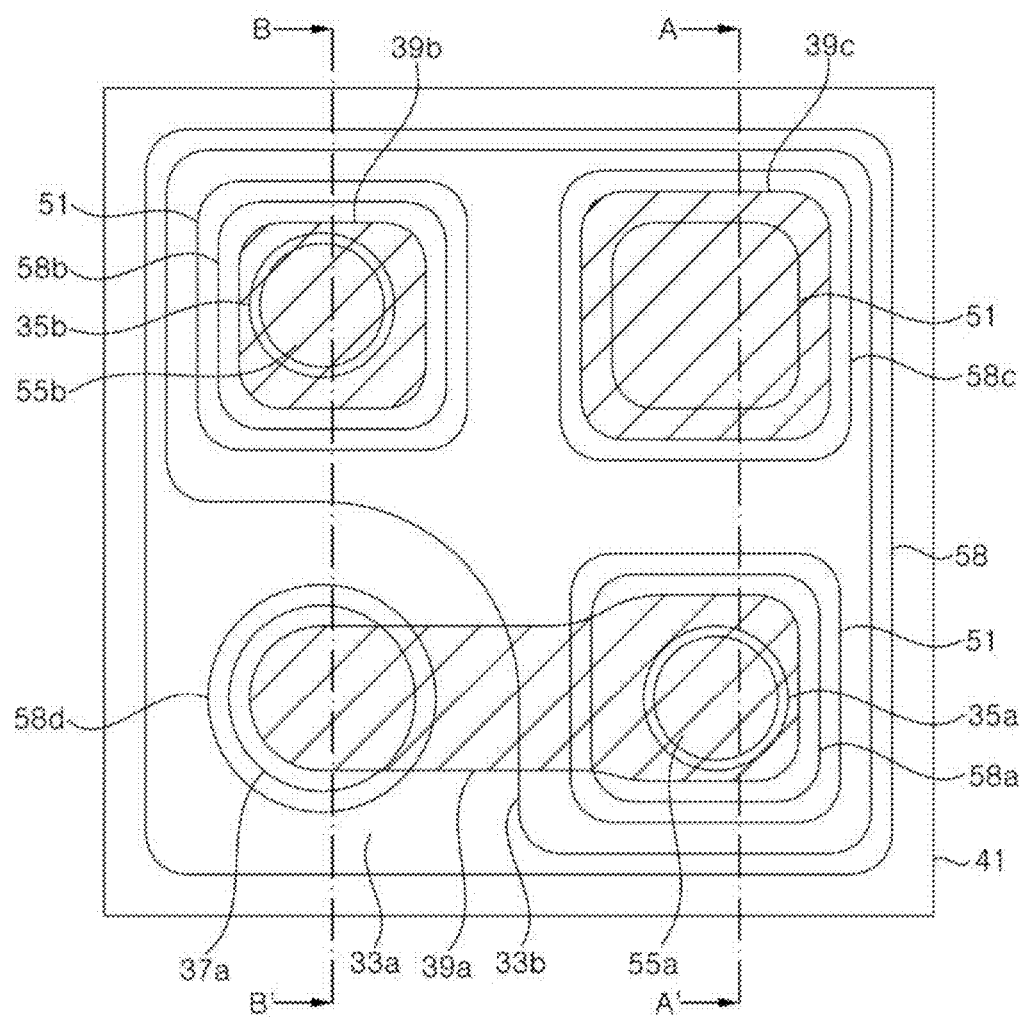

For example, after the etching mask is formed, the second transparent electrode 35 may be etched first by the wet etching technique, and then the second conductivity type semiconductor layer 33b may be etched by the dry etching technique using the same etching mask. Accordingly, the second transparent electrode 35 may be recessed from the mesa etching region. FIG. 11A exemplarily shows an edge of the mesa, and does not show an edge of the second transparent electrode 35 to simplify illustration. However, since the second transparent electrode 35 is wet etched using the same etching mask, the edge of the second transparent electrode 35 may also be recessed from the edge of the mesa toward an inner side of the mesa. In this manner, since the same etching mask is used, the number of photo processes may not be increased, thereby reducing the process costs. However, the inventive concepts are not limited thereto, and in some exemplary embodiments, the etching mask for etching the mesa etching process and the etching mask for etching the second transparent electrode 35 may be different from each other.

The mesa etching region of the second LED stack 33 may be partially overlapped with that of the third LED stack 43, but the mesa etching regions of the second LED stack 33 and the third LED stack 43 are generally separated from each other. In particular, a portion of the mesa etching region of the second LED stack 33 may be spaced apart from the third n-electrode pad 47a and the lower p-electrode pad 47b in the lateral direction. A second n-electrode pad 37a may be formed on the first conductivity type semiconductor layer 33a exposed by mesa etching.

An intermediate insulation layer 58 may be formed on the second LED stack 33. The intermediate insulation layer 58 may cover a portion of the first conductivity type semiconductor layer 33a exposed by mesa etching. The intermediate insulation layer 58 may also cover the second conductivity type semiconductor layer 33b, the second transparent electrode 35, the first planarization layer 51, and the second n-electrode pad 37a. The intermediate insulation layer 58 may have openings 58a and 58b exposing the lower buried vias 55a and 55b, and also have an opening 58d exposing the second n-electrode pad 37a. In addition, the intermediate insulation layer 58 may have an opening 58c exposing the first planarization layer 51 disposed apart from the lower buried vias 55a and 55b and a surrounding region thereof.

Figure 11B:
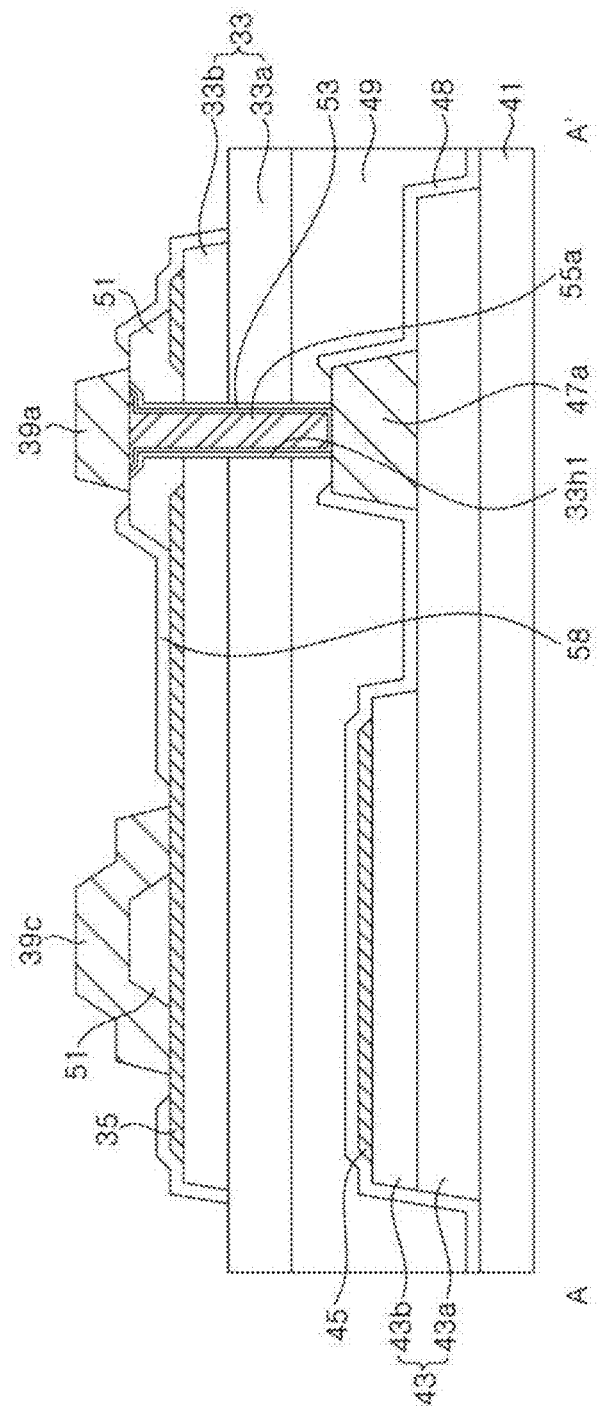
Figure 11C:
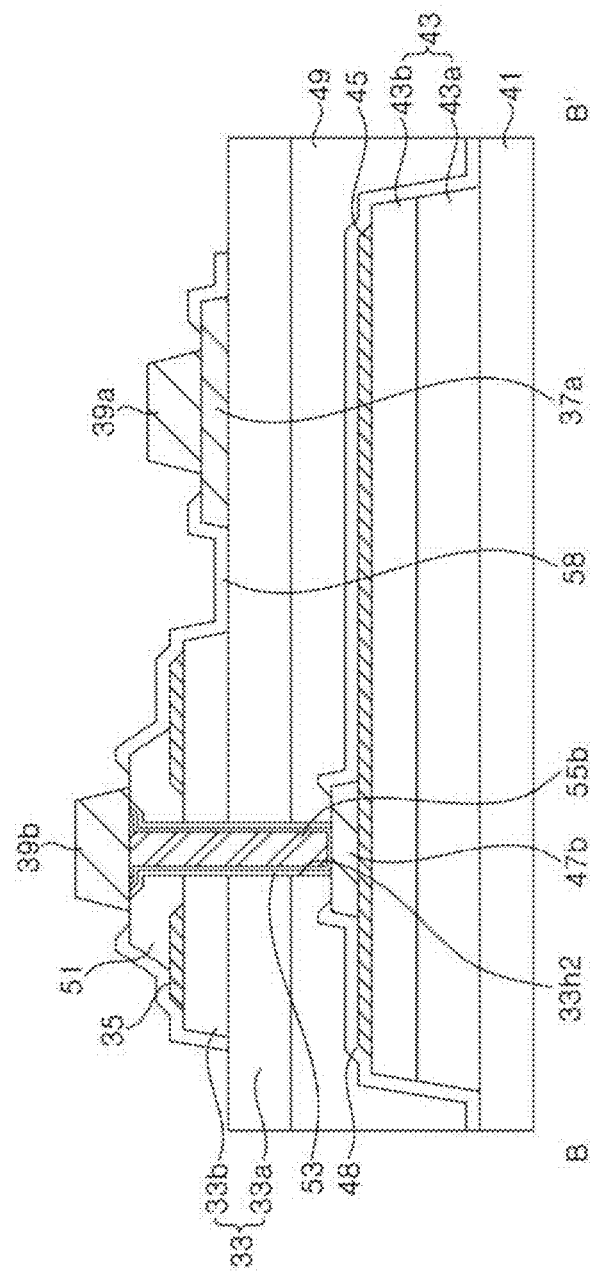

Referring to FIGS. 11A, 11B, and 11C, lower connectors 39a, 39b, and 39c are formed on the first planarization layer 51. The first lower connector 39a may be electrically connected to the lower buried via 55a and also extend in the lateral direction to be electrically connected to the second n-electrode pad 37a. The first lower connector 39a may be insulated from the second transparent electrode 35 and the second conductivity type semiconductor layer 33b by the intermediate insulation layer 58.

Figure 12A:
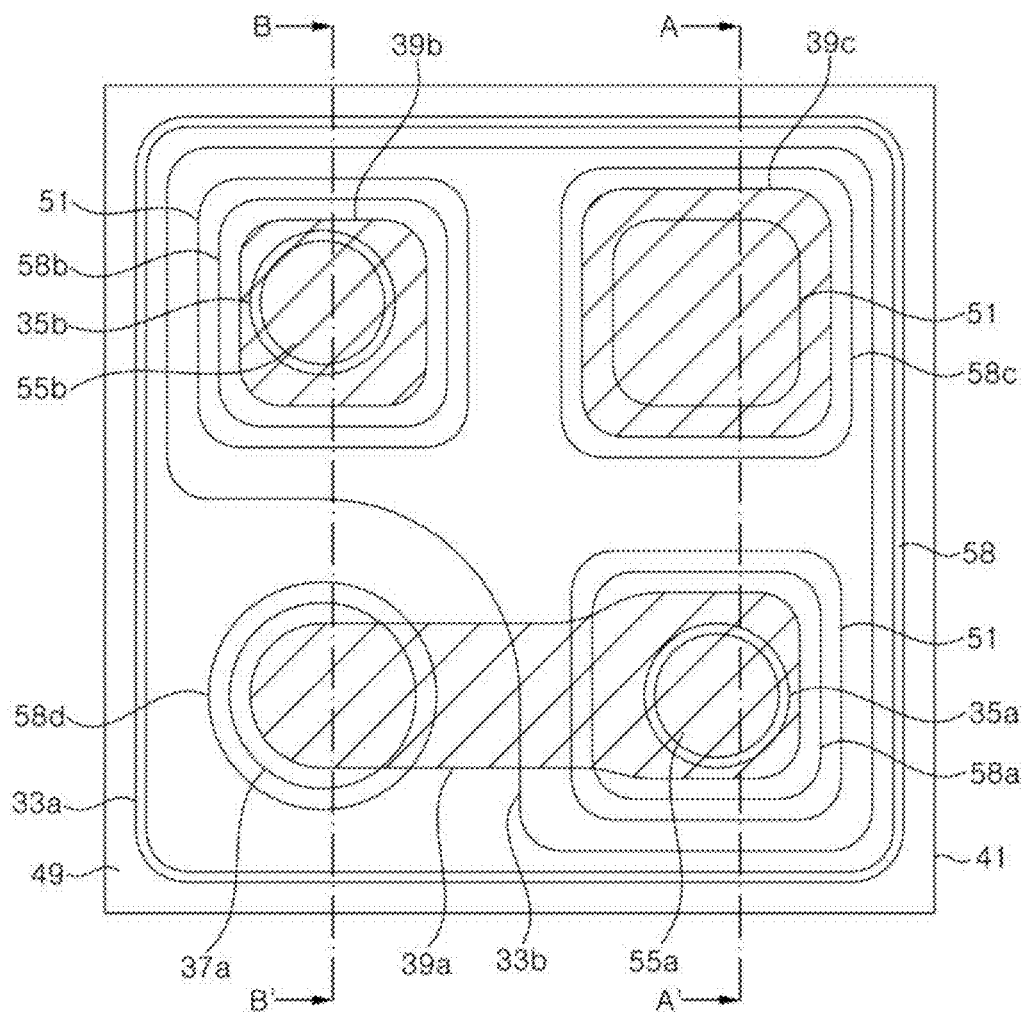
Figure 12B:
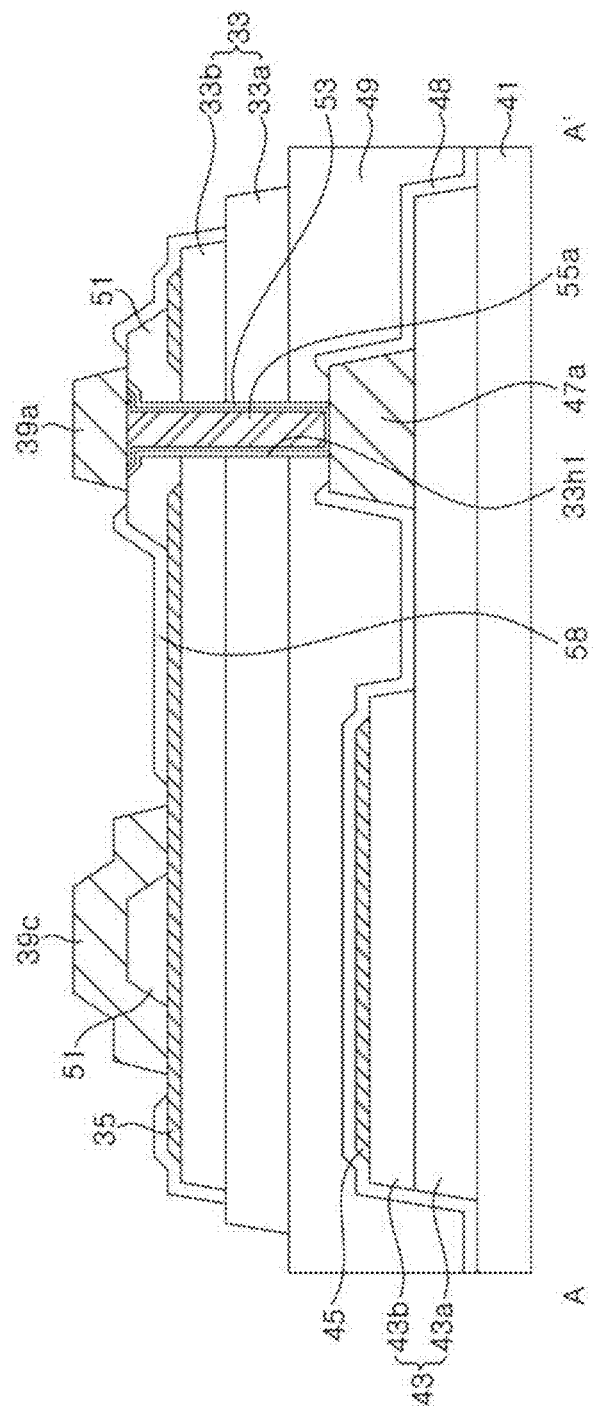
Figure 12C:
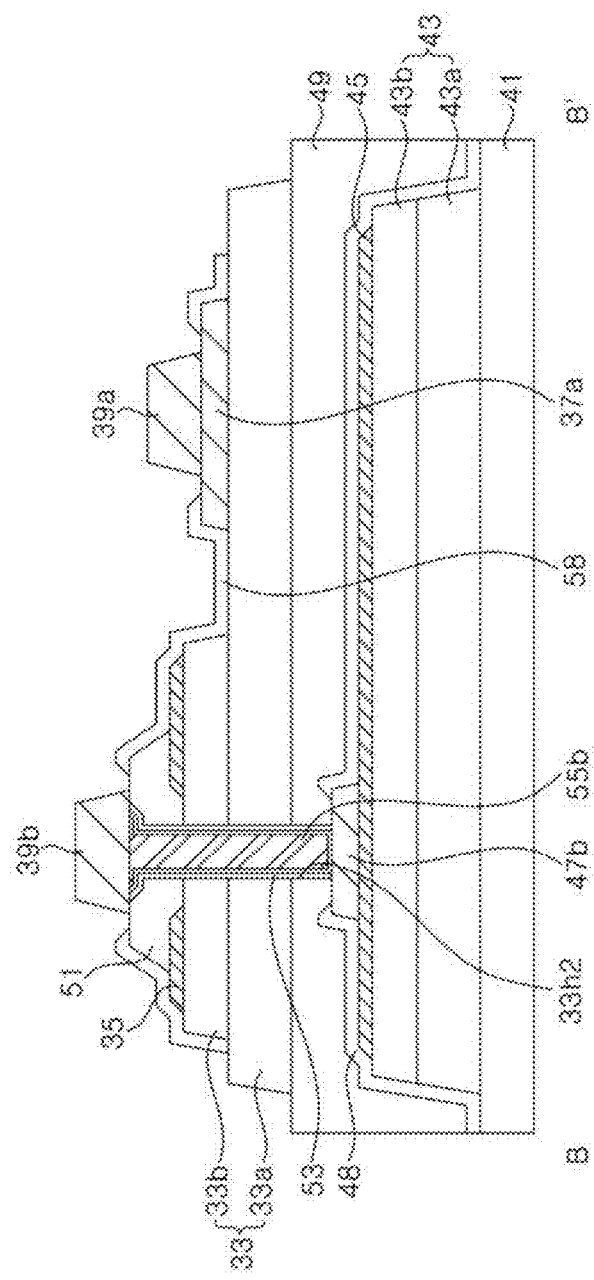

Referring to FIGS. 12A, 12B, and 12C, an isolation region for defining a light emitting device region may be formed. For example, the first conductivity type semiconductor layer 33a may be removed along the isolation region, and an upper surface of the first bonding layer 49 may be exposed. In some exemplary embodiments, an insulation layer covering a side surface of the first conductivity type semiconductor layer 33a may be added in addition to the intermediate insulation layer 58. This insulation layer may be formed to have openings exposing the lower connectors 39a, 39b, and 39c.

Figure 13A:
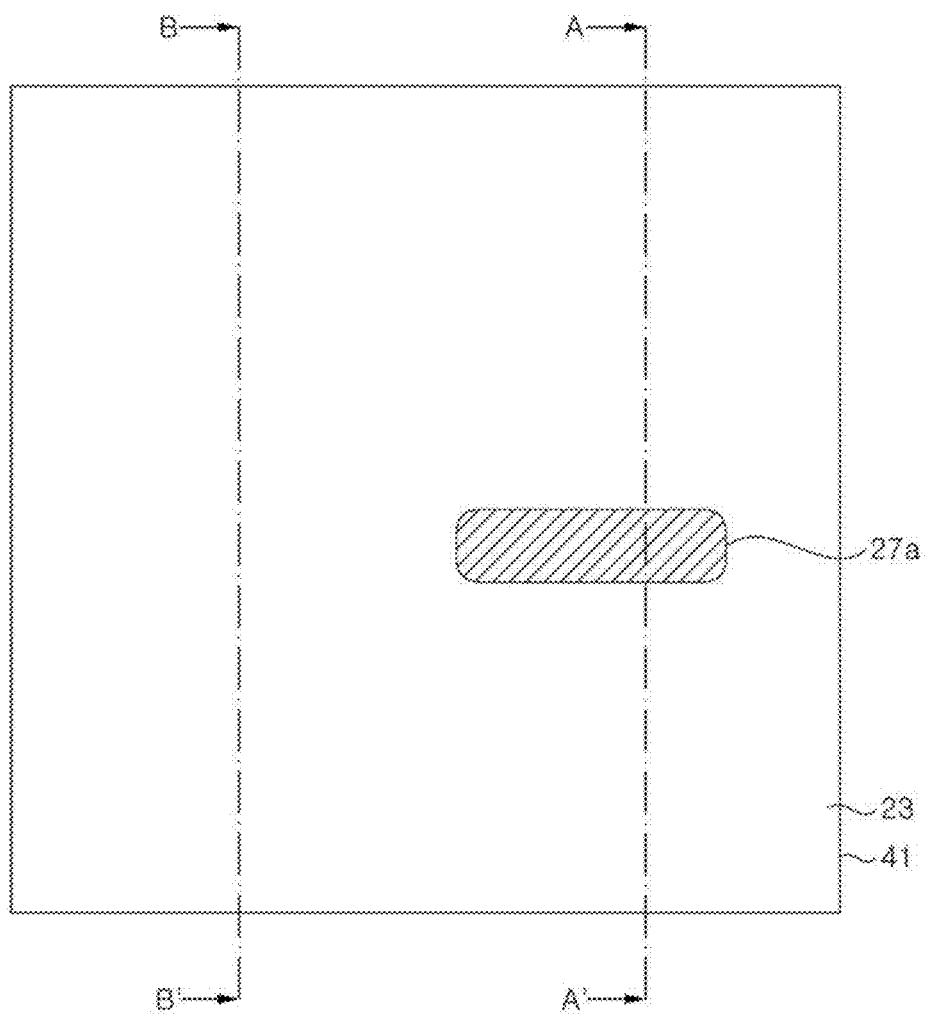
Figure 13B:
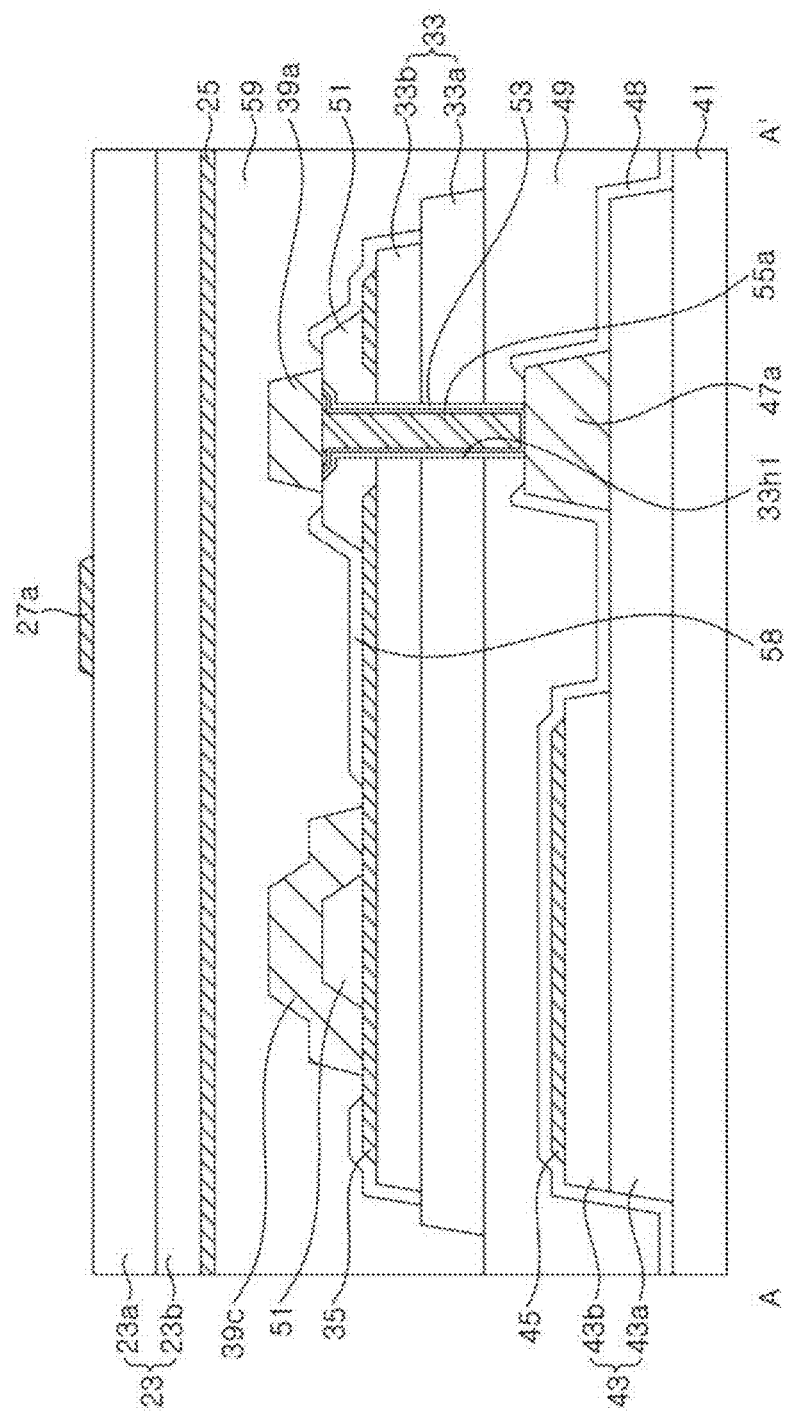
Figure 13C:
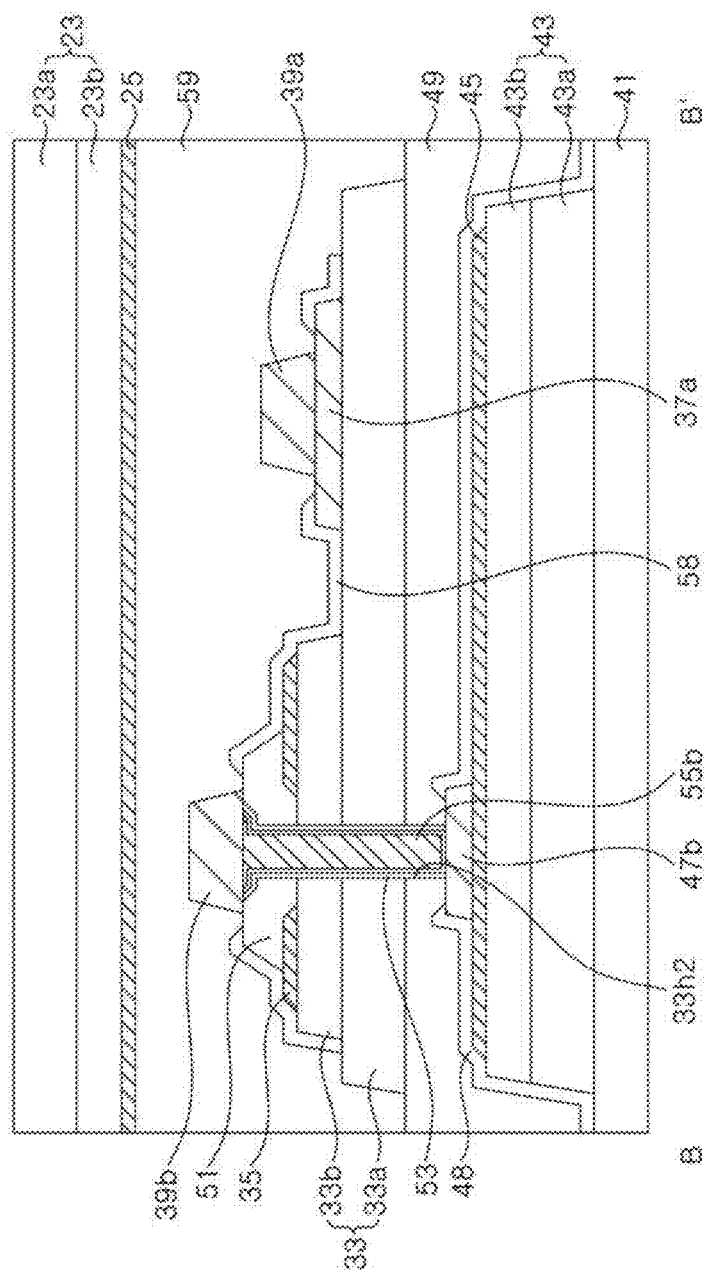

Referring to FIGS. 13A, 13B, and 13C, the first LED stack 23 described with FIG. 5A is bonded to the second LED stack 33. The first LED stack 23 and the second LED stack 33 may be bonded using a second bonding layer 59, so that the first transparent electrode 25 faces the second LED stack 33. Accordingly, the second bonding layer 59 is in contact with the first transparent electrode 25, and is also in contact with the intermediate insulation layer 58, and the lower connectors 39a, 39b, and 39c.

A first substrate 21 is removed from the first LED stack 23. The first substrate 21 may be removed using, for example, an etching technique. After the first substrate 21 is removed, a first n-electrode pad 27a may be formed on a portion of a region of the first conductivity type semiconductor layer 23a. The first n-electrode pad 27a may be formed to be in ohmic contact with the first conductivity type semiconductor layer 23a.

Figure 14A:
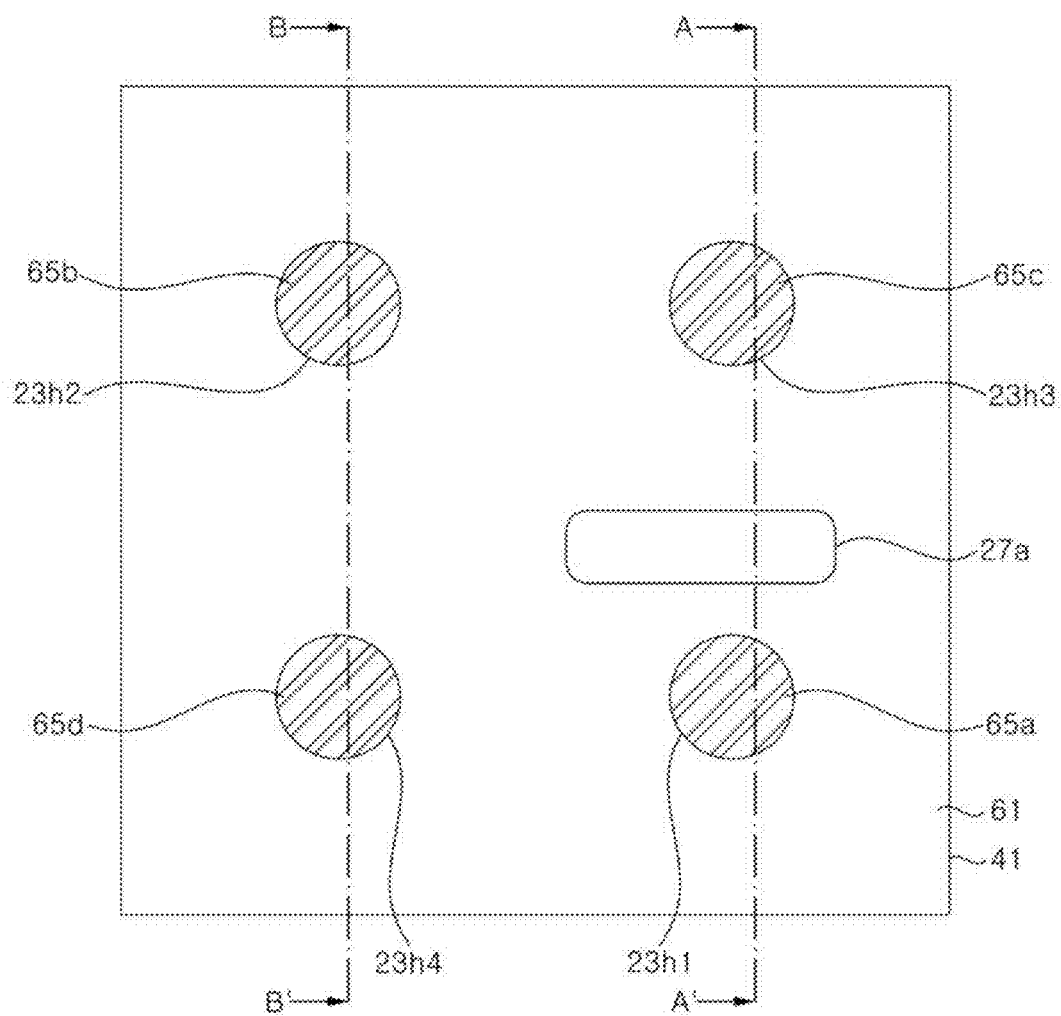
Figure 14B:
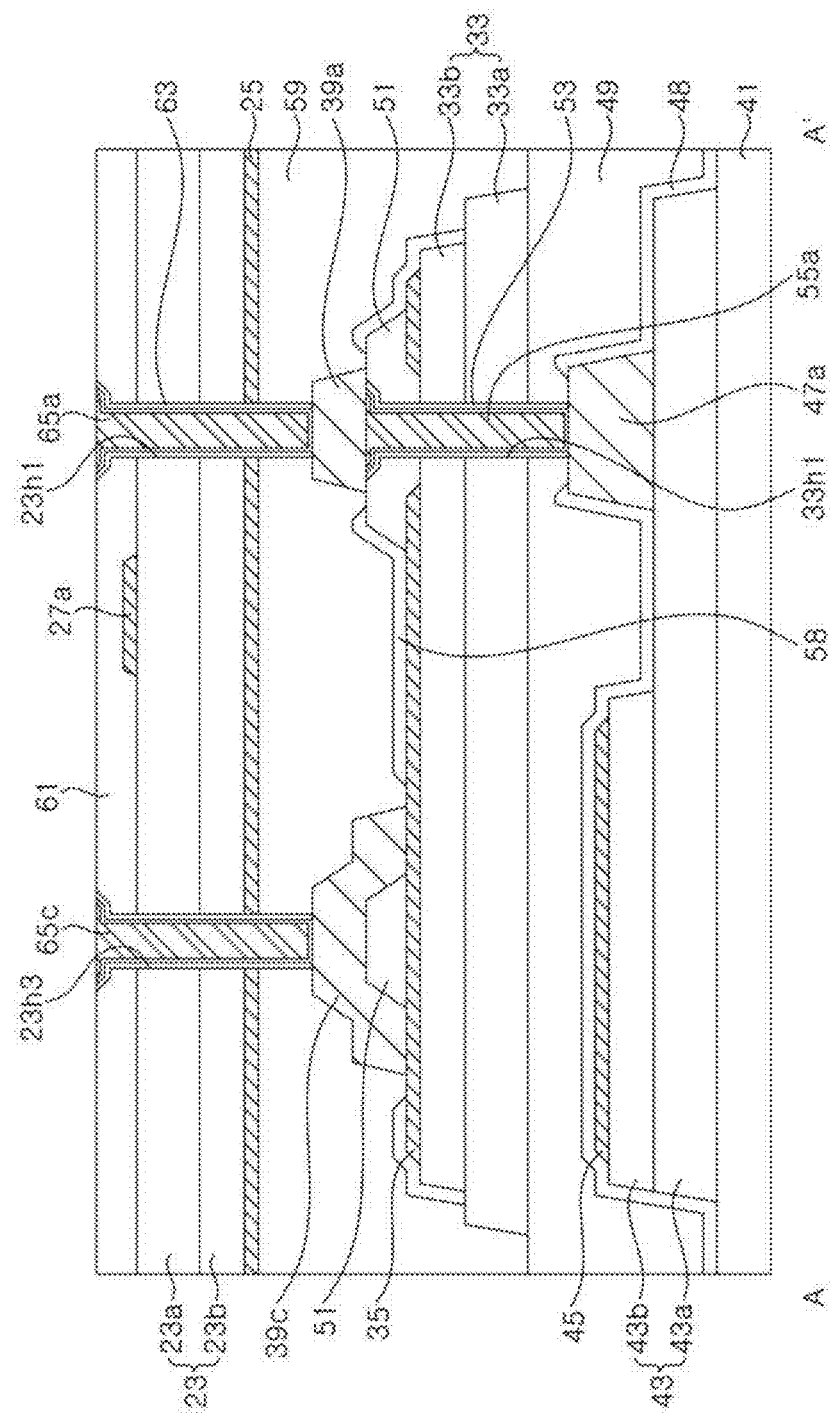
Figure 14C:
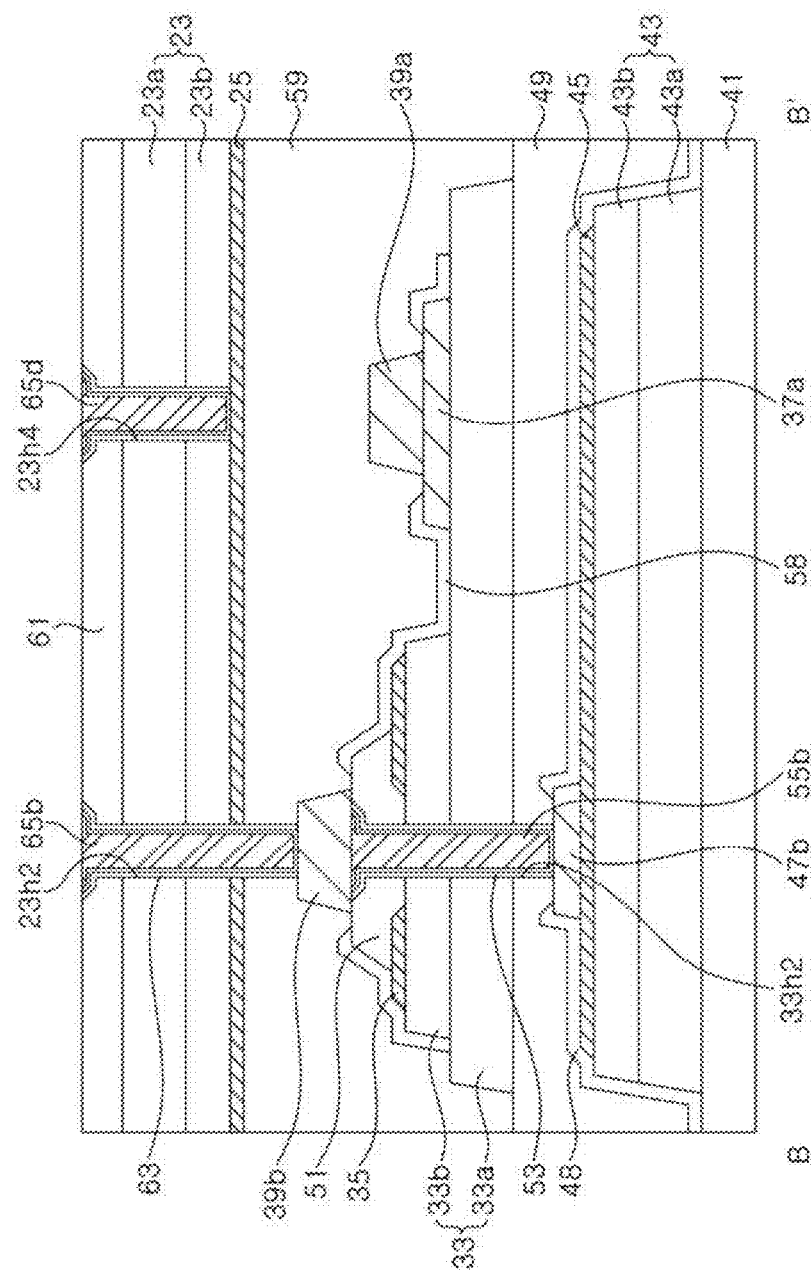

Referring to FIGS. 14A, 14B, and 14C, a second planarization layer 61 covering the first LED stack 23 and the first n-electrode pad 27a is formed. The second planarization layer 61 is formed to have a substantially flat upper surface.

Subsequently, through holes 23h1, 23h2, 23h3, and 23h4 passing through the second planarization layer 61 and the first LED stack 23 are formed. The through holes 23h1, 23h2, and 23h3 may pass through the first transparent electrode 25 and the second bonding layer 59 to expose the lower connectors 39a, 39b, and 39c, respectively. The through hole 23h4 may expose the first transparent electrode 25.

The through holes 23h1, 23h2, and 23h3 may be formed together through the same process, and the through hole 23h4 may be formed through a process different from that of forming the through holes 23h1, 23h2, and 23h3.

Subsequently, a second sidewall insulation layer 63 and upper buried vias 65a, 65b, 65c, and 65d are formed. Since a process of forming the second sidewall insulation layer 63 and the upper buried vias 65a, 65b, 65c, and 65d is substantially similar to that of forming the first sidewall insulation layer 53 and the lower buried vias 55a and 55b, repeated descriptions thereof will be omitted.

Figure 15A:
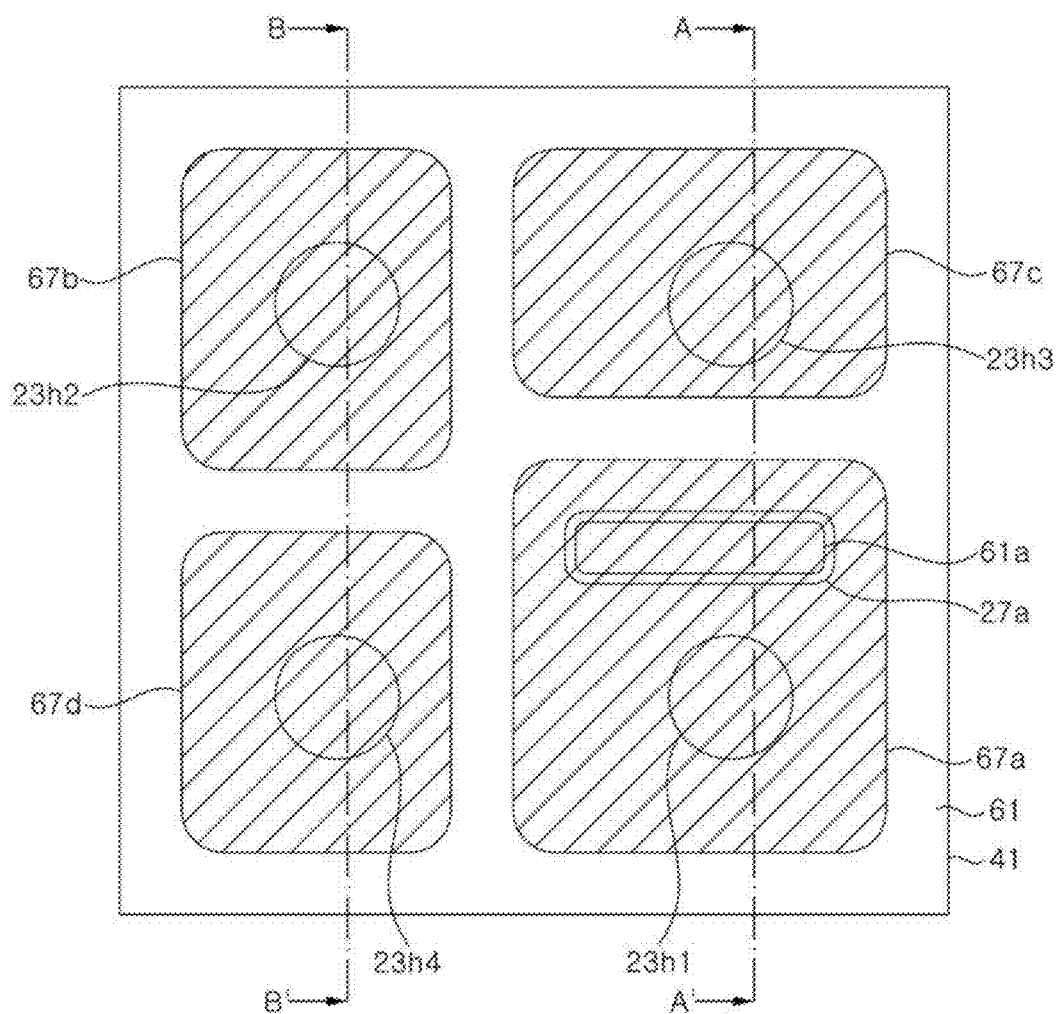
Figure 15B:
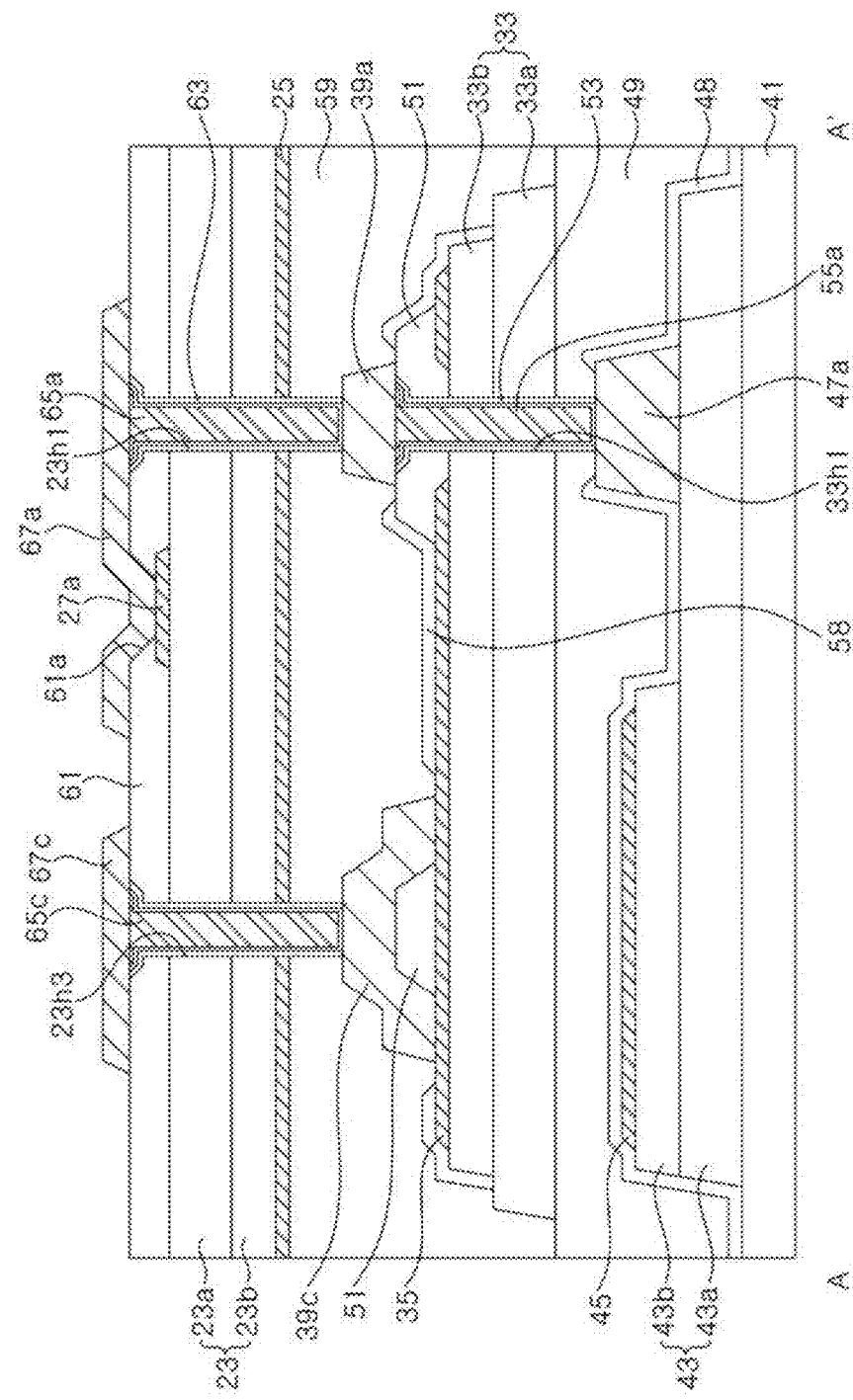
Figure 15C:
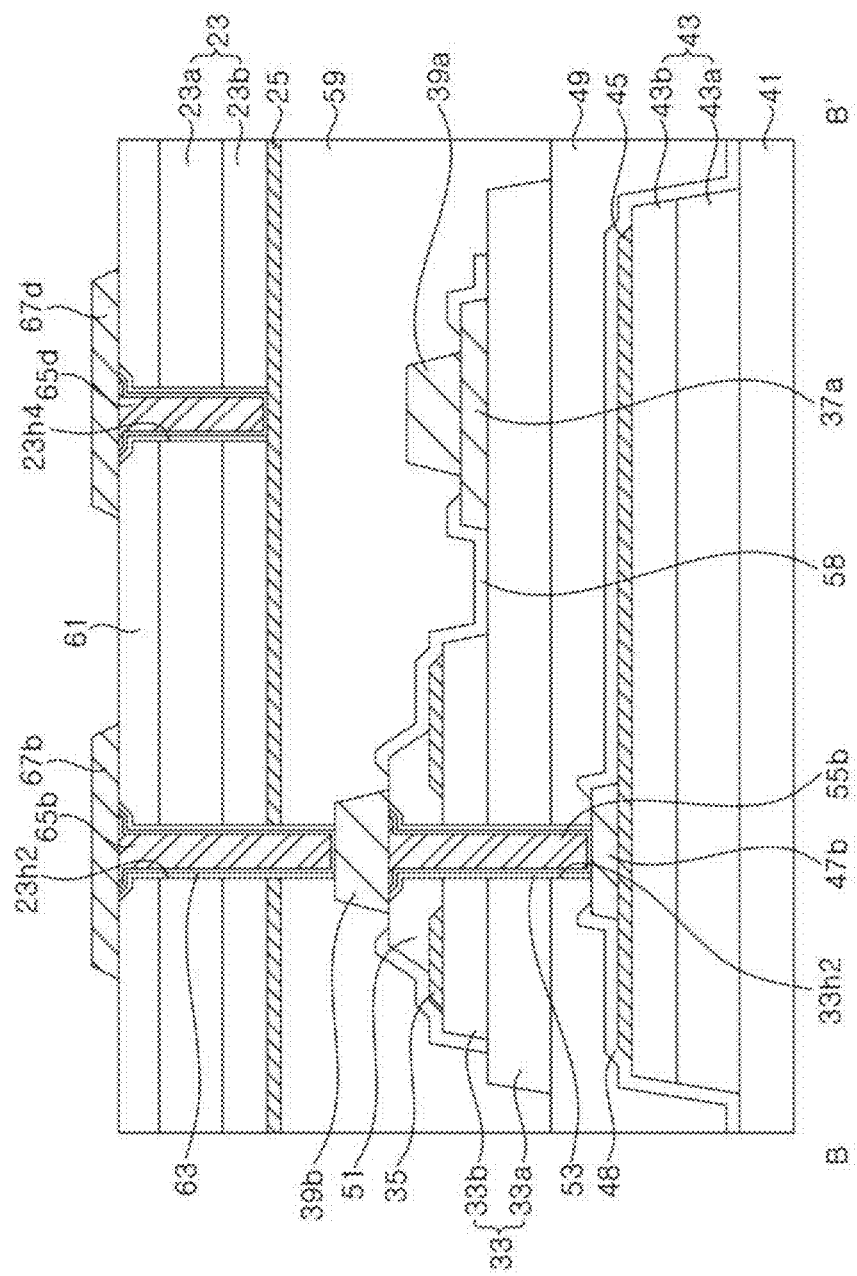

Referring to FIGS. 15A, 15B, and 15C, an opening 61a exposing the first n-electrode pad 27a is formed by patterning the second planarization layer 61. The second planarization layer 61 may be patterned using photo and etching techniques.

Subsequently, upper connectors 67a, 67b, 67c, and 67d are formed. The upper connectors 67a, 67b, 67c, and 67d may include a reflective metal layer, and thus, light generated in the first LED stack 23 may be reflected to improve light extraction efficiency. For example, the upper connectors 67a, 67b, 67c, and 67d may include Au or an Au alloy.

The upper connector 67a may electrically connect the upper buried via 65a to the first n-electrode pad 27a. The upper connectors 67b, 67c, and 67d may be connected to the upper buried vias 65b, 65c, and 65d, respectively.

Figure 16A:
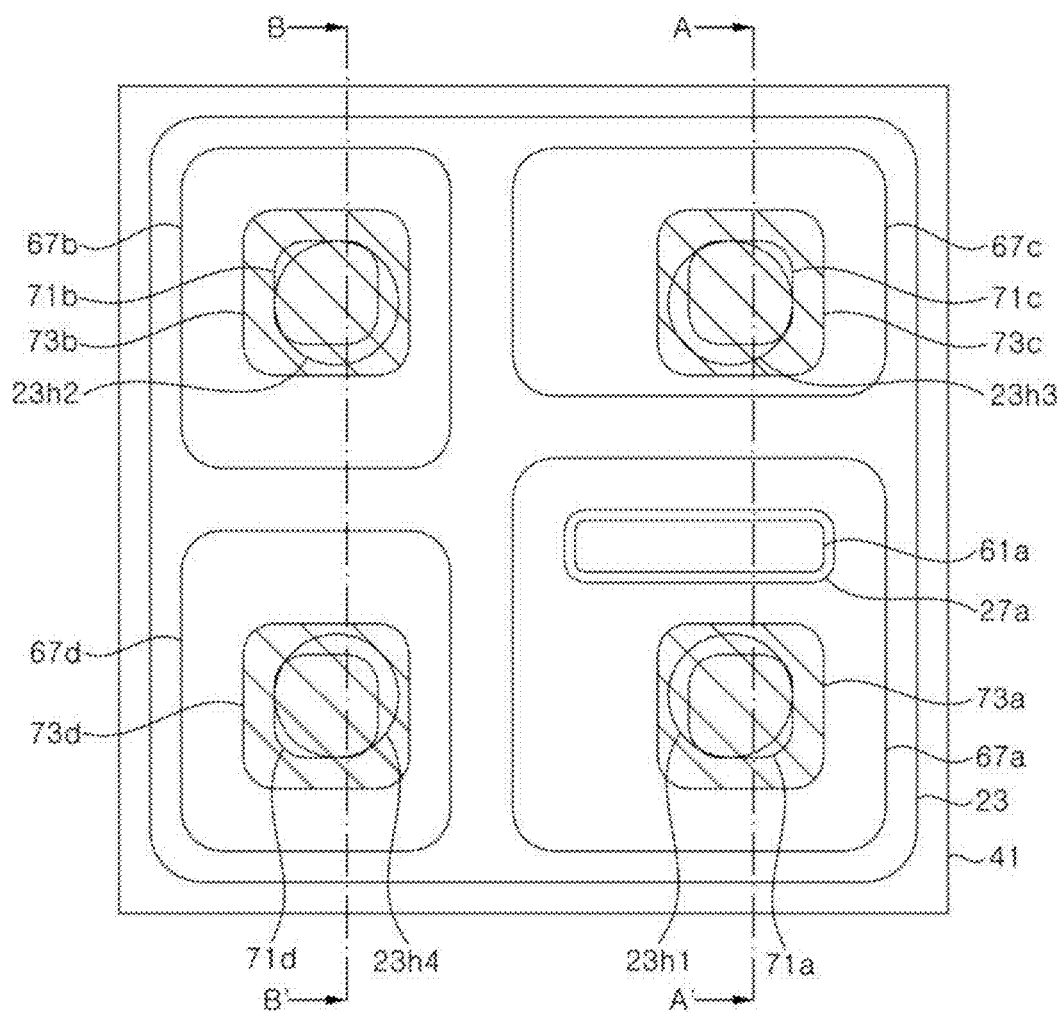
Figure 16B:
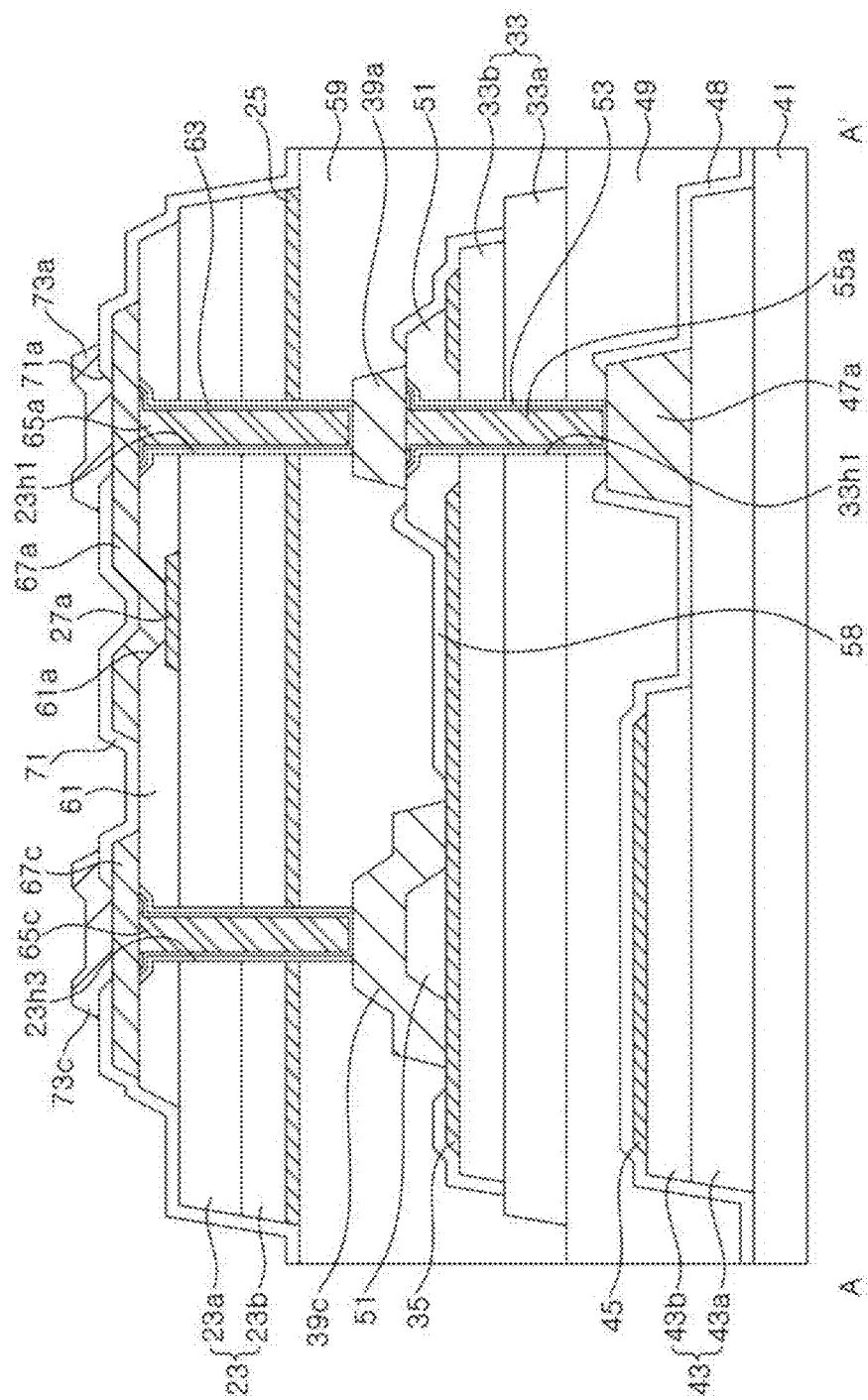
Figure 16C:
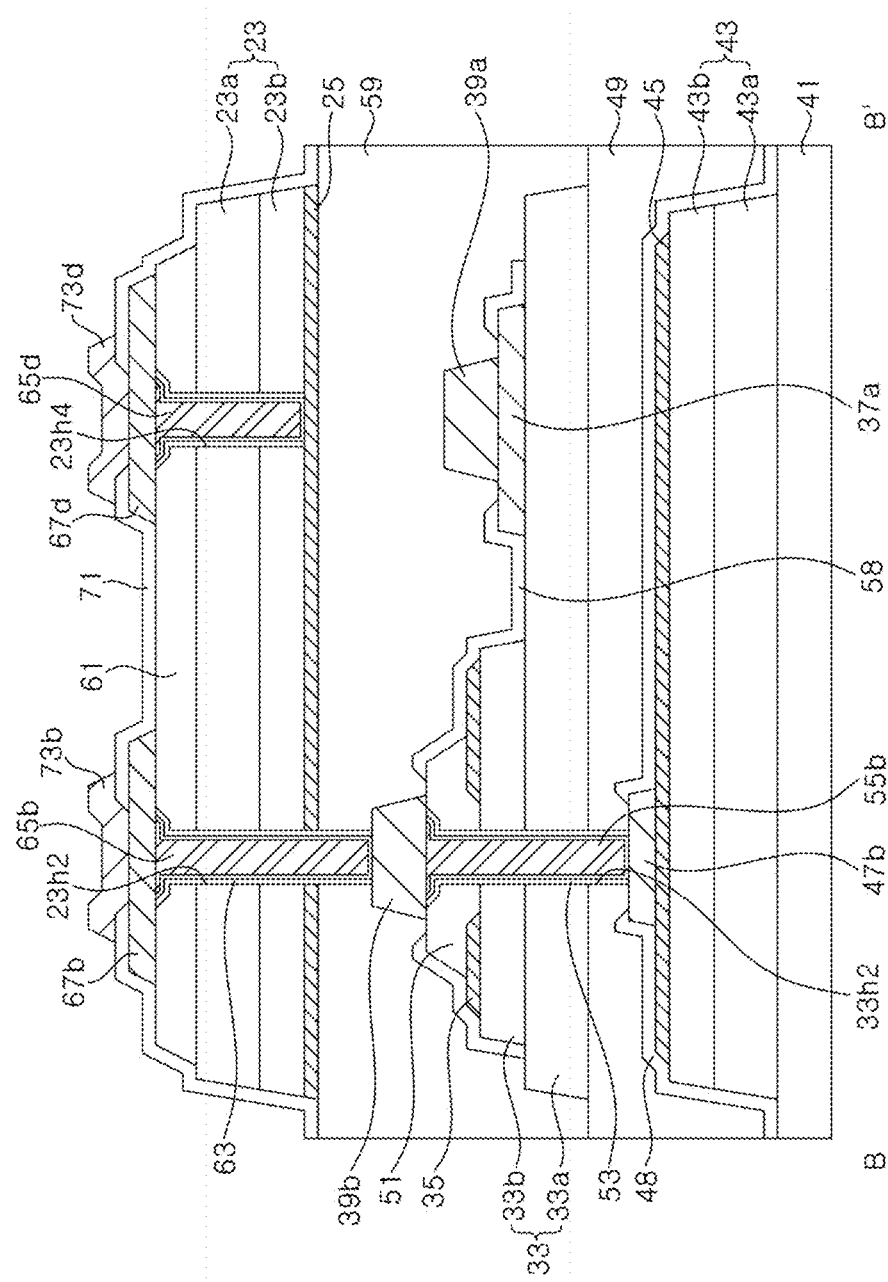

Referring to FIGS. 16A, 16B, and 16C, the second planarization layer 61, the first LED stack 23, and the first transparent electrode 25 may be etched along the isolation region. For example, the second planarization layer 61 may be patterned in advance, and then, the first LED stack 23 and the first transparent electrode 25 may be patterned to divide the light emitting device regions. The second planarization layer 61 may be patterned in advance along the isolation region when forming the opening 61a. As such, an upper surface of the second bonding layer 59 may be exposed.

Thereafter, an upper insulation layer 71 is formed. The upper insulation layer 71 may cover the first transparent electrode 25, the first LED stack 23, the second planarization layer 61, and further, cover the upper connectors 67a, 67b, 67c, and 67d. Moreover, the upper insulation layer 71 may be patterned to have openings 71a exposing the upper connectors 67a, 67b, 67c, and 67d.

Subsequently, bump pads 73a, 73b, 73c, and 73d covering the openings 71a may be formed. The first bump pad 73a is disposed on the first upper connector 67a, the second bump pad 73b is disposed on the second upper connector 67b, and the third bump pad 73c is disposed on the third upper connector 67c. The fourth bump pad 73d is disposed on the fourth upper connector 67d.

Thereafter, a plurality of light emitting devices 100 separated from one another is formed on the substrate 41 by removing the first and second bonding layers 49 and 59 along the isolation region, and the light emitting device 100 separated from the substrate 41 is provided by bonding the light emitting device 100 onto a circuit board 101 and separating the substrate 41. A schematic cross-sectional view of the light emitting device 100 bonded to the circuit board 101 is exemplarily shown in FIG. 28, which will be described in detail later.

The light emitting device 100 according to an exemplary embodiment achieve electrical connection using buried vias 55a, 55b, 65a, 65b, 65c, and 65d. Hereinafter, a process of forming the buried vias will be described in more detail.

FIGS. 17A, 17B, 17C, and 17D are schematic cross-sectional views illustrating a process of forming a buried via according to exemplary embodiments.

Figure 17A:
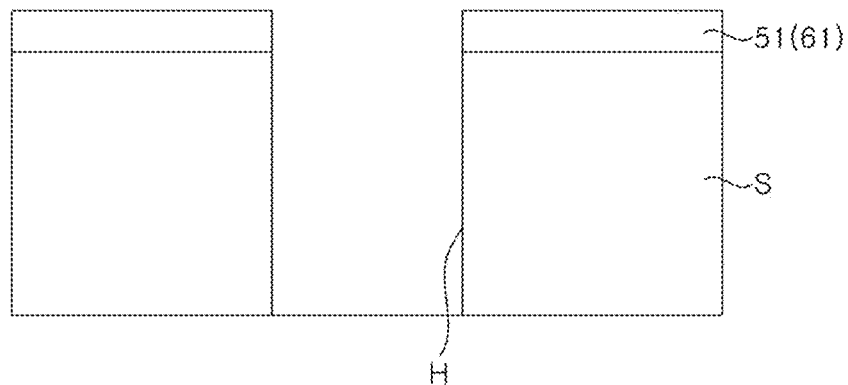
FIGS. 17A, 17B, 17C, and 17D are schematic cross-sectional views illustrating a process of forming a buried via according to exemplary embodiments.

First, referring to FIG. 17A, a planarization layer 51 or 61 is formed on an underlying layer S. The underlying layer S may include a first LED stack 23 or a second LED stack 33. A hard mask defining an etching region is formed by patterning the planarization layer 51 or 61, and a through hole H may be formed using the hard mask as an etching mask. The through hole H may expose an element for electrical connection, for example, the third n-electrode pad 47a, the lower p-electrode pad 47b, or the lower connectors 39a, 39b, and 39c.

Figure 17B:
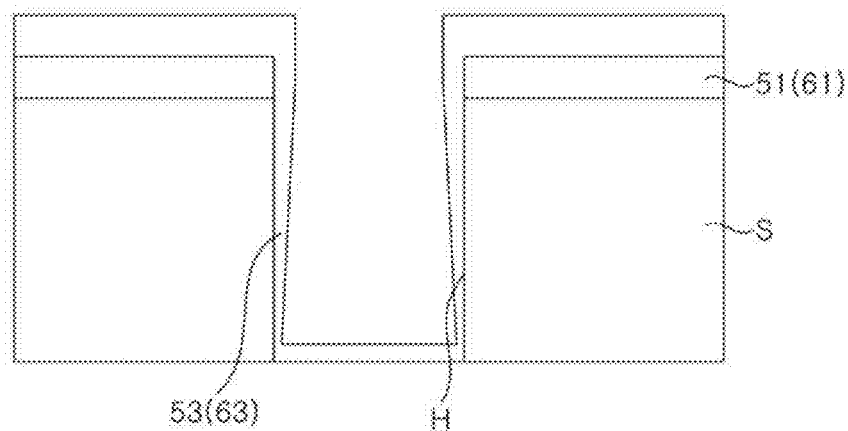

Referring to FIG. 17B, subsequently, a sidewall insulation layer 53 or 63 is formed. The sidewall insulation layer 53 or 63 may be formed on an upper surface of the planarization layer 51 or 61, and further, may be formed on a sidewall and a bottom of the through hole H. The sidewall insulation layer 53 or 63 may be formed thicker at an inlet than at the bottom of the through hole H due to characteristics of layer coverage.

Figure 17C:
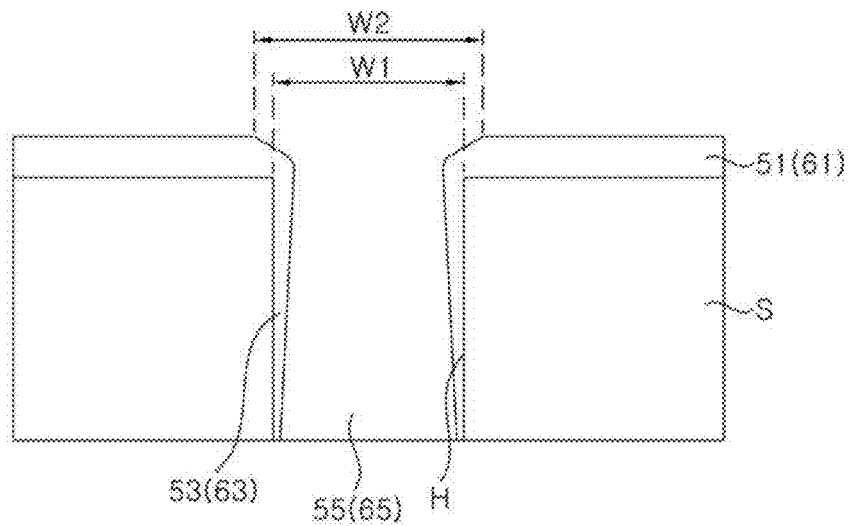

Referring to FIG. 17C, the sidewall insulation layer 53 or 63 is blanket etched using a dry etching technique. The sidewall insulation layer disposed on the bottom of the through hole H is removed by blanket etching, and the sidewall insulation layer disposed on the upper surface of the planarization layer 51 or 61 is also removed. Further, a portion of the planarization layer 51 or 61 near the inlet of the through hole H may also be removed. As such, a width W2 of the inlet may be greater than a width W1 of the through hole H. Since the width W2 of the inlet is increased, the subsequent process of forming a buried via using a plating technology may be facilitated.

Figure 17D:
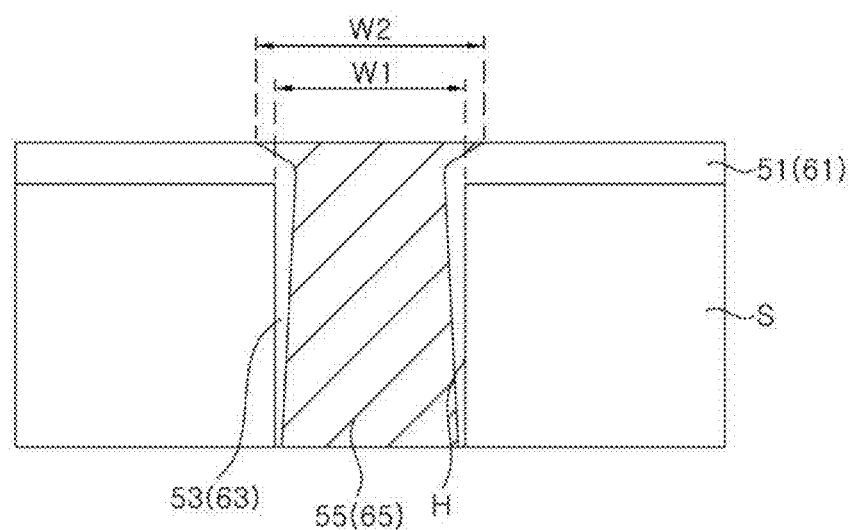

Referring to FIG. 17D, a seed layer may be formed in the planarization layer 51 or 61 and the through hole H, and a plating layer filling the through hole H may be formed using a plating technique. Subsequently, by removing the plating layer and the seed layer on the planarization layer 51 or 61 using a chemical etching technique, a buried via 55 or 65 as shown in FIG. 17D may be formed.

Figure 18:
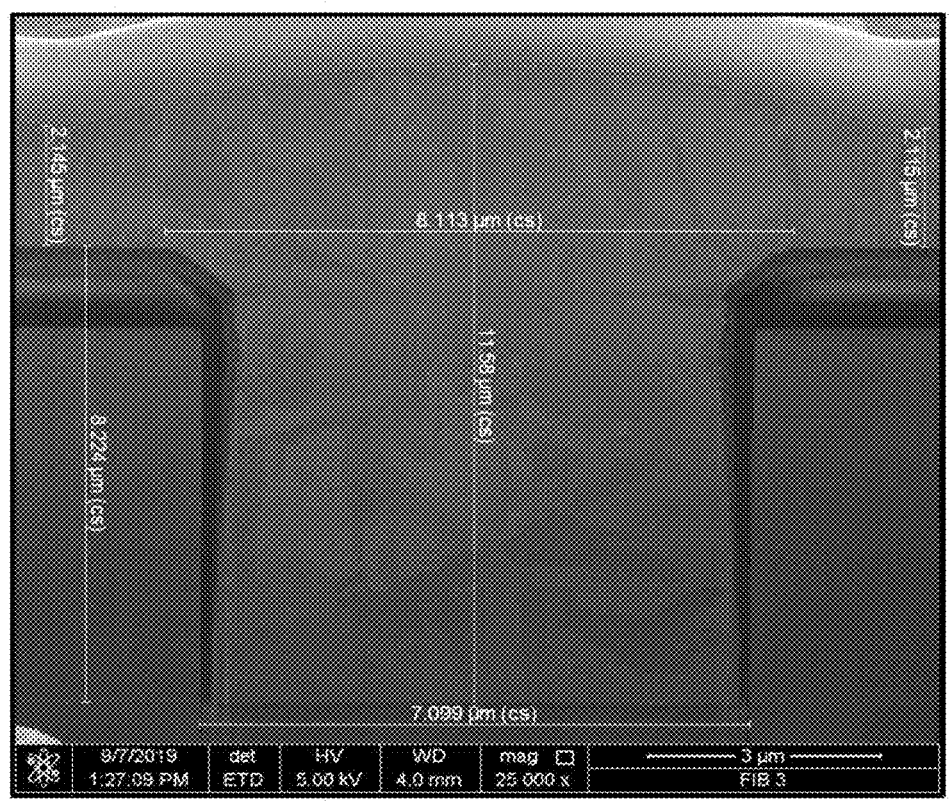
FIG. 18 is a SEM image illustrating a via buried in a contact hole.

FIG. 18 is a SEM image illustrating a via buried in a contact hole. FIG. 18 shows an image, after the through hole H was formed and then the buried via was formed as described with reference to FIGS. 17A to 17D, but before the plating layer on the upper surface of the planarization layer is removed using a chemical mechanical polishing technique.

Referring to FIG. 18, it can be seen that the through hole is well buried by the plating layer. Further, it can be seen that the width W2 of the inlet of the through hole is wider than the width W1 of the through hole, and it can also be seen that a thickness of the sidewall insulation layer becomes thinner as being closer to the bottom of the through hole.

Figure 19:
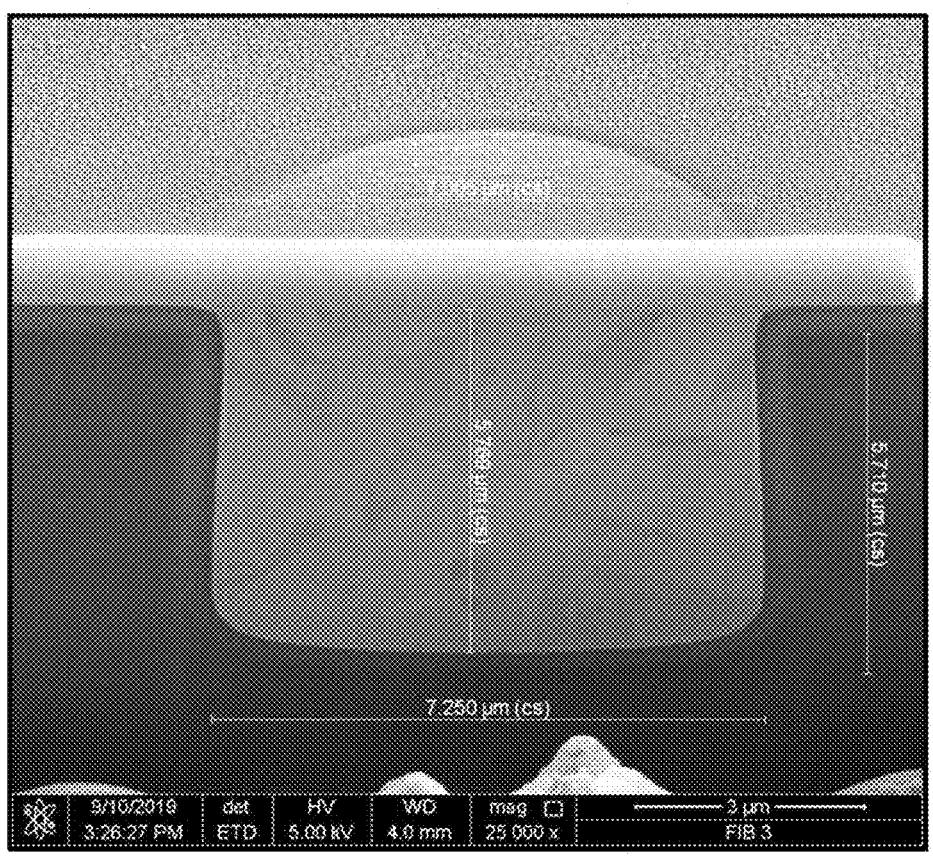
FIG. 19 is a SEM image illustrating a buried via.

FIG. 19 is a SEM image illustrating a buried via formed using a chemical mechanical polishing technique. FIG. 19 shows a shape of the buried via after removing the seed layer and the plating layer using the chemical mechanical polishing technique, after forming a hole in a silicon substrate, depositing the sidewall insulation layer, and forming the seed layer and the plating layer. In this case, the buried via was formed without blanket etching the sidewall insulation layer.

Referring to FIG. 19, it can be seen that an upper surface of the buried via is flush with an upper surface of the sidewall insulation layer surrounding the buried via, and thus, the buried via may be formed in the through hole using the chemical mechanical polishing technique.

Figure 20:
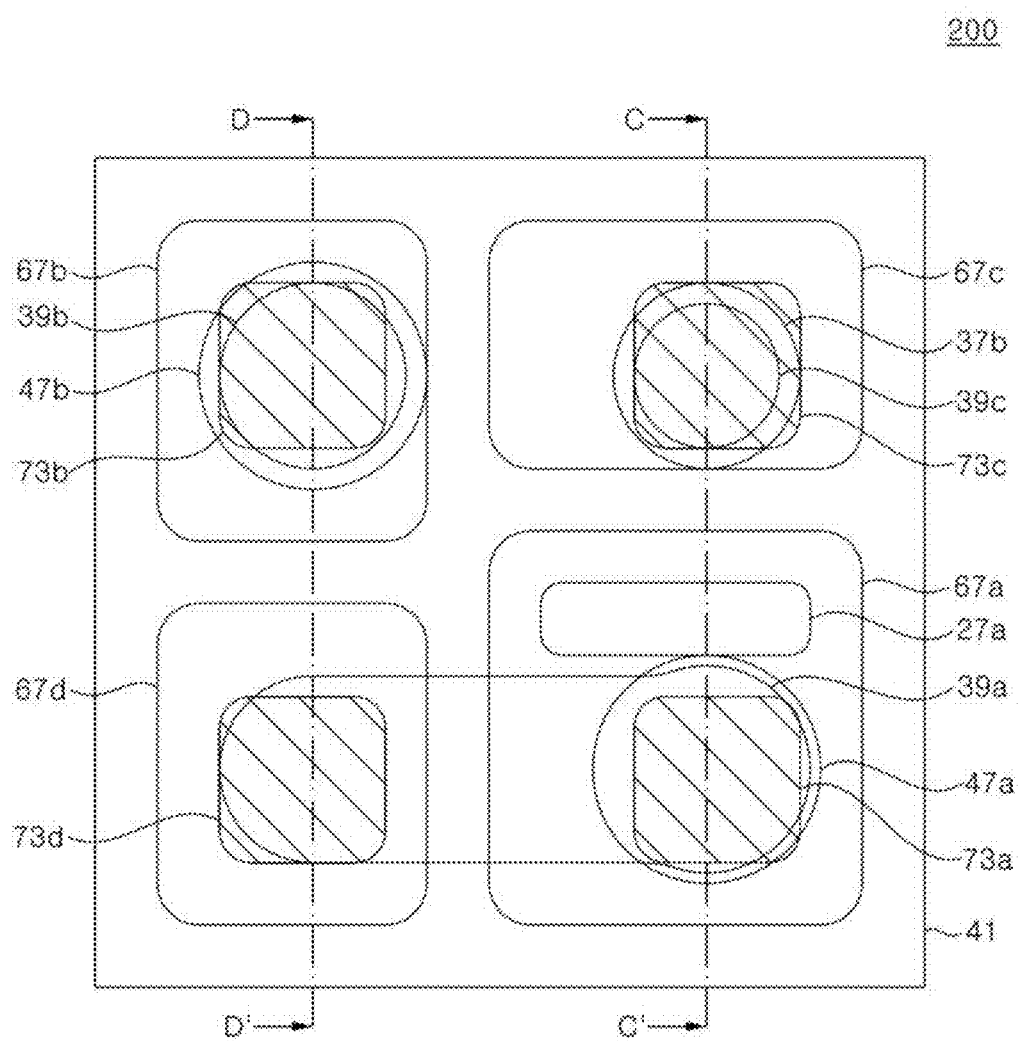
FIG. 20 is a schematic plan view of a light emitting device according to another exemplary embodiment.
Figure 21A:
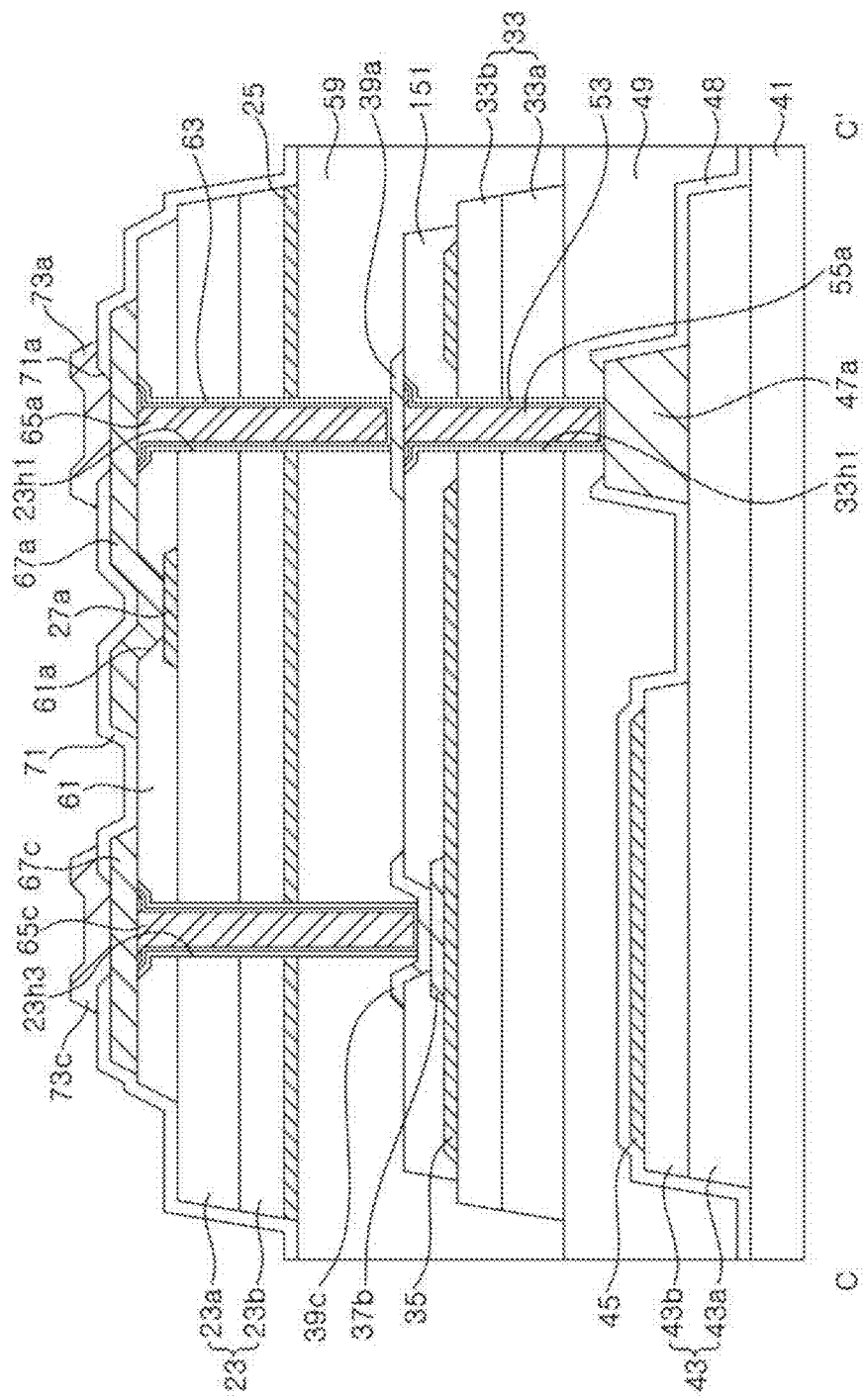
FIGS. 21A and 21B are schematic cross-sectional views taken along lines C-C' and D-D' of FIG. 20, respectively.
Figure 21B:
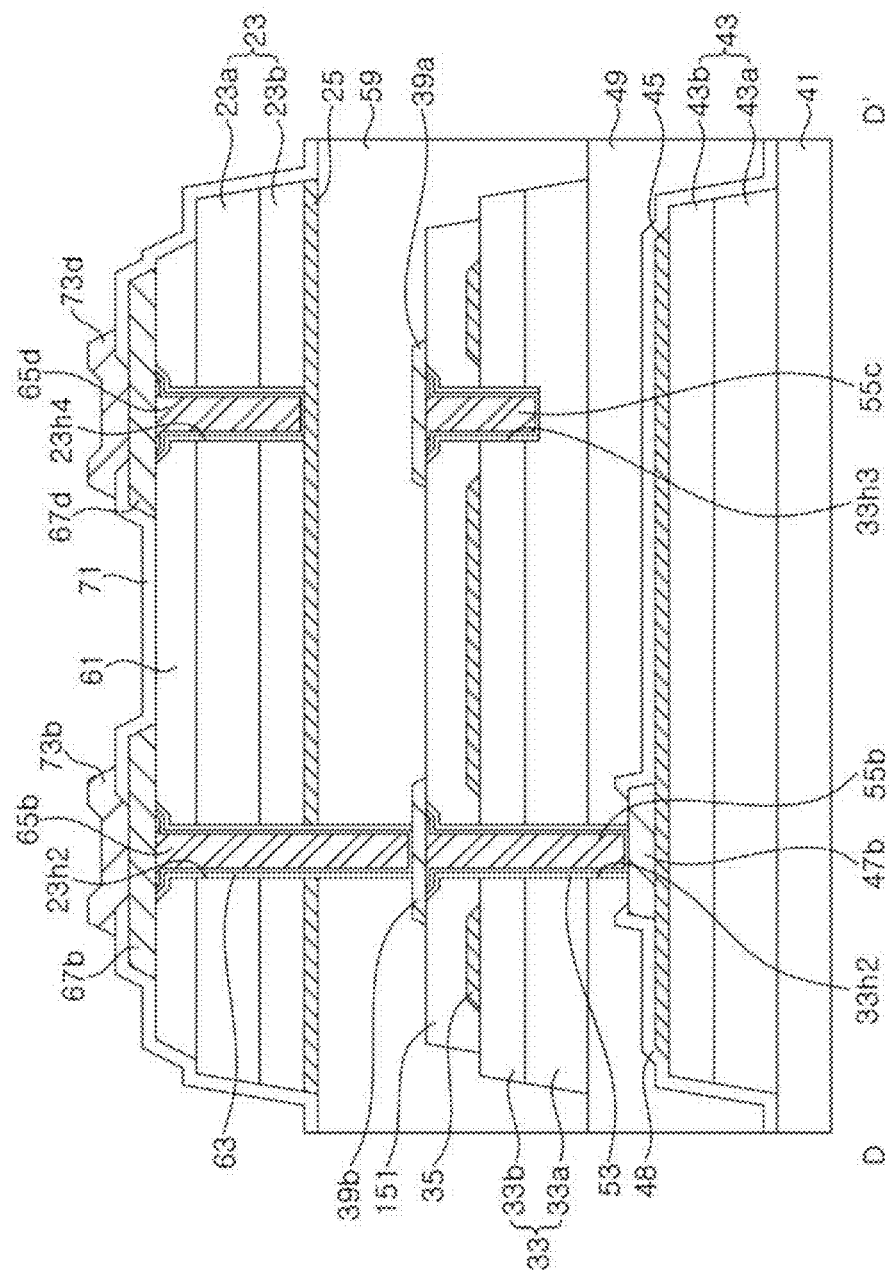

FIG. 20 is a schematic plan view illustrating a light emitting device 200 according to another exemplary embodiment, and FIGS. 21A and 21B are schematic cross-sectional views taken along lines C-C' and D-D' of FIG. 20, respectively.

Referring to FIGS. 20, 21A, and 21B, the light emitting device 200 according to the illustrated exemplary embodiment is substantially similar to the light emitting device 100 described above, except that a first planarization layer 151 is formed continuously, unlike the first planarization layer 51 of the light emitting device 100 that is divided in to multiple regions to have an island shape. As such, the second LED stack 33 does not have a mesa etching region exposing the first conductivity type semiconductor layer 33a, and the second n-electrode pad 37a shown in FIG. 4B that is in ohmic contact with the first conductivity type semiconductor layer 33a is omitted.

A through hole 33h3 exposing the first conductivity type semiconductor layer 33a is formed passing through the first planarization layer 151 and the second conductivity type semiconductor layer 33b, and the lower buried via 55c fills the through hole 33h3. The lower connector 39a commonly electrically connects the first conductivity type semiconductor layers 33a and 43a by electrically connecting the lower buried via 55a and the lower buried via 55c.

The second transparent electrode 35 may be patterned in advance so as not to be exposed to the sidewalls of the through holes 33h1, 33h2, and 33h3 while covering the upper surface of the second conductivity type semiconductor layer 33b. For example, the second transparent electrode 35 may be patterned to have openings in regions where the through holes 33h1, 33h2, and 33h3 are to be formed before forming the first planarization layer 151.

In the illustrated exemplary embodiment, the upper p-electrode pad 37b may be disposed on the second transparent electrode 35, and the lower connector 39c may be electrically connected to the upper p-electrode pad 37b. The first planarization layer 151 may have an opening exposing the upper p-electrode pad 37b to allow electrical connection of the lower connector 39c.

In the illustrated exemplary embodiment, the intermediate insulation layer 58 is omitted, but the inventive concepts are not limited thereto. For example, in some exemplary embodiments, an intermediate insulation layer covering the second LED stack 33, the first planarization layer 151, and the lower connectors 39a, 39b, and 39c may be added. The intermediate insulation layer may have openings exposing the lower connectors 39a, 39b, and 39c to allow electrical connection of the upper buried vias 65a, 65b, and 65c.

According to the illustrated exemplary embodiment, the lower connector 39a may be formed on a flat surface of the first planarization layer 151 by continuously forming the first planarization layer 151 and forming the lower buried via 55c.

FIGS. 22A, 22B, 22C, 23A, 23B, 23C, 24A, 24B, 24C, 25A, 25B, 25C, 26A, 26B, 26C, 27A, 27B, and 27C are schematic plan views and cross-sectional views illustrating a method of manufacturing a light emitting device for a display according to another exemplary embodiment. Lines C-C' and D-D' along which the cross-sectional views are taken correspond to lines C-C' and D-D' of FIG. 20.

First, as described above with reference to FIGS. 5A, 5B, and 5C, a first LED stack 23, a second LED stack 33, and a third LED stack 43 are grown on substrates 21, 31 and 41, respectively, and transparent electrodes 25, 35 and 45 are formed.

Figure 22A:
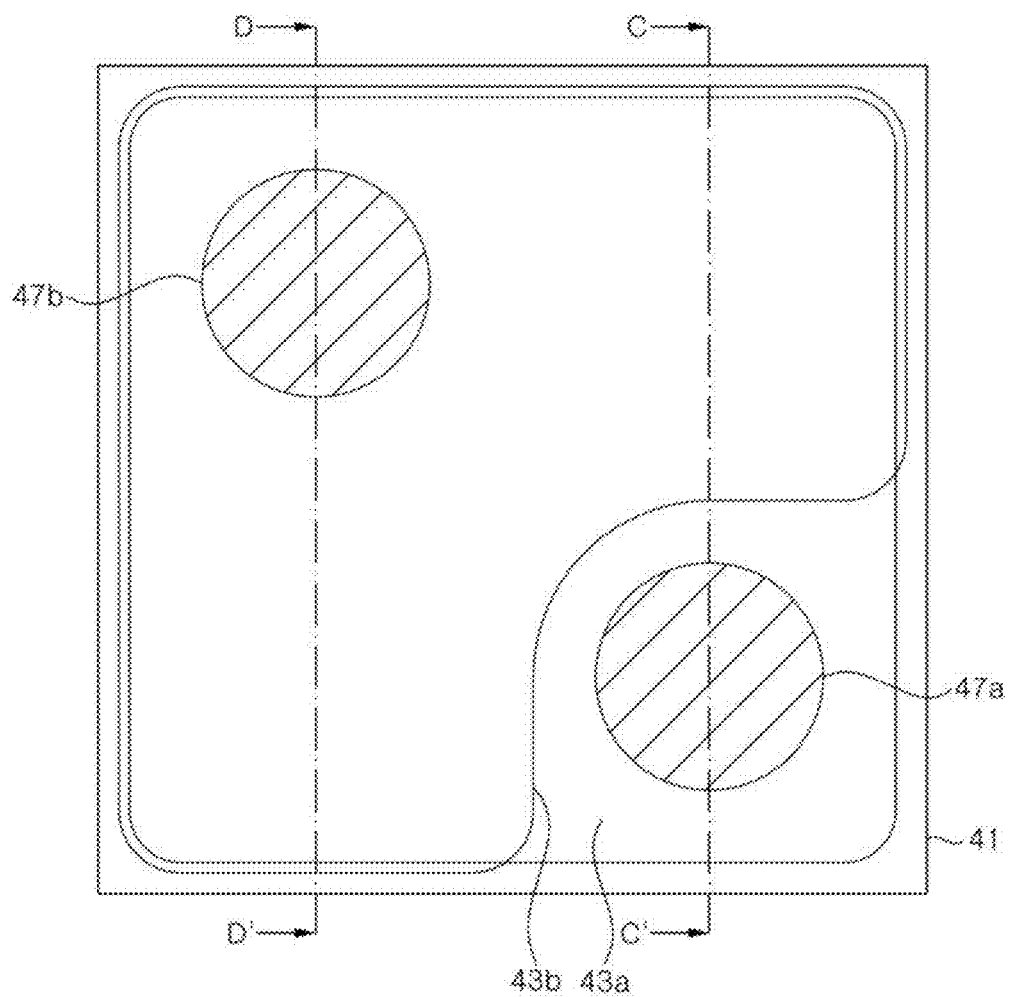
FIGS. 22A, 22B, 22C, 23A, 23B, 23C, 24A, 24B, 24C, 25A, 25B, 25C, 26A, 26B, 26C, 27A, 27B, and 27C are schematic plan views and cross-sectional views illustrating a method of manufacturing a light emitting device for a display according to another exemplary embodiment.
Figure 22B:
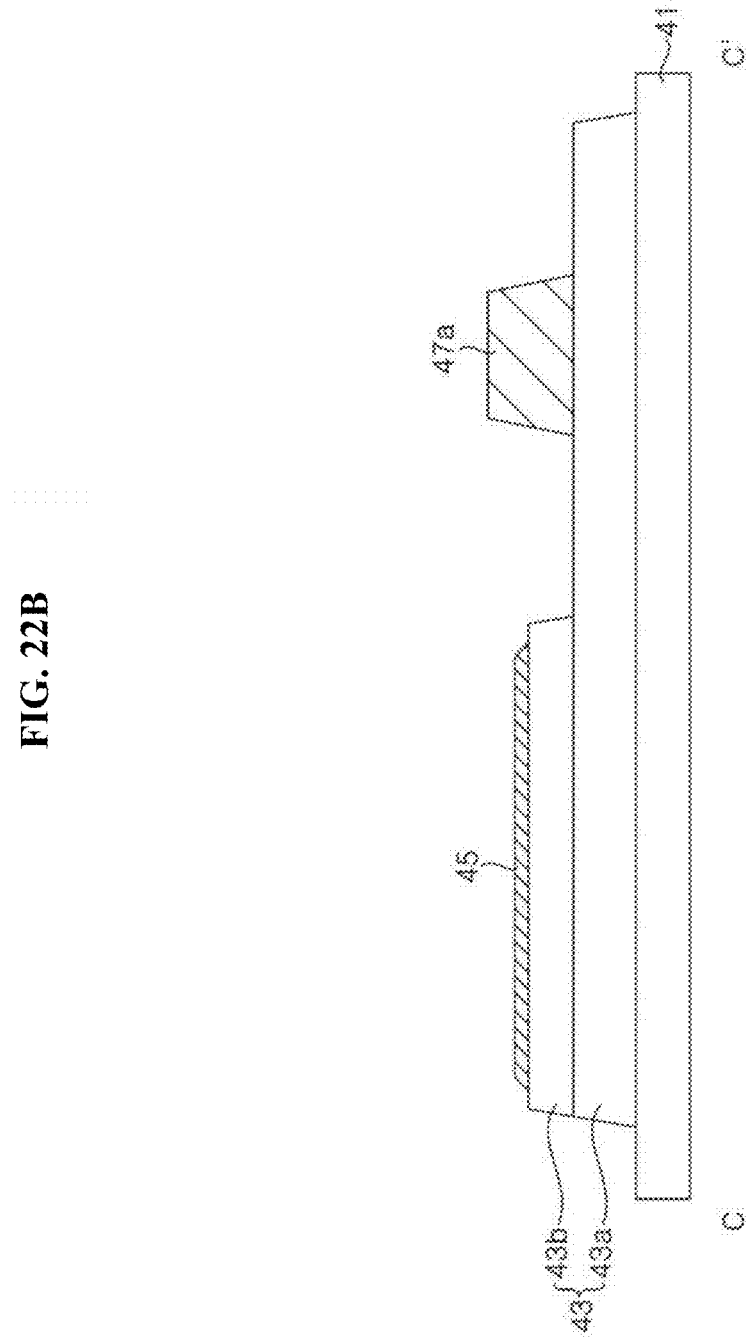
Figure 22C:
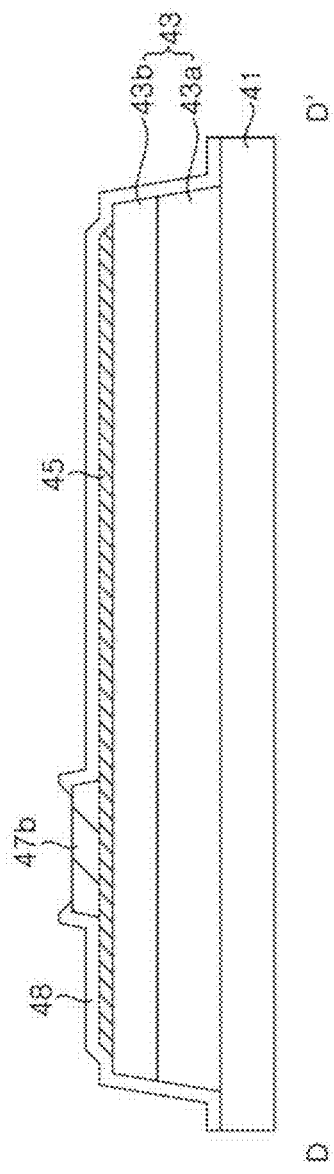

Subsequently, referring to FIGS. 22A, 22B, and 22C, as described above with reference to FIGS. 6A, 6B, and 6C, a first conductivity type semiconductor layer 43a is exposed through a mesa etching process, and a third n-electrode pad 47a and a lower p-electrode pad 47b are formed on the first conductivity type semiconductor layer 43a and a third transparent electrode 45, respectively. In addition, an isolation region for defining a light emitting device region may be formed, and a lower insulation layer 48 may be formed.

Figure 23A:
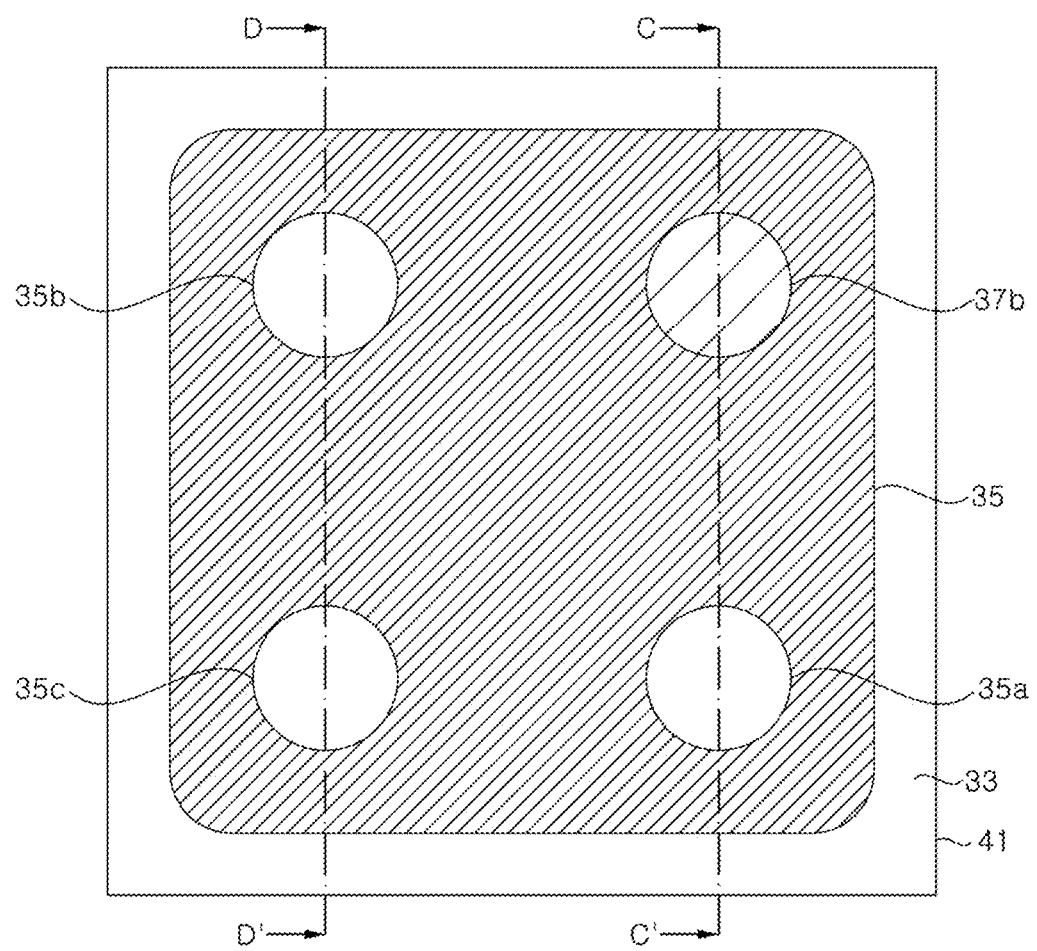
Figure 23B:
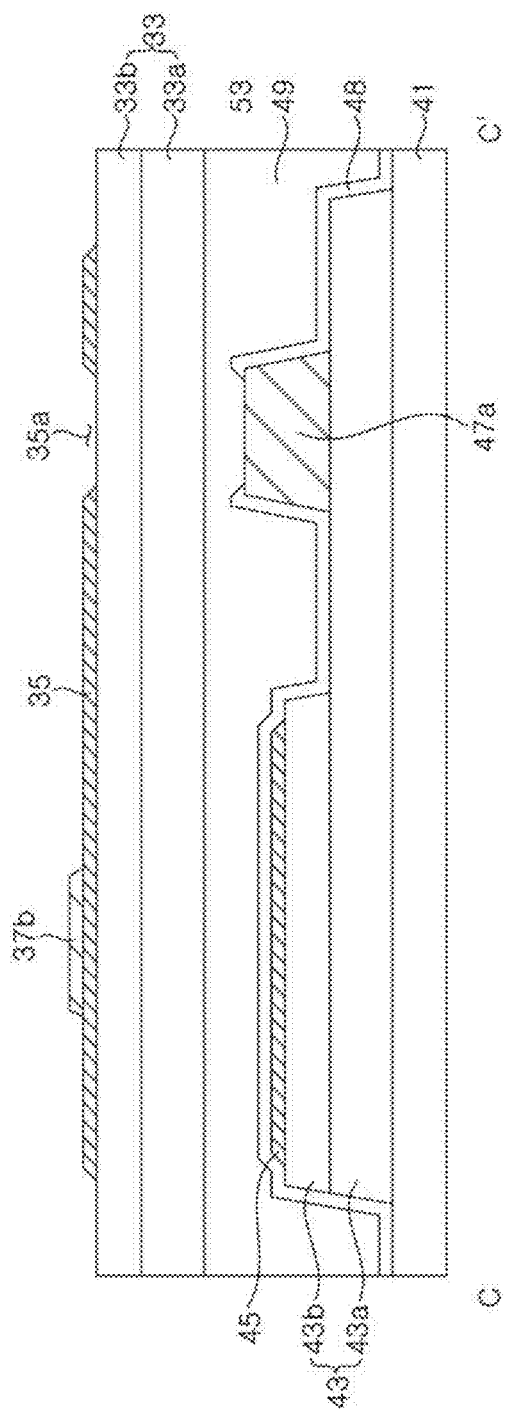
Figure 23C:
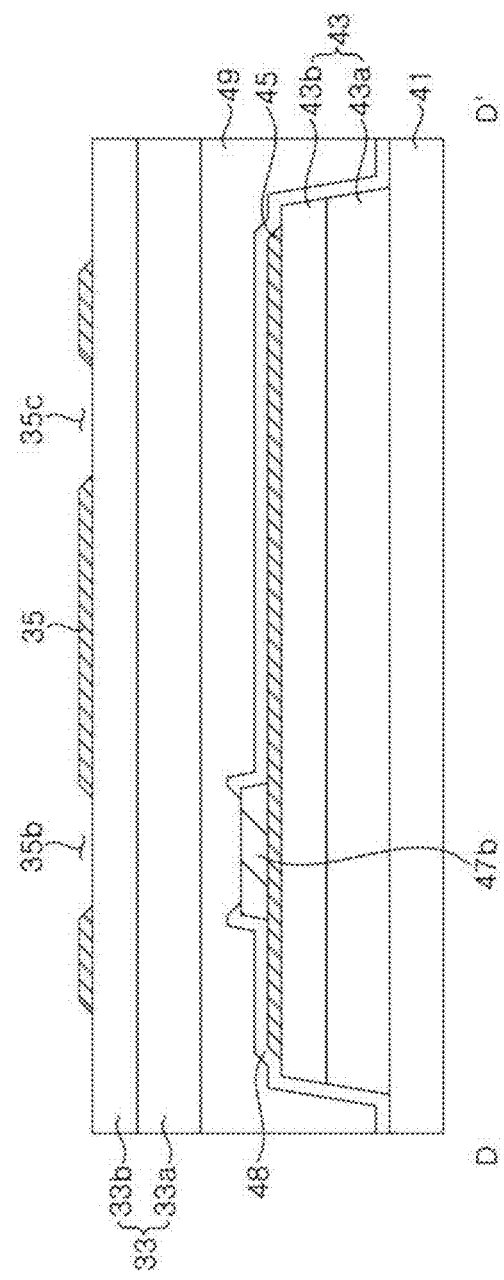

Referring to FIGS. 23A, 23B, and 23C, as described above with reference to FIGS. 6A, 6B, and 6C, first, the second LED stack 33 described with reference to FIG. 5B is bonded on the third LED stack 43.

Subsequently, openings 35a, 35b, and 35c exposing the second conductivity type semiconductor layer 33b may be formed by patterning a second transparent electrode 35. The opening 35a is disposed over the third n-electrode pad 47a, and the opening 35b is disposed over the lower p-electrode pad 47b. In the illustrated exemplary embodiment, a mesa etching process for exposing the first conductivity type semiconductor layer 33a is omitted. However, an opening 35c is added in the upper region where the second n-electrode pad 37a is formed in FIG. 10C. In addition, the second transparent electrode 35 may be removed in advance along the isolation region and may be separated in units of the light emitting device 200 region.

Further, an upper p-electrode pad 37b is formed on the second transparent electrode 35. The upper p-electrode pad 37b may be in ohmic contact with the second transparent electrode 35. In another exemplary embodiment, the upper p-electrode pad 37b may be omitted.

Figure 24A:
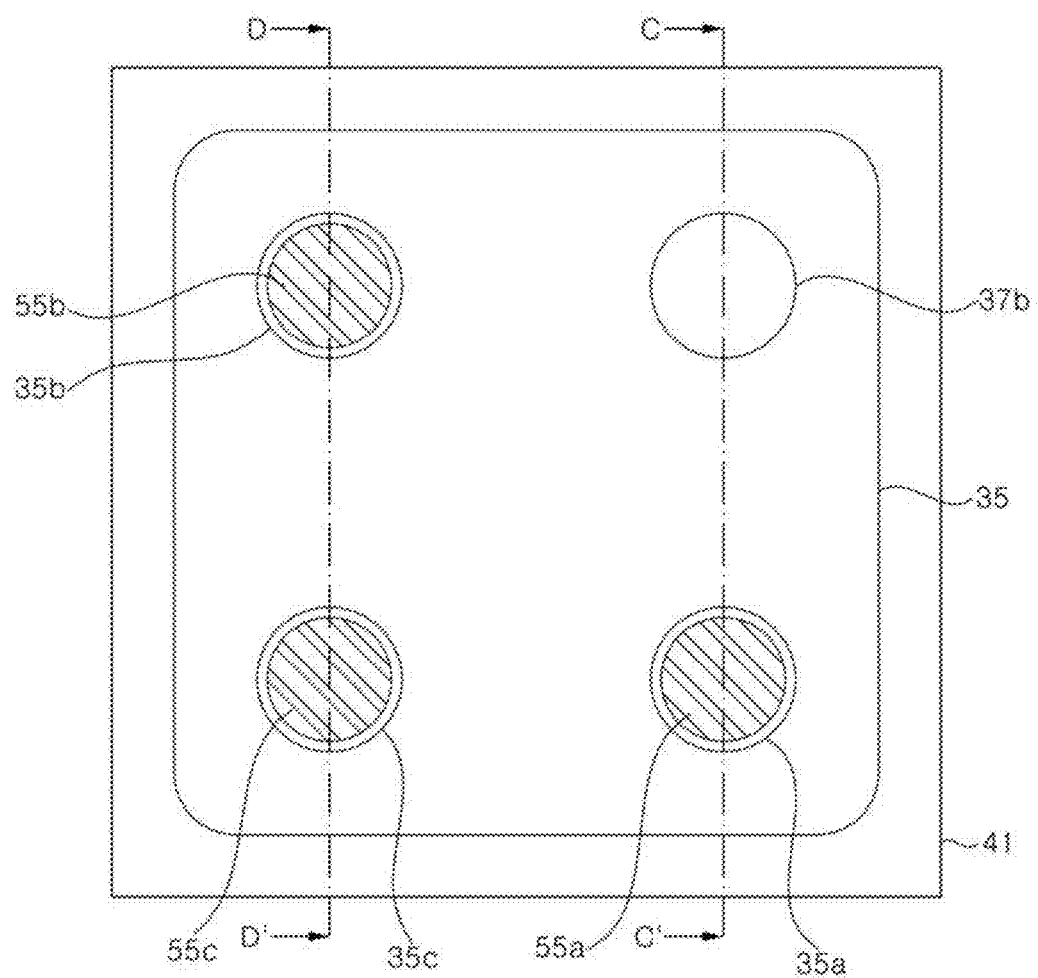
Figure 24B:
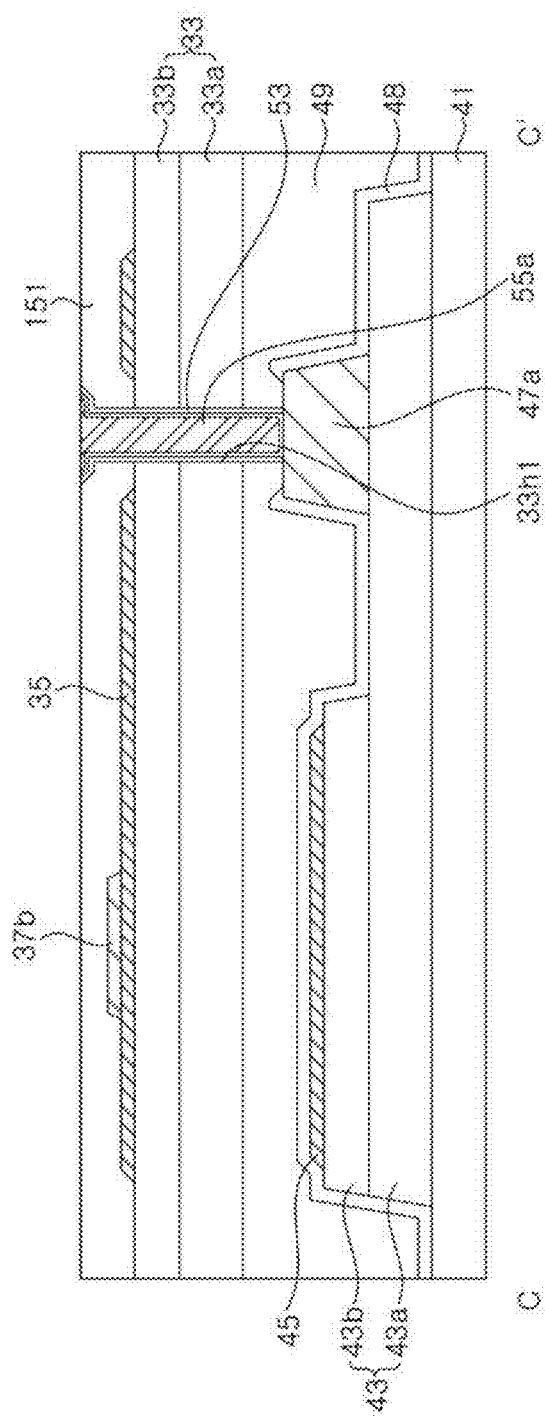
Figure 24C:
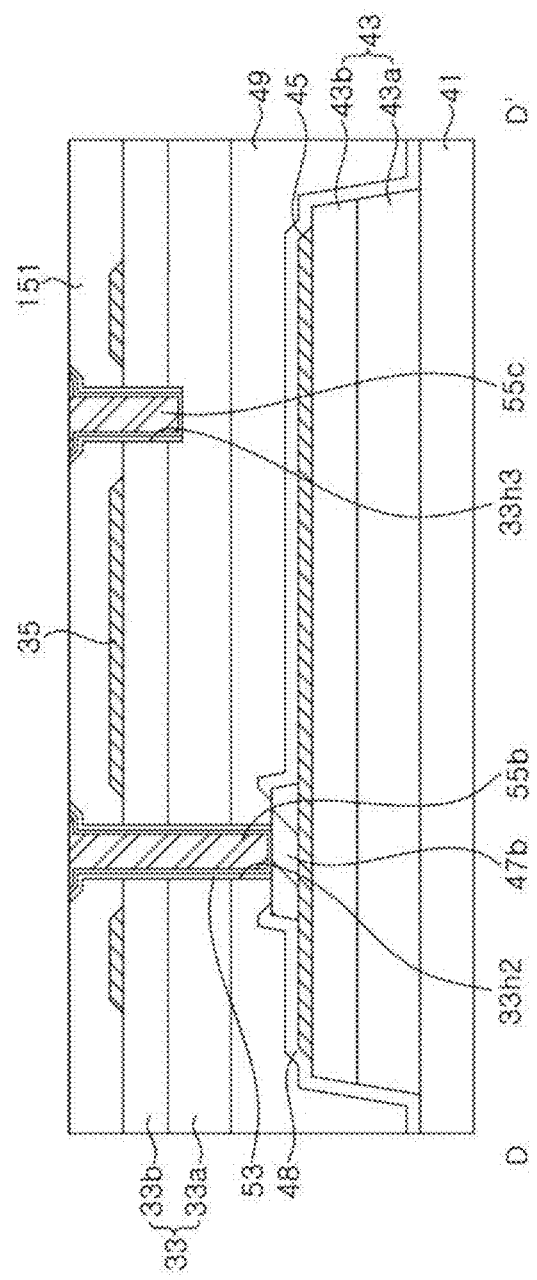

Referring to FIGS. 24A, 24B, and 24C, a first planarization layer 151 covering the second transparent electrode 35 is formed. The first planarization layer 151 covers an upper p-electrode pad 27b and covers the openings 35a, 35b, and 35c.

Subsequently, through holes 33h1 and 33h2 passing through the first planarization layer 151, the second LED stack 33, and the first bonding layer 49, and a through hole 33h3 passing through the first planarization layer 151 and the second conductivity type semiconductor layer 33b to expose the first conductivity type semiconductor layer 33a are formed. The through holes 33h1 and 33h2 are respectively formed within the circumference of the openings 35a and 35b of the second transparent electrode 35 in a plan view, and the through hole 33h3 is formed withing the circumference of the opening 35c of the second transparent electrode 35 in a plan view.

Thereafter, a first sidewall insulation layer 53 and lower buried vias 55a, 55b, and 55c may be formed. The lower buried vias 55a and 55b are substantially the same as those described with reference to FIGS. 8A, 8B, and 8C, and thus, repeated descriptions thereof will be omitted. Meanwhile, the lower buried via 55c is electrically connected to the first conductivity type semiconductor layer 33a.

Figure 25A:
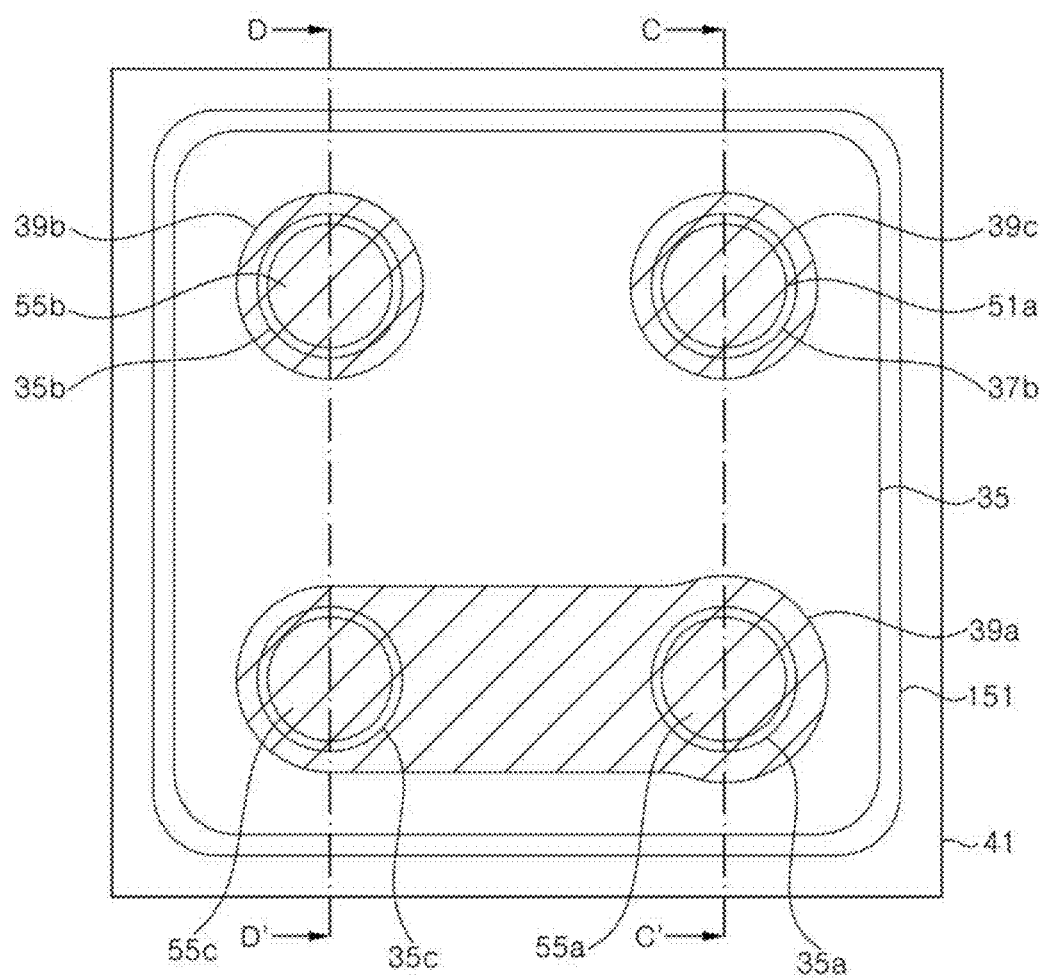
Figure 25B:
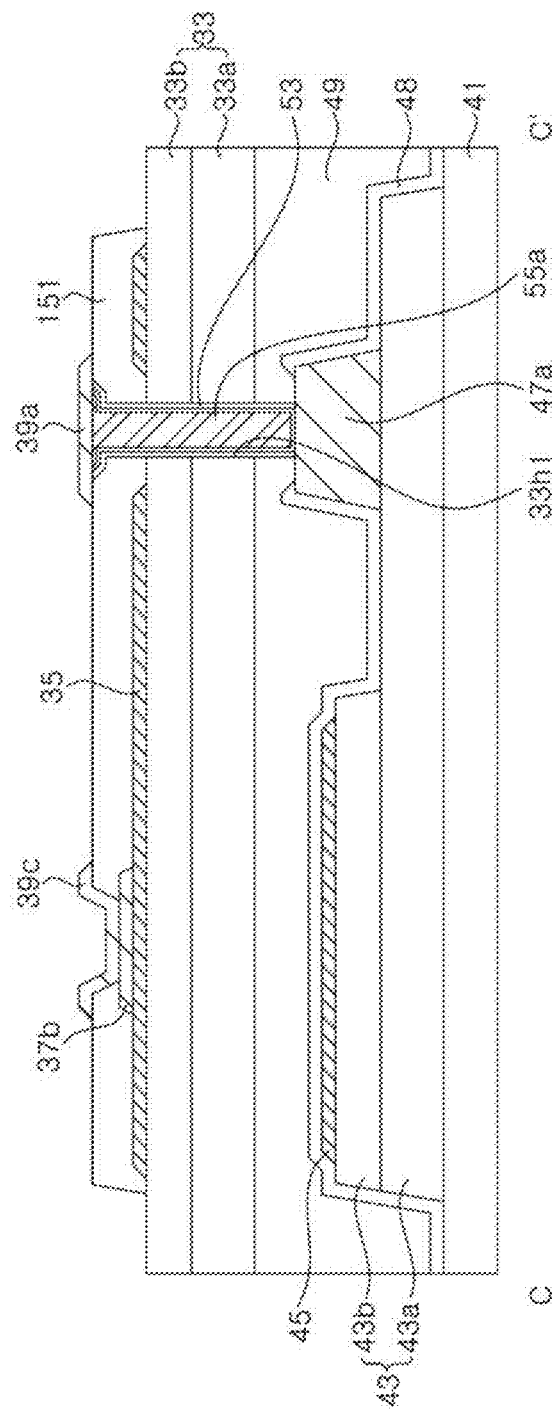
Figure 25C:
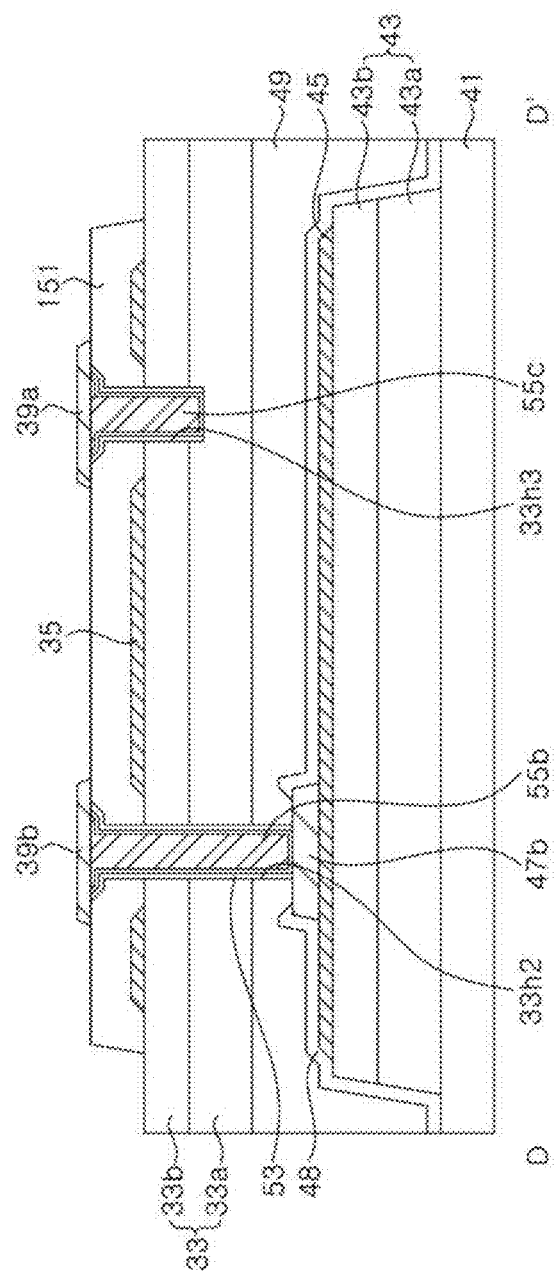

Referring to FIGS. 25A, 25B, and 25C, lower connectors 39a, 39b, and 39c are formed on the first planarization layer 151. The first lower connector 39a may be electrically connected to the lower buried via 55a and extend in the lateral direction to be also electrically connected to the lower buried via 55c. The first lower connector 39a may be insulated from the second transparent electrode 35 and the second conductivity type semiconductor layer 33b by the first planarization layer 151.

In the illustrated exemplary embodiment, the third lower connector 39c may be electrically connected to the upper p-electrode pad 37b exposed through an opening of the first planarization layer 151. The first planarization layer 151 may be patterned in advance to expose the upper p-electrode pad 37b. When the upper p-electrode pad 37b is omitted in other exemplary embodiments, the third lower connector 39c may be directly connected to the second transparent electrode 35.

The first planarization layer 151 may also be removed along the isolation region, and thus, the second conductivity type semiconductor layer 33b may be exposed as shown in FIGS. 25B and 25C.

Figure 26A:
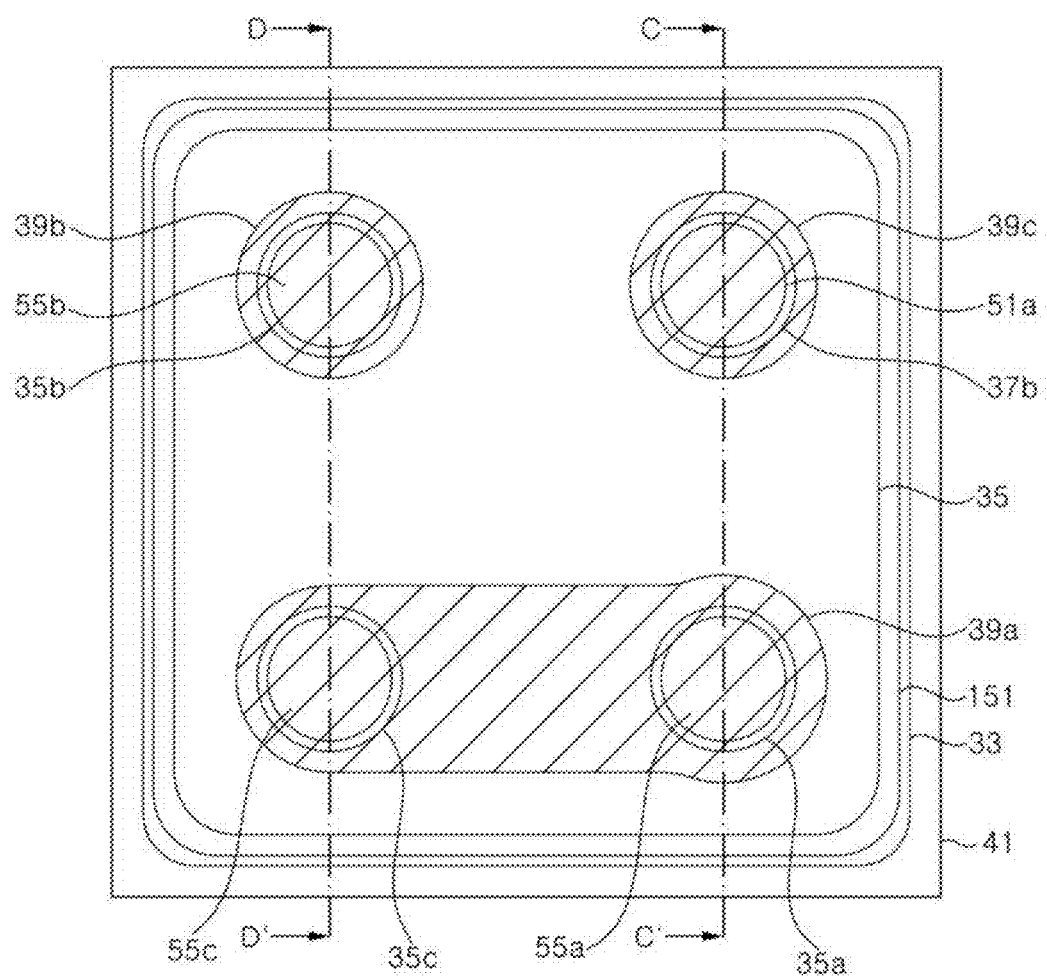
Figure 26B:
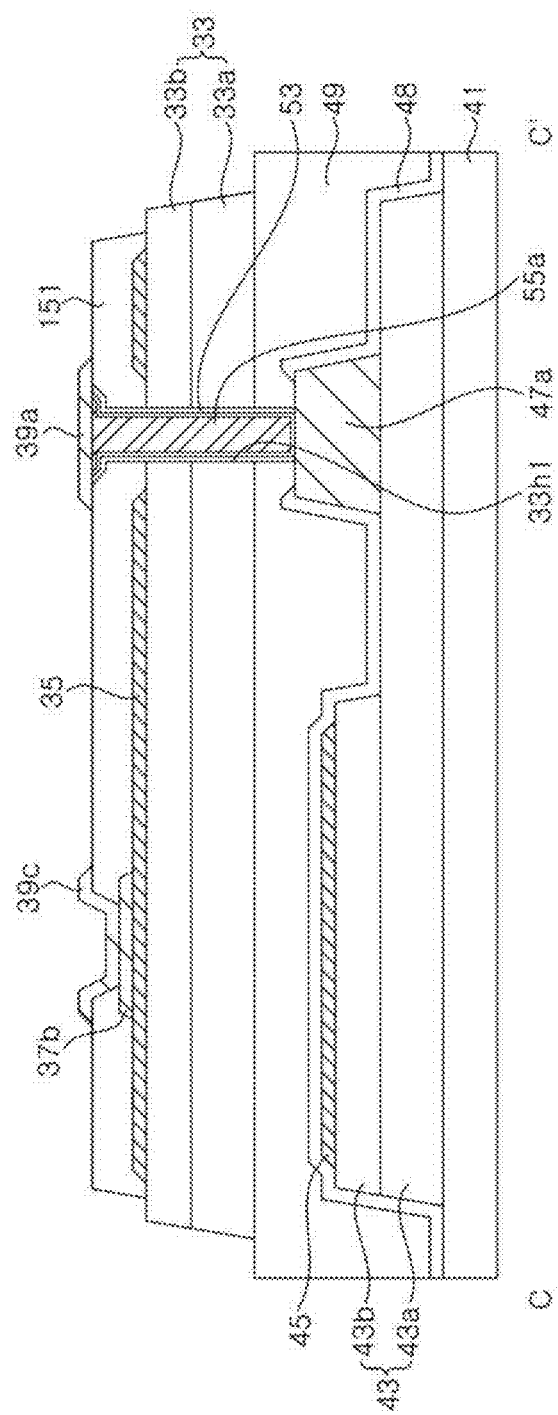
Figure 26C:
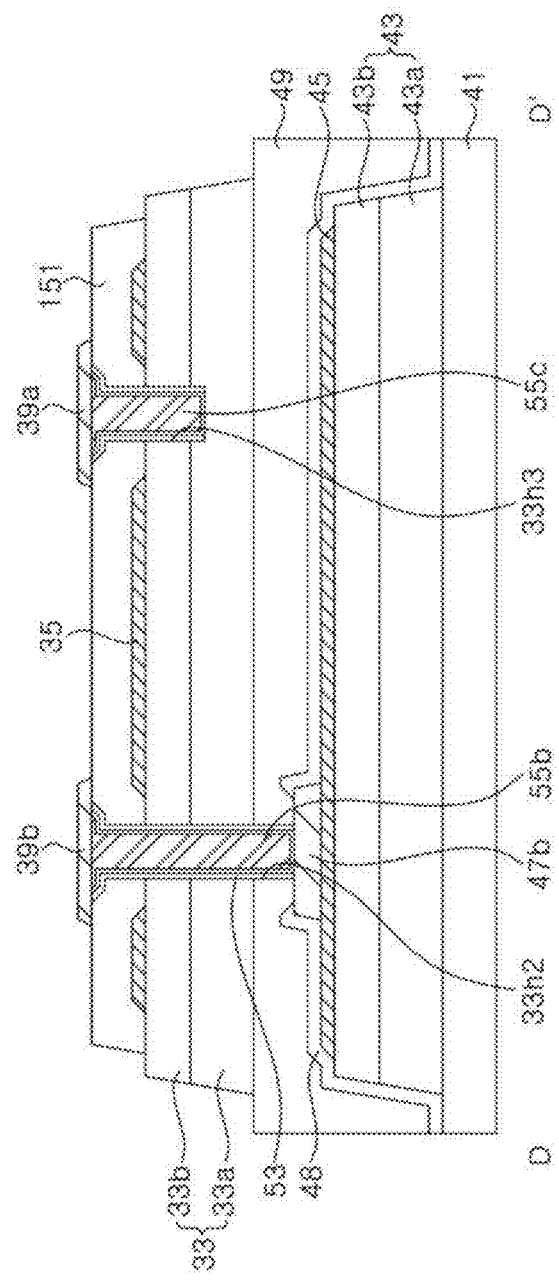

Referring to FIGS. 26A, 26B, and 26C, an isolation region for defining a light emitting device region may be formed. For example, the second conductivity type semiconductor layer 33b and the first conductivity type semiconductor layer 33a may be removed along the isolation region, and an upper surface of the first bonding layer 49 may be exposed. In some exemplary embodiments, an insulation layer covering the second LED stack 33, the first planarization layer 151, and the lower connectors 39a, 39b, and 39c may be added. This insulation layer may be formed to have openings exposing the lower connectors 39a, 39b, and 39c.

Figure 27A:
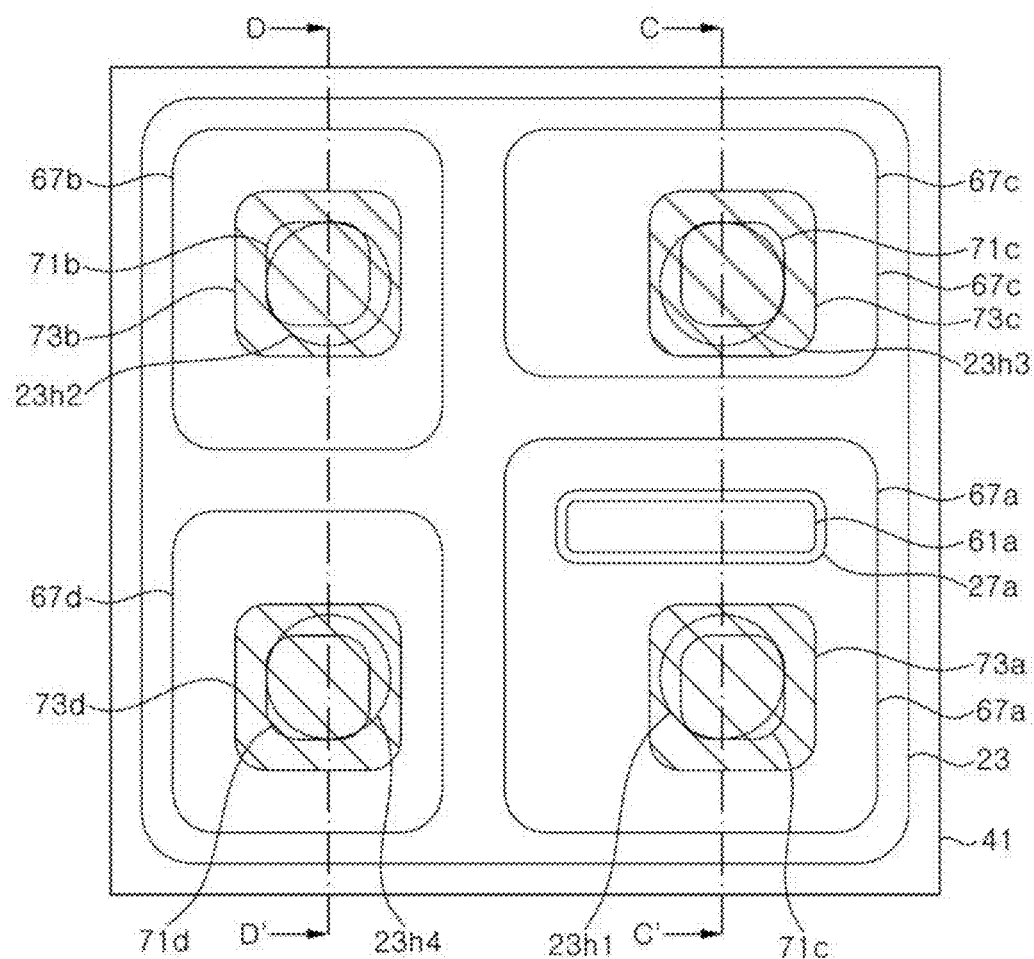
Figure 27B:
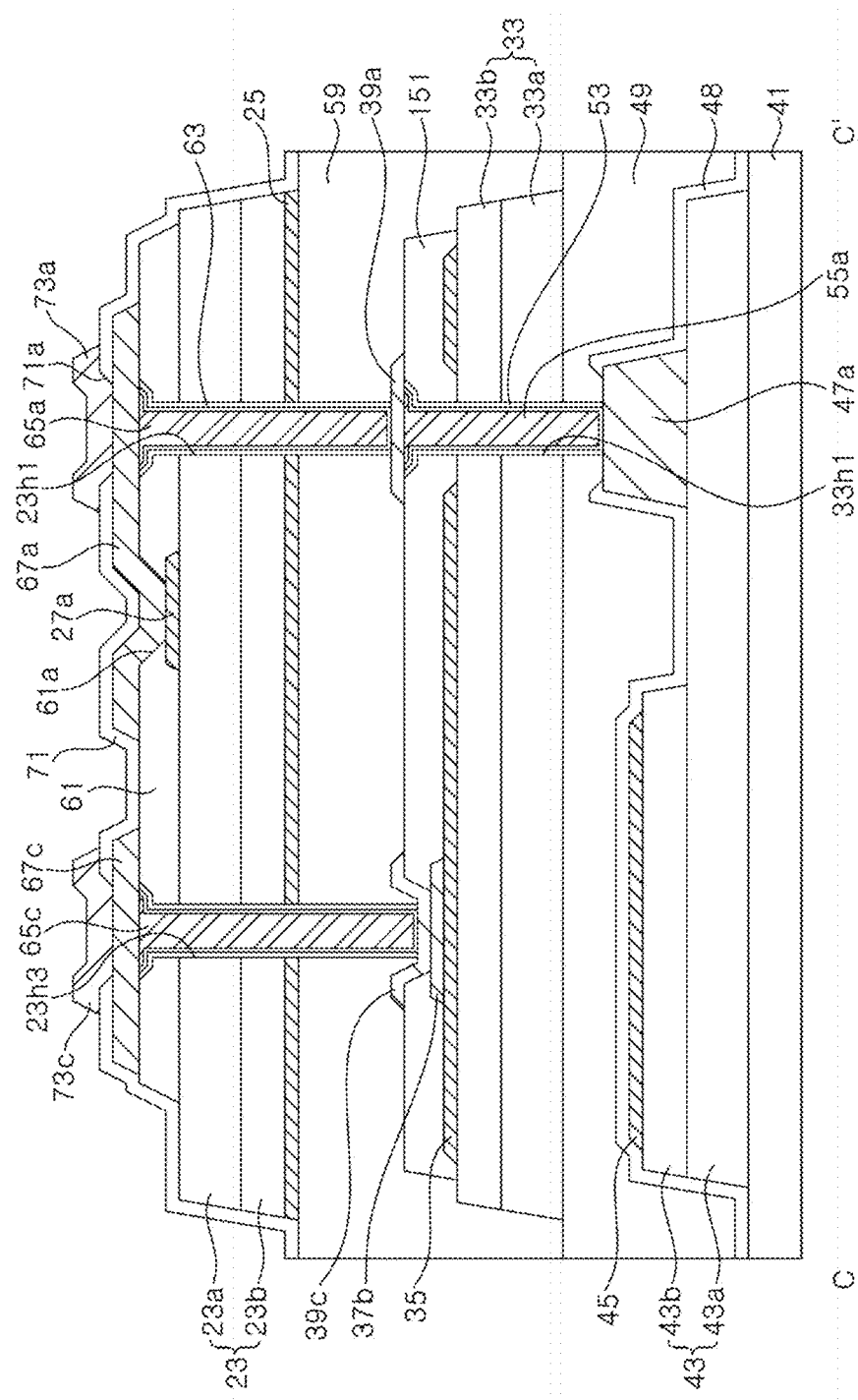
Figure 27C:
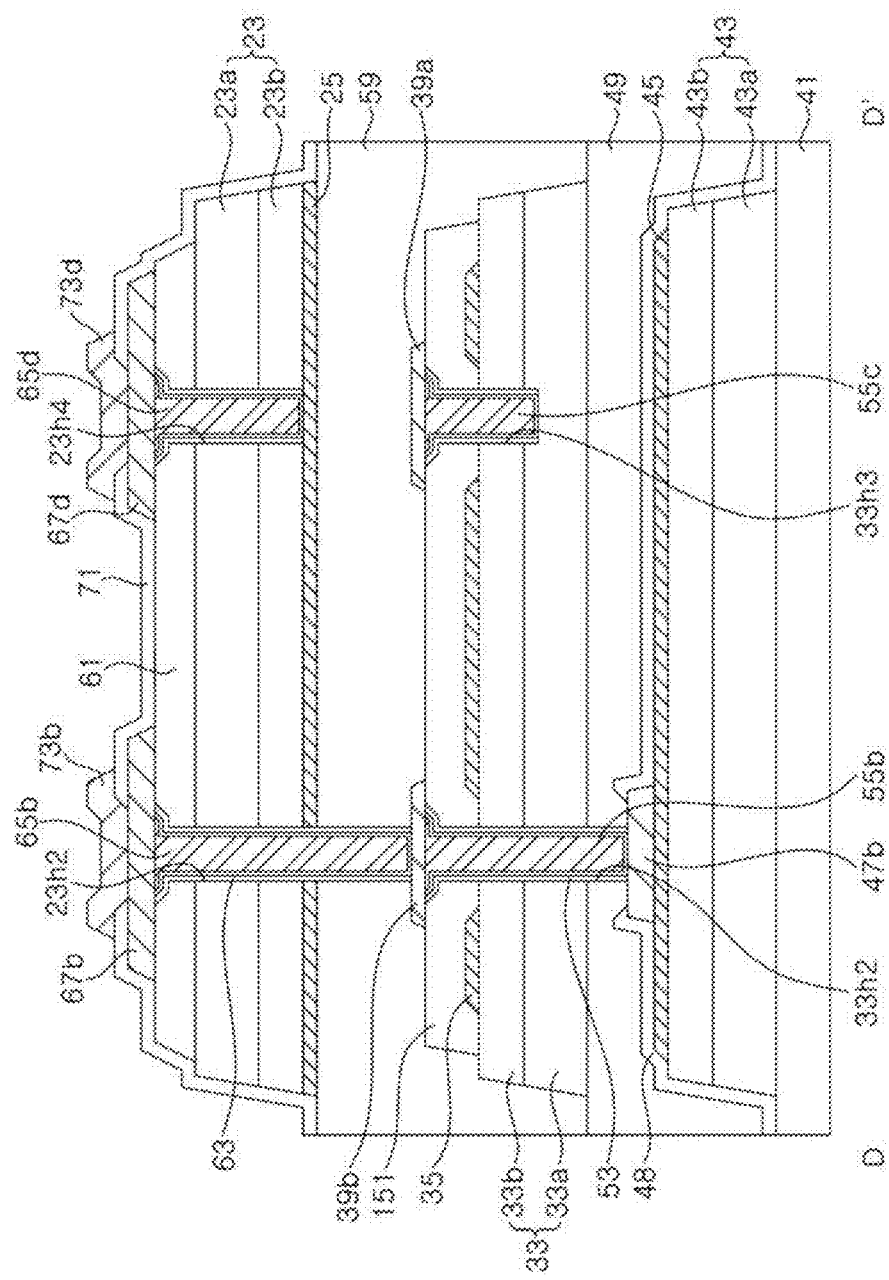

Referring to FIGS. 27A, 27B, and 27C, the first LED stack 23 described in FIG. 5A is bonded to the second LED stack 33, and through the same process as described with reference to FIGS. 13A, 13B, 13C, 14A, 14B, 14C, 15A, 15B, 15C, 16A, 16B, and 16C, a first n-electrode pad 27a, a second planarization layer 61, upper buried vias 65a, 65b, 65c, and 65d, upper connectors 67a, 67b, 67c, and 67d, an upper insulation layer 71, and bump pads 73a, 73b, 73c, and 73d are formed. Since these processes are substantially the same as those described above with reference to FIGS. 13A to 16C, repeated description thereof will be omitted.

Subsequently, a plurality of light emitting devices 200 separated from one another is formed on a substrate 41 by removing the first and second bonding layers 49 and 59 along the isolation region, and the light emitting device 200 separated from the substrate 41 is provided by bonding the light emitting device 100 onto a circuit board 101 and separating the substrate 41.

Figure 28:
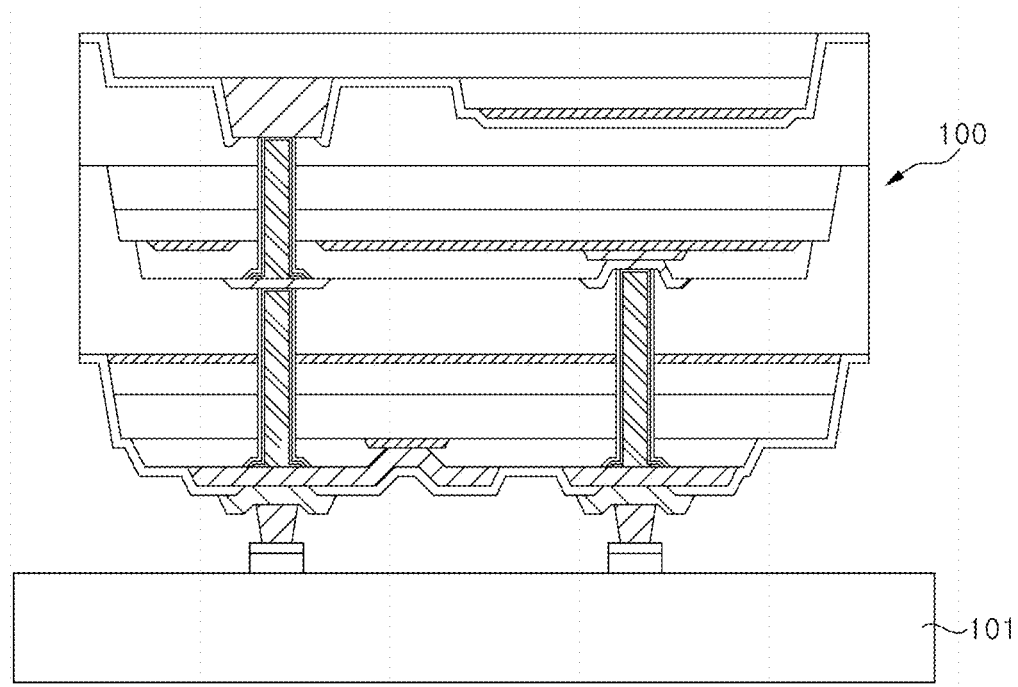
FIG. 28 is a schematic cross-sectional view of a light emitting device mounted on a circuit board.

Although FIG. 28 exemplarily illustrates a single light emitting device 100 disposed on the circuit board 101, however, a plurality of light emitting devices 100 may be mounted on the circuit board 101. Each of the light emitting devices 100 may form one pixel capable of emitting any one of blue light, green light, and red light, and a plurality of pixels is arranged on the circuit board 101 to provide a display panel. FIG. 28 exemplarily illustrates the light emitting device 100, but the light emitting device 200 may be disposed in other exemplary embodiments.

Figure 29A:
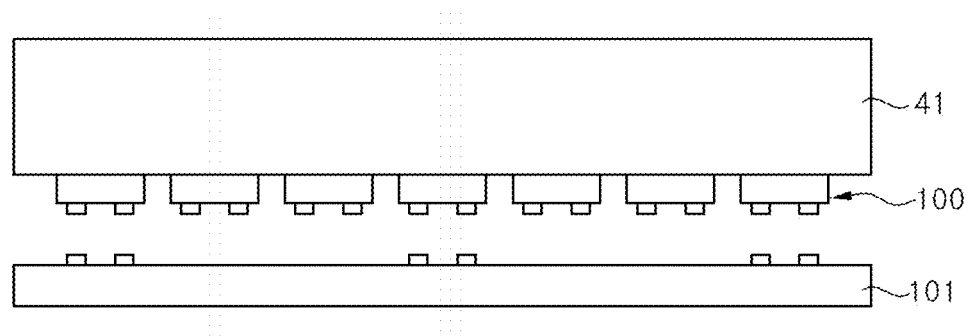
FIGS. 29A, 29B, and 29C are schematic cross-sectional views illustrating a method of transferring a light emitting device to a circuit board according to an exemplary embodiment.
Figure 29B:
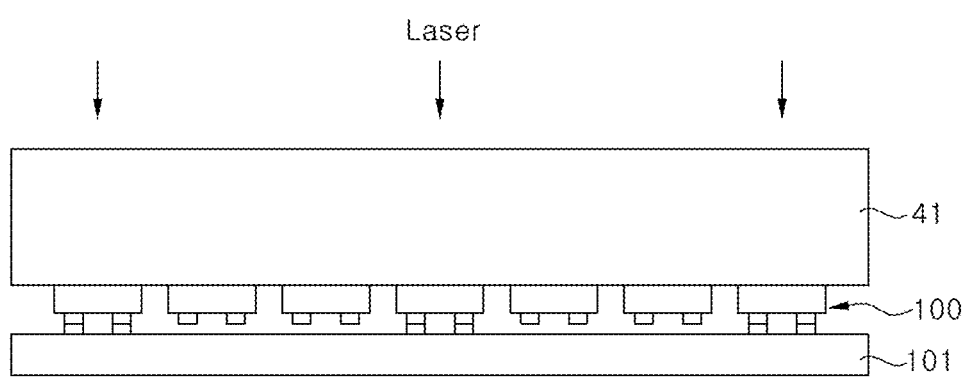
Figure 29C:
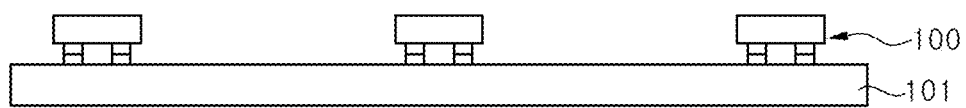

The plurality of light emitting devices 100 may be formed on the substrate 41, and the light emitting devices 100 may be transferred onto the circuit board 101 in a group, rather than individually. FIGS. 29A, 29B, and 29C are schematic cross-sectional views illustrating a method of transferring the light emitting device to the circuit board according to an exemplary embodiment. Hereinafter, a method of transferring the light emitting devices 100 or 200 formed on the substrate 41 to the circuit board 101 in a group will be described.

Referring to FIG. 29A, as described in FIGS. 16A, 16B, and 16C, when the manufacturing process of the light emitting device 100 on the substrate 41 is completed, the plurality of light emitting devices 100 is isolated from each other, and arranged on the substrate 41 by an isolation trench.

The circuit board 101 having pads on an upper surface thereof is provided. The pads are arranged on the circuit board 101 to correspond to locations where the pixels for a display are to be arranged. In general, an interval between the light emitting devices 100 arranged on the substrate 41 may be denser than that of the pixels on the circuit board 101.

Referring to FIG. 29B, bump pads of the light emitting devices 100 are selectively bonded to the pads of the circuit board 101. The bump pads and the pads may be bonded using solder bonding or In bonding, for example. In this case, the light emitting devices 100 located between pixel regions may be spaced apart from the circuit board 101, since these light emitting devices 100 do not have pads of the circuit board 101 to be boned to.

Subsequently, the substrate 41 is irradiated with a laser. The laser is selectively irradiated onto the light emitting devices 100 bonded to the pads. To this end, a mask having openings for selectively exposing the light emitting devices 100 may be formed on the substrate 41.

Thereafter, the light emitting devices 100 are transferred to the circuit board 101 by separating the light emitting devices 100 irradiated with the laser from the substrate 41. Accordingly, as shown in FIG. 29C, the display panel in which the light emitting devices 100 are arranged on the circuit board 101 is provided. The display panel may be mounted on various display apparatuses as described with reference to FIG. 1.

Figure 30:
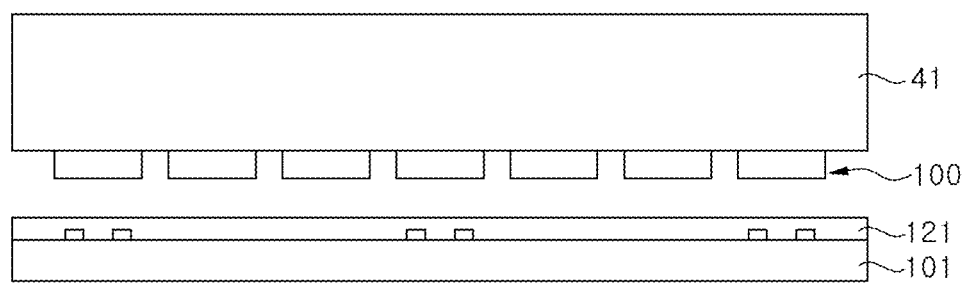
FIG. 30 is a schematic cross-sectional view illustrating a method of transferring a light emitting device to a circuit board according to another exemplary embodiment.

FIG. 30 is a schematic cross-sectional view illustrating a method of transferring a light emitting device according to another exemplary embodiment.

Referring to FIG. 30, light emitting devices according to the illustrated exemplary embodiment are bonded to pads using an anisotropic conductive adhesive film or an anisotropic conductive adhesive paste. In particular, an anisotropic conductive adhesive film or adhesive paste 121 may be provided on the pads, and the light emitting devices 100 may be adhered to the pads through the anisotropic conductive adhesive film or adhesive paste 121. The light emitting devices 100 are electrically connected to the pads by the anisotropic conductive adhesive film or a conductive material in the adhesive paste 121.

In the illustrated exemplary embodiment, bump pads 73a, 73b, 73c, and 73d may be omitted, and upper connectors 67a, 67b, 67c, and 67d may be electrically connected to the pads through a conductive material.

According to exemplary embodiments, the first, second, and third LED stacks are stacked one above another, and thus, the light emitting device may have an increased luminous area of each sub-pixel without increasing a pixel area. Furthermore, since the widths of the upper ends of the buried vias are increased, electrical connection of the buried vias may be facilitated.

The light emitting device according to exemplary embodiments may further include lower connectors covering the lower buried vias, in which portions of the upper buried vias may be connected to the lower connectors. The lower connectors may enhance electrical connection of the upper buried vias, and reliability of a process of forming the upper buried vias may be improved.

According to exemplary embodiments, the lower buried vias and portions of the upper buried vias are overlapped, which may reduce light loss due to the buried vias.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:
a first LED stack, a second LED stack disposed under the first LED stack, and a third LED stack disposed under the second LED stack, each of the first, second, and third LED stacks including a first conductivity type semiconductor layer and a second conductivity type semiconductor layer;
a first bonding layer interposed between the second LED stack and the third LED stack;
a second bonding layer interposed between the first LED stack and the second LED stack;
a first planarization layer interposed between the second bonding layer and the second LED stack;
a second planarization layer disposed on the first LED stack;
lower buried vias passing through the first planarization layer, the second LED stack, and the first bonding layer and electrically connected to the first conductivity type semiconductor layer and the second conductivity type semiconductor layer of the third LED stack, respectively; and
upper buried vias passing through the second planarization layer and the first LED stack,
wherein a width of an upper end of each of the lower buried vias and the upper buried vias is greater than a width of a corresponding through hole.

2. The light emitting device for a display of claim 1, wherein the first, second, and third LED stacks are configured to emit red light, blue light, and green light, respectively.

3. The light emitting device for a display of claim 1, further comprising lower connectors covering the lower buried vias,
wherein at least one of the upper buried vias is connected to the lower connectors.

4. The light emitting device for a display of claim 3, wherein:
the lower buried vias include a first lower buried via and a second lower buried via; and
the upper buried vias include a first upper buried via, a second upper buried via, a third upper buried via, and a fourth upper buried via, the first and second upper buried vias overlapping the with first and second lower buried vias.

5. The light emitting device for a display of claim 3, further comprising a third lower connector spaced apart from the lower buried vias and electrically connected to the second conductivity type semiconductor layer of the second LED stack,
wherein the third upper buried via is electrically connected to the third lower connector.

6. The light emitting device for a display of claim 5, wherein:
the first planarization layer includes a plurality of regions spaced apart from each other;
one region of the first planarization layer is interposed between the second LED stack and the third lower connector; and
the third lower connector is electrically connected to the second LED stack around the one region of the first planarization layer.

7. The light emitting device for a display of claim 3, wherein:
the lower buried vias further includes a third lower buried via passing through the first planarization layer and the second conductivity type semiconductor layer of the second LED stack, the third lower buried via being electrically connected to the first conductivity type semiconductor layer of the second LED stack; and the third lower buried via is electrically connected to one of the lower connectors.

8. The light emitting device for a display of claim 7, wherein the first planarization layer is continuously disposed on the second LED stack.

9. The light emitting device for a display of claim 1, wherein the lower buried vias and the upper buried vias are surrounded by sidewall insulation layers inside corresponding through holes, respectively.

10. The light emitting device for a display of claim 9, wherein the sidewall insulation layers have a gradually decreasing thickness as being closer to bottoms of the through holes.

11. The light emitting device for a display of claim 1, further comprising:
a first transparent electrode in ohmic contact with the second conductivity type semiconductor layer of the first LED stack;
a second transparent electrode in ohmic contact with the second conductivity type semiconductor layer of the second LED stack; and
a third transparent electrode in ohmic contact with the second conductivity type semiconductor layer of the third LED stack,
wherein:
the second transparent electrode has openings exposing the second conductivity type semiconductor layer of the second LED stack; and
the lower buried vias are formed within the circumference of the openings of the second transparent electrode in a plan view.

12. The light emitting device for a display of claim 1, further comprising a plurality of upper connectors disposed on the first LED stack,
wherein the upper connectors cover the upper buried vias to be electrically connected to the upper buried vias, respectively.

13. The light emitting device for a display of claim 12, further comprising bump pads disposed on the upper connectors, respectively.

14. The light emitting device for a display of claim 13, wherein the bump pads include:
a first bump pad commonly electrically connected to the first, second, and third LED stacks; and
second, third, and fourth bump pads electrically connected to the second conductivity type semiconductor layers of the first, second, and third LED stacks, respectively.

15. The light emitting device for a display of claim 13, further comprising a first electrode pad disposed on the first conductivity type semiconductor layer of the first LED stack,
wherein one of the upper connectors electrically connect the upper buried via and the first electrode pad.

16. The light emitting device for a display of claim 12, wherein the upper connectors include Au or an Au alloy.

17. The light emitting device for a display of claim 1, wherein:
upper surfaces of the lower buried vias are substantially flush with an upper surface of the first planarization layer; and
upper surfaces of the upper buried vias are substantially flush with an upper surface of the second planarization layer.

18. The light emitting device for a display of claim 1, wherein each of the first, second, and third LED stacks does not include a growth substrate.

19. The light emitting device for a display of claim 1, further comprising:
a lower insulation layer interposed between the third LED stack and the first bonding layer and contacting the first bonding layer; and
an intermediate insulation layer interposed between the second LED stack and the second bonding layer and contacting the second bonding layer.

20. A display apparatus, comprising:
a circuit board; and
a plurality of light emitting devices arranged on the circuit board, each of the light emitting devices including:
a first LED stack,
a second LED stack disposed under the first LED stack;
a third LED stack disposed under the second LED stack and including a first conductivity type semiconductor layer and a second conductivity type semiconductor layer;
a first bonding layer interposed between the second LED stack and the third LED stack;
a second bonding layer interposed between the first LED stack and the second LED stack;
a first planarization layer interposed between the second bonding layer and the second LED stack;
a second planarization layer disposed on the first LED stack;
lower buried vias passing through the first planarization layer, the second LED stack, and the first bonding layer and electrically connected to the first conductivity type semiconductor layer and the second conductivity type semiconductor layer of the third LED stack, respectively; and
upper buried vias passing through the second planarization layer and the first LED stack,
wherein a width of an upper end of each of the lower buried vias and the upper buried vias is greater than that of a corresponding through hole.

* * * * *